United States Patent [19]
Miyawaki et al.

[11] Patent Number: 5,331,197
[45] Date of Patent: Jul. 19, 1994

[54] SEMICONDUCTOR MEMORY DEVICE INCLUDING GATE ELECTRODE SANDWICHING A CHANNEL REGION

[75] Inventors: Mamoru Miyawaki, Tokyo; Akira Ishizaki, Atsugi; Genzo Momma, Hiratsuka; Hiroshi Yuzurihara, Isehara; Tetsunobu Kohchi, Hiratsuka, all of Japan

[73] Assignee: Canon Kabushiki Kaisha, Tokyo, Japan

[21] Appl. No.: 870,258

[22] Filed: Apr. 17, 1992

[30] Foreign Application Priority Data

Apr. 23, 1991 [JP] Japan ............................ 3-092294
Apr. 23, 1991 [JP] Japan ............................ 3-092295
Apr. 26, 1991 [JP] Japan ............................ 3-097256

[51] Int. Cl.$^5$ ........................................ H01L 29/78
[52] U.S. Cl. ................................. 257/530; 257/330; 257/401
[58] Field of Search ............... 257/529, 530, 401, 408, 257/330; 365/96, 104

[56] References Cited

U.S. PATENT DOCUMENTS

| 4,979,014 | 12/1990 | Hieda et al. ........................ 257/354 |
| 5,019,878 | 5/1991 | Yang et al. ......................... 365/104 |
| 5,089,870 | 2/1992 | Haond ................................ 257/347 |
| 5,100,827 | 3/1992 | Lylte ................................. 365/96 |
| 5,115,289 | 5/1992 | Hisamoto et al. .................. 257/347 |
| 5,163,180 | 11/1992 | Eltoukhy et al. .................. 365/96 |

FOREIGN PATENT DOCUMENTS 0253631 1/1988 European Pat. Off. .
2-14578 1/1990 Japan .
2263473 10/1990 Japan .

OTHER PUBLICATIONS

IEDM Technical Digest, International Electron Devices Meeting, Washington, D.C., Dec. 1–4, 1985, "A New Programmable Cell Utilizing Insulator Breakdown", Sato et al., pp. 639–642.

IEDM Technical Digest, International Electron Devices Meeting, San Francisco, Calif., Dec. 11–14, 1988, "High Performance CMOS Surrounding Gate Transistor (SGT) For Ultra High Density LSIs", Takato et al., pp. 222–225.

Primary Examiner—Robert Limanek
Attorney, Agent, or Firm—Fitzpatrick, Cella, Harper & Scinto

[57] ABSTRACT

A semiconductor memory device includes: an insulated gate transistor having a plurality of main electrode regions provided along a major surface of a substrate and a channel region provided between the plurality of main electrode regions, and a gate electrode provided on the channel region with a gate insulator therebetween, the gate electrode having at least two opposing portions; and an electrically breakable memory element provided on one of the main electrode regions.

11 Claims, 36 Drawing Sheets

SEMICONDUCTOR MEMORY DEVICE INCLUDING GATE ELECTRODE SANDWICHING A CHANNEL REGION

BACKGROUND OF THE INVENTION

1. Field of the Invention

The present invention relates to a semiconductor memory device which is employed in electronic circuits of various technical fields including office automation apparatus, household electrical appliances, such as facsimile machines, printers and video cameras, as well as automobiles, power plants and space satellites.

More particularly, the present invention relates to a semiconductor memory device for storing necessary data signals.

2. Related Background Art

FIG. 1 illustrates a semiconductor memory which can be programmed once. The memory cell of this semiconductor memory is made up of a MOS field effect transistor (hereinafter referred to as a 'MOSFET') which is an insulated-gate field effect transistor, and an insulating film.

Such a memory has been described in, for example, "A new Programmable Cell Utilizing Insulator Breakdown" IEDM'85, pp 639 through 642.

Another type of semiconductor memory is shown in FIG. 2.

In FIG. 2 which is a cross-sectional view thereof, reference numeral 120 denotes a n type substrate; 121, a p+ drain; 122, a p+ source; 123, a floating gate; 124, an insulating layer; 125, a drain interconnection; and 126, a source interconnection. The floating gate 123 is manufactured by embedding, for example, a polysilicon into a silicon oxide.

Normally, no current flows between the source and the drain. When a high voltage is applied between the source and drain of this transistor, avalanche breakdown occurs in the pn junction on the side of the drain, injecting electrons of a high energy level to the floating gate and thus permitting current to be established between the source and drain, by which writing can be performed on the memory. When this device is used as a memory, injection and non-injection of electrons to the floating gate are made to correspond to 1 and 0 of data, respectively. However, in the above-described memory, since a slight amount of electric charges stored in the floating gate leaks, permanent storage of data is impossible, and the reading characteristics vary with time.

Furthermore, the aforementioned MOSFET is not suited to the fine processing, and is characterized by a low mutual conductance (gm characteristics).

Furthermore, when the gate length is 0.5 μm or less, improvement in the aforementioned MOSFET based on the scaling rule cannot be expected.

Apart from the above-mentioned semiconductor device, a SOI type MOSFET has also been proposed (Japanese Patent Application Laid-Open No. 2-14578). In this semiconductor device, a SiO₂ layer is provided on a Si substrate, and a Si mesa structure is provided on the SiO₂ layer. A gate oxide film is provided on the side wall of the mesa structure.

FIGS. 3 and 4 illustrate such a device. In FIGS. 3 and 4, reference numeral 232 denotes an insulating film; 231', a crystalline silicon; 236, a source region; 237, a drain region; and 235, a gate electrode which bridges a channel region of the crystalline Si portion. FIG. 3 is a section taken along a line a—a' of FIG. 4. As shown in FIG. 3, upper three surfaces of the crystalline Si 231' portion are covered with the gate electrode 235 through the gate oxide film 234, while a lower surface 238 thereof is in contact with the surface of the insulating film 232. The dimensions of the crystalline Si portion satisfy $W_0 < 2W_H$. Thus, the channel of the side wall is increased, thus increasing the channel conductance.

A MOSFET which is similar to the above-mentioned one in terms of the structure has also been proposed (Japanese Patent Application Laid-Open No. 2-263473).

FIG. 5 is a plan view of this MOSFET. FIG. 6 is a section taken along a line A—A' of FIG. 5. FIG. 7 is a section taken along a line B—B' of FIG. 5. A crystalline Si layer 246 forms a source 243, a drain 242 and a channel. The portion of the crystalline Si layer 246 which is covered by a gate electrode 245 forms a channel region connected to a substrate 240 via an opening 247. The drain layer 242 is connected to the substrate 240 through the crystalline Si layer 246 via an opening 248.

The above-described conventional structures are characterized in an increased leaking current of the transistor, variations in the transistor and degraded OFF characteristics and hence unstable operation of the transistor. First, why off characteristics of the SOI type MOSFET are degraded will be explained. The present inventors consider that it is because the Si region which forms the channel is covered with a SiO₂ except for the interfaces between the source and drain and the Si region. That is, the Si region which forms the channel portion is made completely floating, and the potential thereof cannot be fixed, making the operation unstable. Furthermore, the carriers (electrons in the case of, for example, a p type MOSFET) generated in the Si region when the transistor is in an On state stop flowing when the transistor is turned off, and remain in the Si region until they recombine with holes and disappear, thus deteriorating the off characteristics of the transistor.

In the aforementioned conventional transistors, a large amount of current leaks because the channel region surrounded by the gate electrode is in direct contact with the insulating layer which is the substrate. That is, the channel region is made in a completely depletion state when the transistor is turned on, and the resultant depletion layer reaches the interface between the channel region and the insulating layer and generates a large amount of recombination current by the defects present in the interface.

One of the read-only memories which can be programmed (written) by the user and which can be random accessed is known as bipolar PROM. FIG. 8 illustrates such a memory cell. In FIG. 8, reference numeral 101 denotes bit lines; 102, word lines; 103, a bipolar transistor disposed in a memory cell in which an emitter 105 thereof is connected to the bit line 101, a collector 106 is connected to the word line and a base 104 is made floating; 107, a diode through which the word line 102 is connected to a power source Vcc 108. FIGS. 9A and 9B are cross-sectional views of the bipolar transistor 103 of this memory. In FIGS. 9A and 9B, reference character 110 denotes a p type Si substrate; 111, a n+ buried layer; 112, a n− epitaxial layer; 113, a field oxide film; 114, a p type base; 115, a n+ emitter layer; and 116, an Al interconnection. In the memory, breakage of the diode between the emitter and the base corresponds to binary data. FIG. 9A illustrates the state in which writing is not yet conducted, and FIG. 9B shows the state in which writing has been conducted.

Before writing takes place, the Al interconnection on the n+ emitter is flat, as indicated by 117. When a large current pulse is applied between the word line and the bit line for writing, an eutectic alloy 118 of aluminum and silicon penetrates the base layer 114 and is made conductive.

However, such a bipolar transistor suffers from drawbacks in that there is a limitation of cell size due to separation of the bipolar transistor and hence a high integration thereof is difficult and in that the eutectic alloy 118 formed by a large current varies in the cells and therefore stable reading out cannot be obtained. Also, a longitudinally long dynamic random-access memory (DRAM) which employs a surrounding gate transistor (SGT) as an addressing transistor and in which a trench capacitor is formed in the main electrode region thereof which is located close to the substrate has been proposed.

The present inventors found that such a DRAM has the following problems. A high integration of 16M bits or above or fine processing of the cell restricts the capacitor size. Thus, the capacitance of the capacity is reduced, and storage of a large amount of signal electric charges becomes impossible. As a result, the signal finally output when the stored signal is read out by capacitive division is reduced, reducing the S/N ratio. This generates malfunction of the memory.

Furthermore, the manufacturing process is very complicated due to the longitudinally long structure and yield cannot thus be increased. That is, the present inventors came to the conclusion that application of the currently manufactured fine transistors, such as SGT, to a DRAM does not serve its original purpose.

SUMMARY OF THE INVENTION

In view of the aforementioned problems of the conventional techniques, an object of the present invention is to provide a semiconductor memory device which has a structure suited to fine processing, and which assures low power consumption and high-speed operation.

Another object of the present invention is to provide a semiconductor memory device having a memory function which assures accurate and stable writing operation and high-speed and accurate reading out operation.

To achieve the above objects, the present invention provides a semiconductor memory device which comprises: an insulated gate type transistor including a plurality of main electrode regions provided along a major surface of a substrate and a channel region provided between the plurality of main electrode regions, and a gate electrode provided on the channel region with a-gate insulating film therebetween, the gate electrode having at least two opposing portions; and an electrically breakable memory element provided on one of the main electrode regions.

In the present invention, since the magnitude of an electric field in a direction perpendicular to the carrier moving direction is reduced due to the opposing two gate electrodes, a semiconductor device exhibiting a high mobility and excellent gm characteristics can be obtained. Consequently, generation of hot carriers can be prevented due to electric field limitation, and the life and hence reliability of the device can be enhanced.

Since the capacitance of the Si portion provided below the gate oxide film is reduced, S factor (subthreshold swing) characteristics are improved, and leaking current is greatly reduced.

Furthermore, the area required for the memory element is reduced, and high integration can be achieved.

In an improved semiconductor device, since a region of a different conductivity type from that of a source and drain portion and having a higher impurity concentration than a channel region which ensures that the driving voltage applied to the gate when the transistor is driven does not inverse the region is provided on the portion of the channel region other than the portion on which the opposing two gate electrodes are provided, the speed at which the minority carrier enters or exits from the semiconductor layer surrounded by the opposing two gate electrodes (which is holes in the case of an N channel MOS and electrons in the case of a P channel MOS) when the transistor is turned on or off is increased, and the switching characteristics are thus improved.

Furthermore, even when the channel region is completely depleted of current carriers when the transistor is turned on, the aforementioned high concentration layer prevents a depletion layer from reaching the lower insulating layer, and generation of dark current is restricted.

Furthermore, when fine processing at a level of 0.1 $\mu$m is achieved, the semiconductor device must be able to be activated at low temperatures, such as the liquid nitrogen temperature. However, even when carrier freezing occurs in the low-temperature activation, an increase in the parasitic resistance and reduction in the drain current can be greatly lessened as compared with the conventional one.

DETAILED DESCRIPTION OF THE PREFERRED EMBODIMENTS

Figure 1:
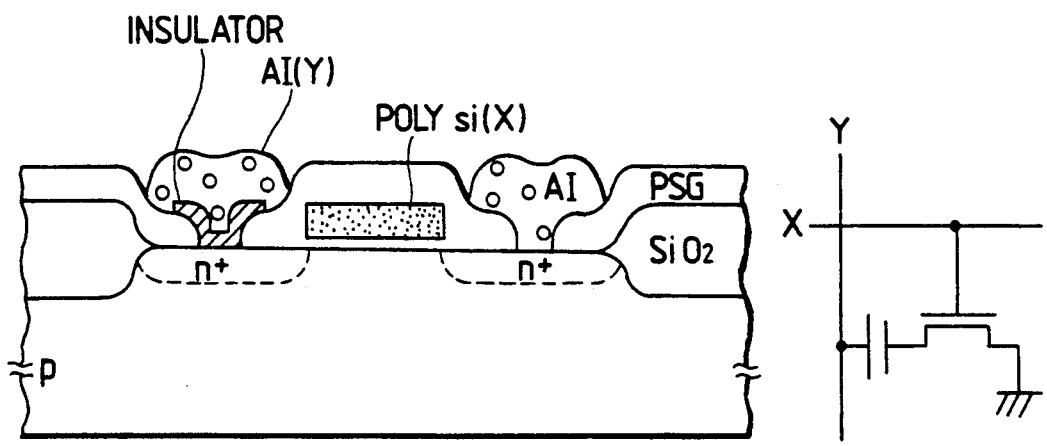
FIG. 1 is a schematic view of a conventional semiconductor memory device.
Figure 2:
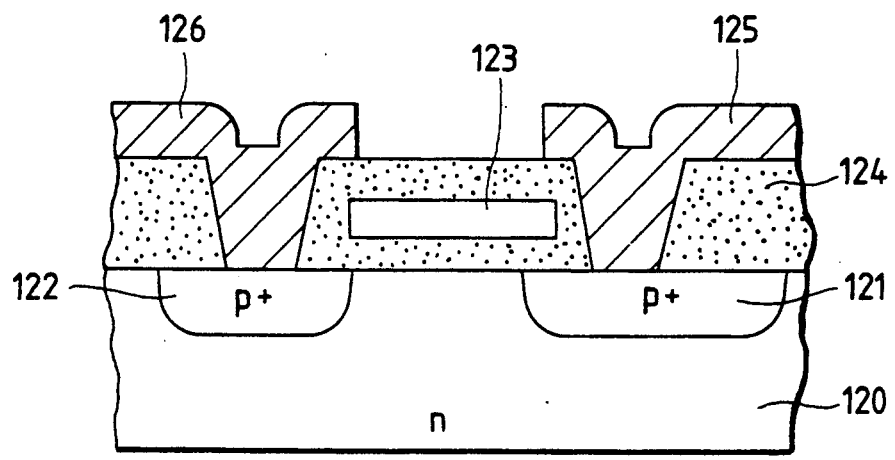
FIG. 2 is a schematic cross-sectional view of a conventional semiconductor memory device.

In a preferred form of the present invention, a semiconductor memory includes: a transistor in which a gate electrode has at least opposing portions sandwiching a channel region and in which part of the portion of the channel region other than the portion thereof jointed to the source and drain regions is in contact with a doped region which can exchange minority carries with the channel region; and a memory element which is a breakable insulating layer.

In the channel region of the semiconductor device according to the present invention, a width ($d_3$) of the channel region sandwiched between the opposing portions of the gate electrode in the direction of the opposing portions and the semiconductor impurity concentration of the channel region are determined in the manner described below. That is, they are determined such that depletion layers extending from two sides of the opposing portions are coupled with each other to form a depletion region even when no gate voltage is applied. Practically, where $d_3$ is the width of the channel region in the direction of the opposing portions of the gate electrode and W is the width of the depletion layer extending from the two sides in the same direction, the relation of $d_3 \leq W$ is satisfied. When the channel region located between the opposing electrodes is completed depleted, even when the gate voltage increases to a level at which an inversion layer is formed, the electric field applied to the interior of the channel region is limited, and the characteristics of the device are improved.

The doped region is a semiconductor region having a different conductivity type from that of the source and drain region and a higher impurity concentration than the channel region. Thus, there is no limitation in the type of impurity and conductivity type. Practically, the impurity concentration of the doped region is determined such that the doped region is not inverted by the driving voltage applied to the gate when the transistor is driven. Functionally, the doped region has a structure which can accept carriers from the channel region sandwiched by the opposing portions of the gate electrode.

The gate electrode of the present invention is made of a material, such as a metal, polycrystalline silicone, silicide or polycide. Practically, Al, W, Mo, Ni, Co, Rh, Pt, Pd or silicide or polycide of these elements is employed. Selection is made with the structure, driving conditions and work function of a MOSFET taken into consideration.

The gate electrode and doped region are shaped such that no gate electrode exists on the portion which opposes the doped region, that the doped region is provided on the portion which opposes the doped region or that part of the gate electrode is disposed on the portion which opposes the doped region, as in the case of an embodiment described later. It is desirable that the cross-sectional form of the channel region taken in a direction perpendicular to the carrier mobilizing direction be square, e.g., the three surfaces is surrounded by the gate electrode while the remaining surface is in contact with the doped region. The sides of that square may be straight or curved. Each of the edge portions may be bevelled with the coating property of the gate insulating film taken into consideration.

In the semiconductor memory device according to the present invention, the transistor is of the type in which the MOSFET elements are located on a substrate in the lateral direction thereof, as will be described later, and are in contact with the doped region on the side of the substrate, and in which the opposing portions of the gate electrode have a surface which crosses the surface of the substrate. Alternatively, the opposing portions of the gate electrode may be disposed substantially parallel to the surface of the substrate with the doped region provided on the side surface. However, the former structure, i.e., the structure of the embodiments which will be described later, is desirable from the viewpoint of the currently adopted manufacturing process.

For example, the surrounding gate transistor (SGT), proposed by IEDM (International Electron Device Meeting) (1988) pp 222-225 by H. Todato, K. Sunoushi, N. Okabe, A. Nitayama, K. Hieda, F. Horiguchi and F. Masuoka, is known. In this surrounding gate transistor, a source and a drain are disposed above and below a channel, and four gate electrodes are opposed.

The transistor of the present invention is of the type in which a source and a drain are disposed on the two lateral sides of the opposing gate electrodes.

With this structure, the electrodes for the source and drain can be readily formed on the same plane, as in the case of the conventional MOSFET. Since the channel length is determined by the gate electrode width, as in the case of the conventional MOSFET, the channel length processing accuracy is high. The opposing two gate electrode structure enables patterning of a semiconductor to be conducted by lithography without using a mask, and is therefore suited for fine processing. Consequently, the distance between the two gate electrodes can be narrowed and generation of punch through phenomenon can thus be prevented without increasing the impurity concentration. This allows excellent gm characteristics to be obtained even when high integration is achieved.

The transistor of the present invention is of the type in which the MOSFET elements are located on the substrate in the lateral direction thereof and are in contact with the doped region on the side of the substrate, and in which the opposing portions of the gate electrode have a surface which crosses the surface of the substrate.- The reason why this structure of the transistor is employed will be described below in comparison with the aforementioned conventional MOSFET.

In the conventional MOSFET, at least part of the channel region is in contact with the insulating layer located below the channel region. This causes the following drawbacks.

First, amount of leaking current due to generation of dark current is large. In the structure shown in FIG. 3, the channel region 231' made of silicon is surrounded by the surface 238 of the insulating film 232 and the gate oxide film. When the transistor is turned on, the entire channel region is depleted of current carriers due to the voltage applied to the gate. As a result, the MOSFET transistor has a high current driving capability as compared with the other types of transistors. However, although the interface between the gate oxide film and the channel silicon exhibits excellent characteristics due to the recently developed process technology (washing or the like), the interface between the channel silicon and the insulating film has defects and a high level density. Since the gate electrode is provided on the insulating layer adjacent to the portions indicated by 250, depletion of the entire channel portion brings the surface 238 of the insulating layer into contact with the depletion layer. Thus, in the case of a n type MOSFET, when the transistor is turned on, holes are accumulated in the channel region. If the holes generated in the interface are present in the channel portion, even when a voltage to be applied to the gate is changed to turn off the transistor, electrons are injected from the source, and the transistor cannot be turned off all at once. In other words, in the MOSFET of the type which is activated by depletion, generation of unnecessary carriers must be avoided, unlike the conventional MOSFETs.

Figure 6:
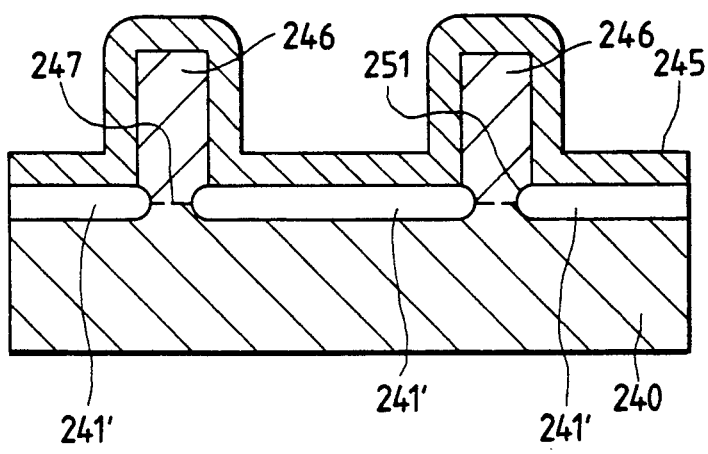
FIG. 6 is a schematic cross-sectional view of a conventional semiconductor device.
Figure 7:
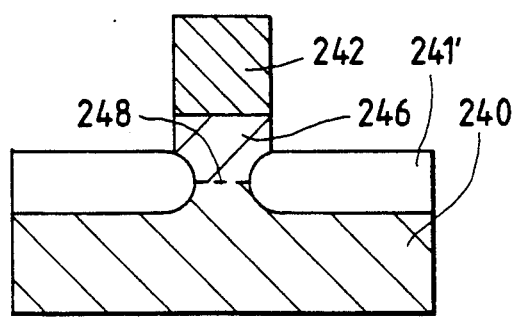
FIG. 7 is a schematic cross-sectional view of a conventional semiconductor device.
Figure 8:
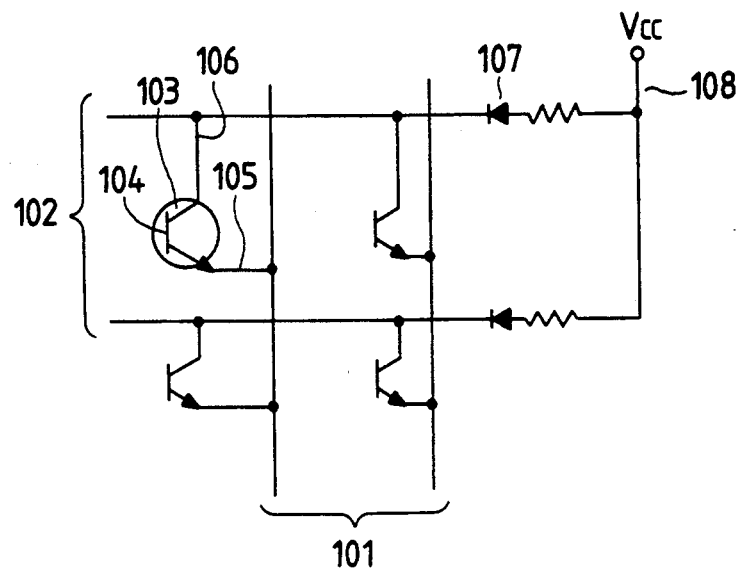
FIG. 8 is a circuit diagram of a bipolar transistor memory.
Figure 9A:
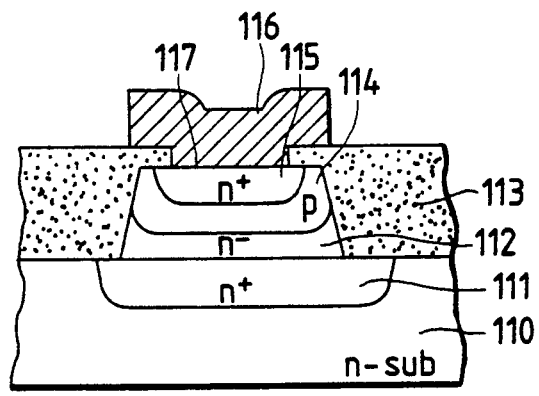
FIGS. 9A and 9B are schematic cross-sectional views of a bipolar transistor memory.
Figure 9B:
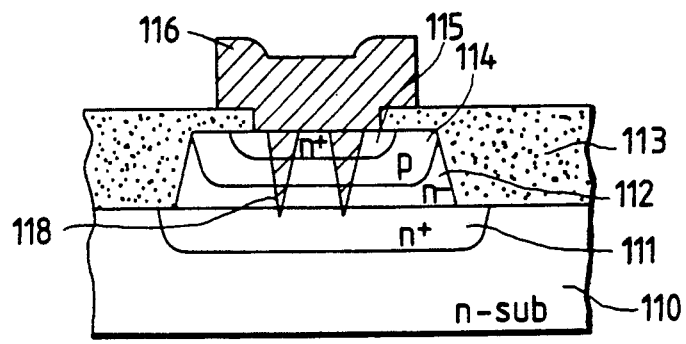

The aforementioned phenomenon can be observed in other types of conventional transistors. This will be explained with reference to FIG. 6. In FIG. 6, since the Si single crystal portions 246, serving as the channel regions, are in contact with the substrate through the openings 247, the channels become floating, and unnecessary carriers (holes in the case of a n type MOSFET or electrodes in the case of a p type MOSFET) will escape through the channels. However, as indicated by 251 in FIG. 6, the channel regions are in contact with the surface 241' of the insulating layer, and generation of unnecessary carriers takes place. Therefore, the leaking current generated from the defects present in the interface between the insulating layer and the channel region deteriorates the device characteristics.

Secondly, the effective channel width readily varies in individual transistors.

Figure 3:
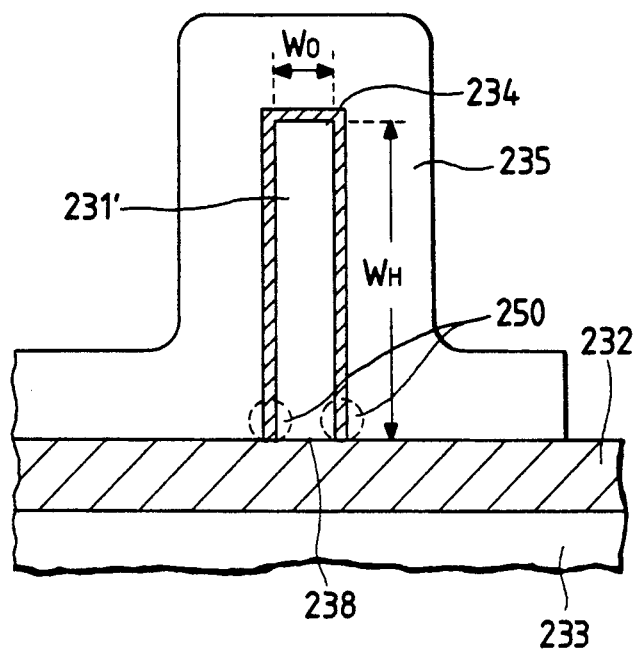
FIG. 3 is a schematic cross-sectional view of a conventional transistor.

The channel width of the conventional transistor is determined by the height and width of the single crystalline silicon 231' shown in FIG. 3 or of the Si portion 246 shown in FIG. 6. Generally, the height is determined by the etching depth of Si. In a MOSFET having a gate length of 0.1 $\mu$m and a gate width of 0.5 $\mu$m, this height of Si is about 0.2 $\mu$m, and allowance thereof must be within 200 Å. In the currently adopted dry etching technique, it is very difficult to achieve this allowance in the wafer plane or between the wafers. Furthermore, as indicated by 250 in FIG. 3, the height of the Si portion immediately above the insulating layer readily varies, and this causes the thickness of the Si portion to change between the upper and lower Si portions.

In the transistor employed in the present invention, since the channel length is determined by the gate electrode width, as in the case of the conventional MOSFET, channel length processing accuracy is high. Furthermore, since channel region is defined by the gate electrode portion and the high concentration layer located immediately below or above the channel, variations thereof are less. Furthermore, even when the channel portion becomes depleted when the transistor is turned on, the resulting depletion layer does not expand due to presence of the high concentration layer. Thus, the depletion layer is not in contact with the surface of the insulting layer other than the gate oxide film (insulating film), and no unnecessary carrier generation source is present.

As will be understood from the foregoing description, the present invention employs as a memory cell transistor a transistor which is suited to fine processing and which has a high current current driving capability. In this transistor, the gate serves as a word line, and a memory connected to the bit line is structure on the source region of this transistor with a pn junction therebetween. Consequently, a programmable memory can be achieved which has low error rates and which exhibits high-density and high-speed reading out and writing characteristics

First Embodiment

Figure 10:
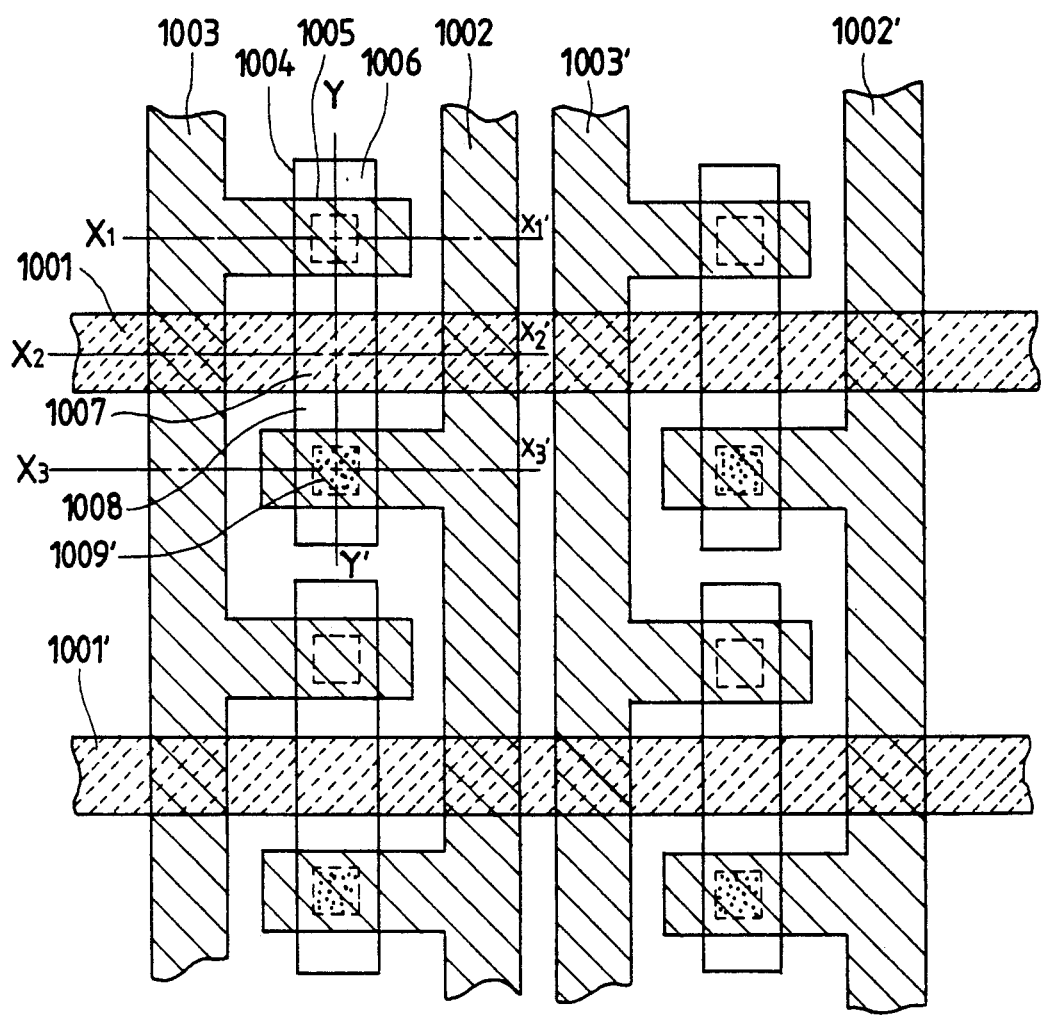
FIG. 10 is a schematic plan view of a first embodiment of a semiconductor device according to the present invention.
Figure 11:
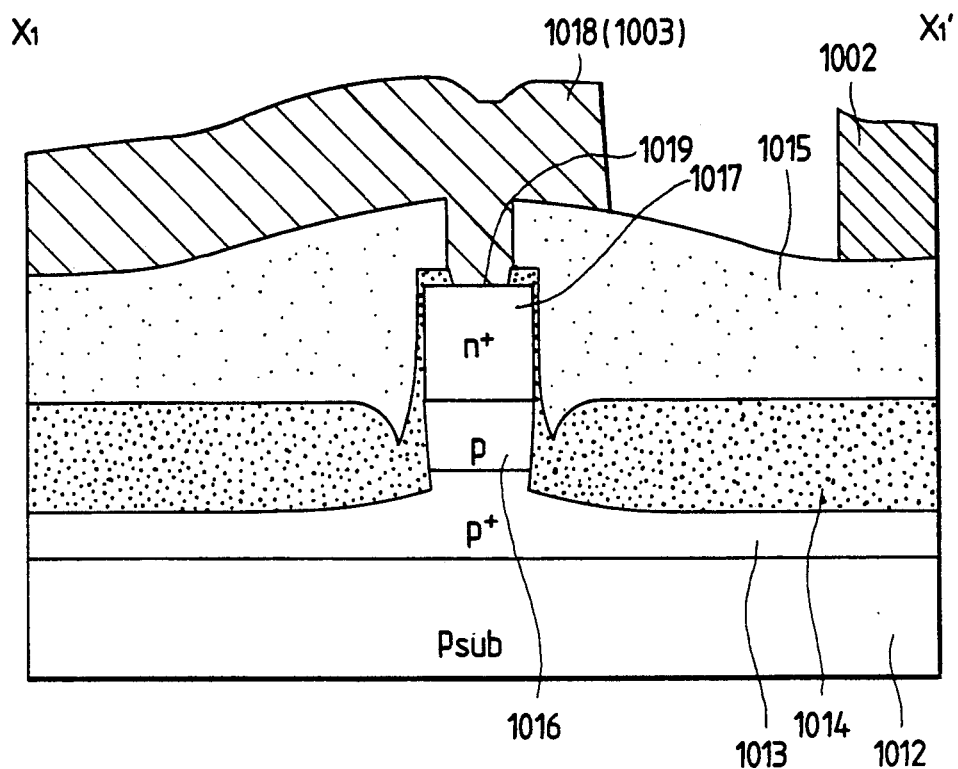
FIG. 11 is a schematic cross-sectional view taken along line $X_1X_1'$ of FIG. 10.

A first embodiment of the present invention will be described below with reference to FIG. 10 which is a top view of a memory cell which is the first embodiment of the present invention. In FIG. 10, reference characters 1001 and 1001' denote word lines; 1002 and 1002', bit lines; 1003 and 1003', power source lines; 1004, a Si single crystal which is a semiconductor activated region which operates as a switching transistor in the memory cell; 1005, a contact region between the power source line and a drain layer; 1006, a drain layer of the transistor; 1007, a gate of the transistor; 1008, a source layer of the transistor; 1009, an insulating layer which is provided between the source layer and the bit line and which is electrically destructive. FIGS. 11 through 14 are respectively sections taken long lines $X_1-X_1'$, $X_2-X_2'$, $X_3-X_3'$ and $Y-Y'$. In FIG. 11, reference character 1012 denotes a p type Si substrate which has a resistivity of, for example, several $\Omega$cm; 1013, a p+ type buried layer; 1014, a field oxide layer; 1015, an interlayer insulator which may be made of PSG, BPSG, SiN or SON; 1016, a p type layer provided just below the drain; 1017, a drain n+ high concentration layer; 1018, an interconnection for a drain power source which is connected to the drain layer 1017 through a contact portion 1019. The drain layer 1006 shown in FIG. 10 corresponds to the drain n+ high concentration layer 1017. The contact portion 1005 shown in FIG. 10 corresponds to the contact portion 1019 shown in FIG. 11. In FIG. 11, illustration of a passivation film is omitted.

Figure 12:
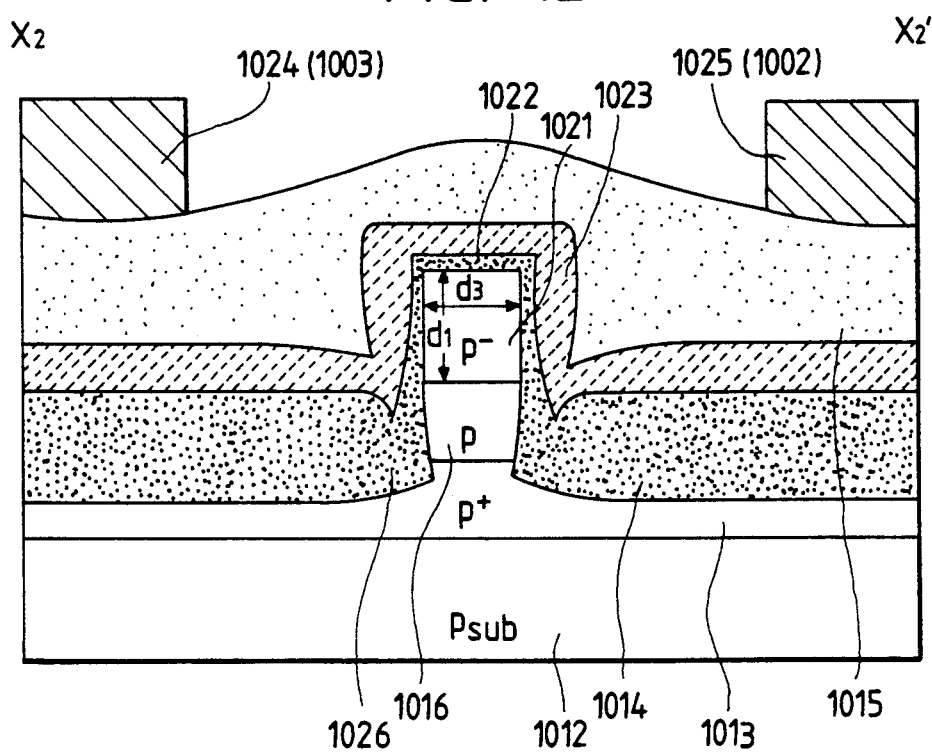
FIG. 12 is a schematic cross-sectional view taken along line $X_2S_2'$ of FIG. 10.

FIG. 12 is a cross-sectional view of the gate portion of the transistor in the memory cell. In FIG. 12, reference character 1021 denotes a channel region which is made of a semiconductor having an impurity concentration of, for example, $5 \times 10^{14}$ through $5 \times 10^{16}$ cm$^{-3}$; 1022, a gate insulating film which is about 60Å through 250Å thick, although the thickness thereof must be changed according to the length of the gate.

The gate insulating film 1022 may be a Si oxide film, SiON or a laminated layer of SiO$_2$ and SION. Reference character 1023 denotes a gate electrode having a low resistance and a work function which ensures a desired threshold of the transistor, such as a polycide structure in which an upper layer made of W$_x$Si$_{1-x}$ is formed on a substrate of p+ type polysilicon; 1024, an interconnection for the drain power source which corresponds to the interconnection 1003 shown in FIG. 10; and 1025, an interconnection for the bit line which corresponds to the interconnection 1002 shown in FIG. 10. As shown in FIG. 12, the channel region 1021 is defined by the gate insulating film 1022 and the p layer 1016. Therefore, the channel width of this transistor is 2d$_1$+d$_3$. The thickness of the gate insulating layer located below the channel region 1021 changes in the manner indicated by 1026 in FIG. 12 as a result of the field oxidation process, and is thus comparatively difficult to control. However, in this transistor, since the actually activated channel region is defined by the p region located below the channel region, it is not affected by variations in the thickness of the gate insulating film, and there are very few variations in the transistors.

Figure 13:
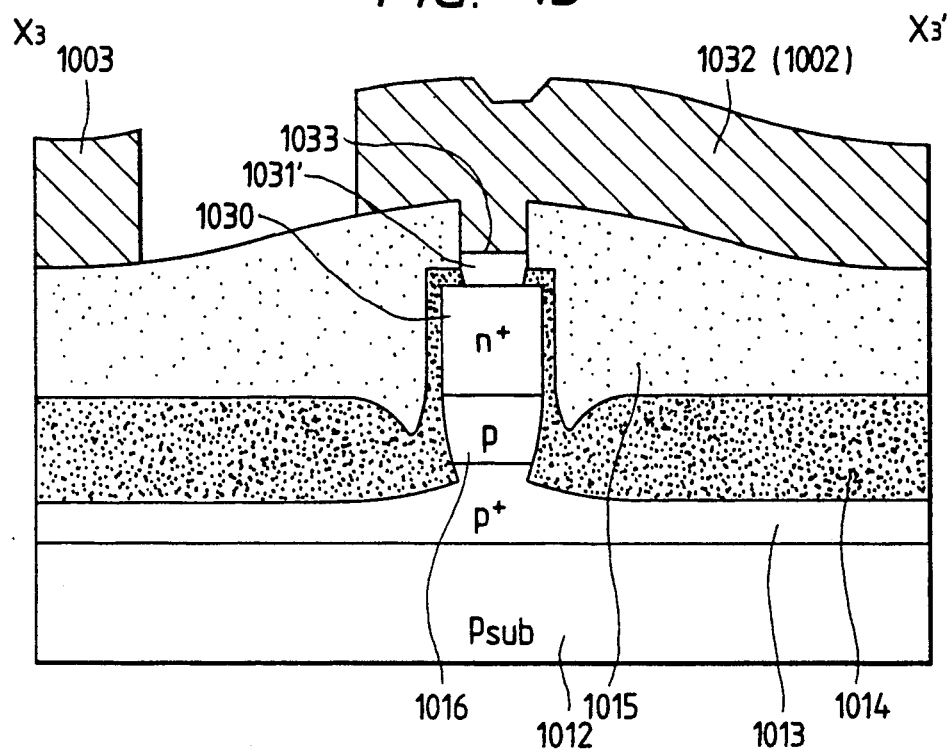
FIG. 13 is a schematic cross-sectional view taken along line $X_3X_3'$ of FIG. 10.

FIG. 13 is a cross-sectional view of a source region of the transistor in the memory cell. In FIG. 13, reference character 1030 denotes a n+—Si region which is the source region; 1031', an insulating layer provided on the source whose breakdown and non-breakdown define conduction and non-conduction of the memory, respectively; and 1031, a bit line interconnection which is connected to the insulating film 1031' through a contact area 1033. The insulating layer may be made of SiO$_2$, SiON or a laminated layer of SiO$_2$ and SiN. Oxide aluminum and tantalum oxide can also be used.

Figure 14:
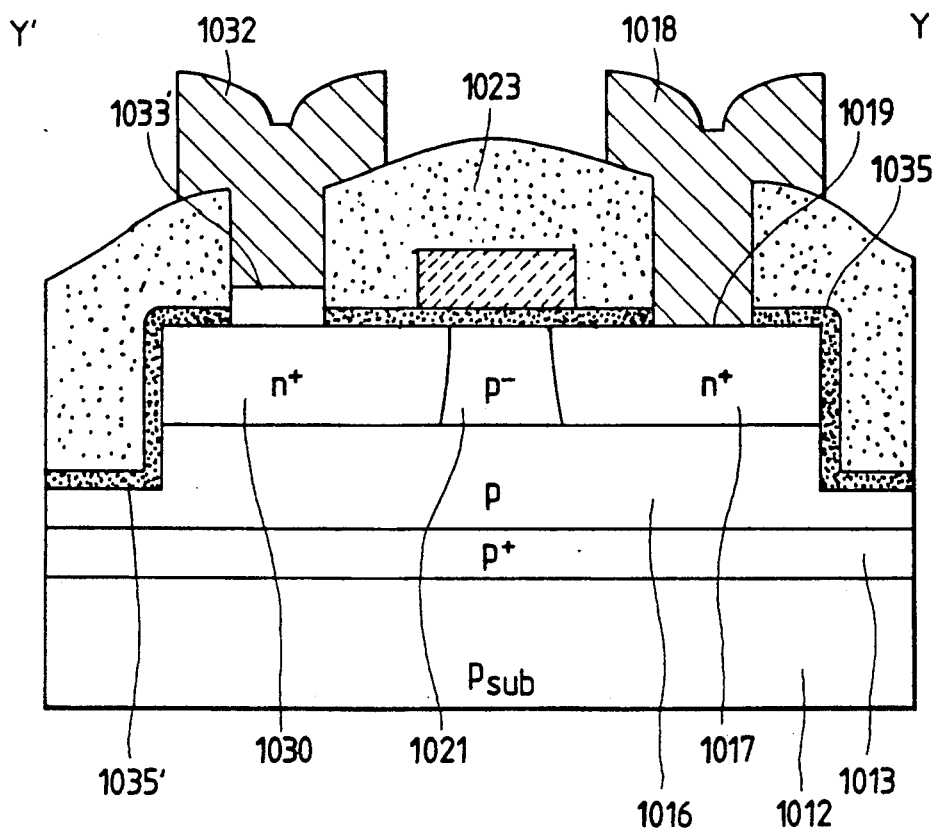
FIG. 14 is a schematic cross-sectional view taken along line YY' of FIG. 10.

FIG. 14 which is the section taken along the section Y—Y' of FIG. 10 will be explained.

As indicated by 1035 and 1035' in FIG. 14, the transistors are separated from each other by a vertical surface. An interlayer insulator is buried between the adjacent transistors and the separation width can be narrowed. Therefore, the transistor of this embodiment is suited to a high integration. The gate electrode structure on the section shown in FIG. 14 is similar to that of an ordinal MOSFET. However, on the section of FIG. 12 which is perpendicular to the section shown in FIG. 14, the gate electrode is disposed such that it opposes the side wall portions. Furthermore, although the gate electrode is provided on the upper portion, if the functions of d₁ and d₃ shown in FIG. 12 are determined by $$d_3 < d_1 \qquad \text{Equation (1)},$$

even when the gate voltage increases, the potential of the gate electrode is increased from both sides thereof, and the electric field of the channel region can thus be limited as compared with the general MOSFET. Furthermore, changes in the potential take place over the entire channel region. Consequently, when the transistor is turned on, a large current can be passed, and a high driving capability can be obtained.

Figure 15:
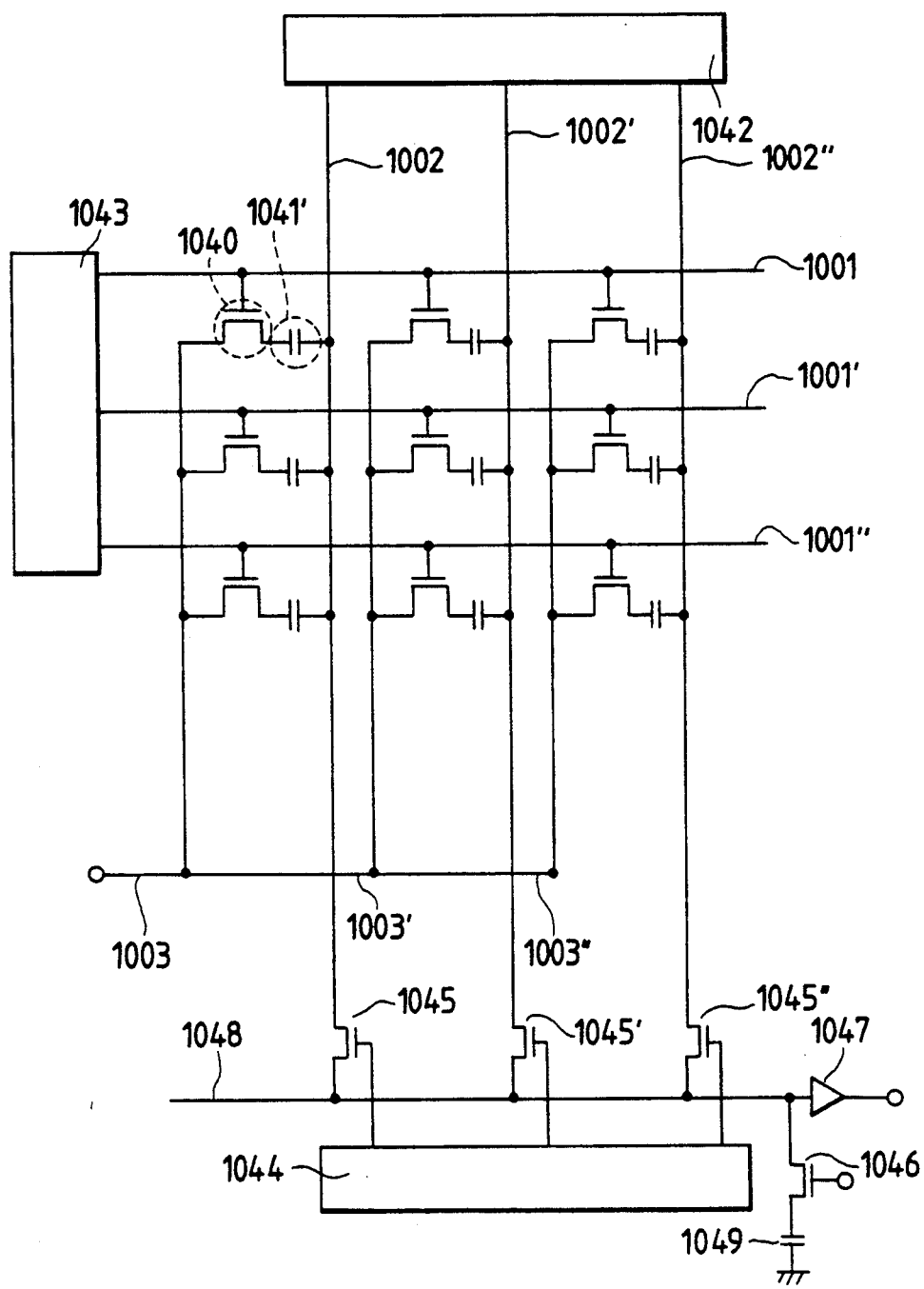
FIG. 15 is a circuit diagram of the first embodiment of the present invention.

FIG. 15 is a circuit diagram of a semiconductor memory having 3×3 cells according to the first embodiment of the present invention.

The single cell includes an addressing transistor 1040 and a memory element 1041. The memory element 1041 serves as a capacitor before breakdown takes place and does not serve as the capacitor after breakdown occurs.

Reference characters 1001, 1001', 1001" and 1001''' denote word lines connected to the gates.

1002, 1002' and 1002" denote bit lines connected to one of each of the memory elements.

1003, 1003' and 1003" denote power source lines.

The single cell also includes, as the peripheral circuits, a bit line voltage setting circuit 1042 for setting the voltage of each of the bit lines to a reference voltage, a word line voltage setting circuit 1043, a selection signal generating circuit 1044 for generating a signal of sequentially selecting the bit lines, bit line selection switches 1045, 1045' and 1045", and a switch 1046 for resetting a bit line reading-out line 1048, and an amplifier 1047.

The operation of the aforementioned semiconductor memory will now be described.

First, the writing operation will be explained. The operation consists of following four major operations.

(1) Writing operation part 1: (pre-charge of the bit lines).

The reference voltage $V_{DD}$ is set on the bit lines by the voltage setting circuit 1042. Consequently, no potential difference exists between the power source lines and the bit lines. Thus, no matter what voltage is applied to the word lines, no potential is generated or no current flows between the source and the drain of the FET, and breakdown of the insulating film 1041 thus does not occur. The pre-charge voltage applied to the bit lines may be or may not be equal to the power source voltage. When the precharge voltage is not equal to the power source voltage, a voltage which does not generate breakdown of the insulating film region and hence conduction is set. A voltage between 1 and 5 v is applied as $V_{DD}$.

(2) Writing operation part 2: (discharge of the word lines).

The voltage on all of the word lines is fixed to a first grounding voltage $V_{GND1}$. It is fixed to, for example, 0 v. This prevents mixture of a signal into the adjacent word lines of the word line on which writing operation is conducted due to generation of cross-talk.

(3) Writing operation part 3: (selection of a writing word line).

Assuming that the present writing bit represents the cell on the second line and second row with the upper and lower cell as an origin, the writing bit is present on the word line 1001' shown in FIG. 3. Hence, the potential on the word line 1001' is set to $V_G$ which is expressed by:

$$V_{GND1} < V_G < V_{GB} \qquad \text{Equation (2)}$$

where $V_{GB}$ is a gate insulating film breakdown voltage.

(4) Writing operation part 4: (selection of a bit line)

The voltage on the bit line corresponding to the writing cell present on the selected line is set to the grounded voltage. Since all the FETs present on the selected line have been turned on, application of the grounded voltage causes a high voltage to be applied to the insulating film, causing breakdown of the insulating film and hence conduction. When the writing operation is completed, a current flows between the bit line and the word line. Thus, it is desirable that selection of the bit lines be conducted line by line. However, it is also possible to conduct writing on a plurality of bit lines at the same time.

Next, the reading out operation will be explained. This operation consists of following four major operations.

(1) Reading out operation part 1: (pre-charge of the bit lines).

Pre-charge of the bit lines is conducted in the same manner as that of the writing operation so that the reading out operation does not perform writing on the bits on which writing has not been conducted. The voltage applied for pre-charging is equal to the power source voltage $V_{DD}$.

(2) Reading out operation part 2 (discharge of the word lines).

The voltage on all of the word lines is fixed to second grounded voltage $V_{GND2}$. The voltage $V_{GND2}$ and the first grounded voltage $V_{GND1}$ has the following relation.

$$V_{GND1} < V_{GND2} \qquad \text{Equation (3)}$$

(3) Reading out operation part 3 (selection of a reading line).

The voltage on the word line on which the reading out operation is to be conducted is fixed to $V_G$ defined by Equation (2) to turn on the EFTs present on that line. (4) Reading out operation part 4 (resetting of the bit line reading out line).

The bit line reading out line 1048 is reset by the switch 1046. The reset voltage, determined by the power source connected to the switch 1046, is $V_{GND2}$. Thereafter, the switch 1046 is turned off to make the bit line reading out line floating.

(5) Reading out operation part 5 (selection of a bit line).

The gate of the selected bit selection switch is raised by the bit line sequentially selecting signal generating circuit 1044 to turn on the switch and thereby connect it to the bit line reading out line. If the selected cell is not present, the voltage on the reading out line converges to the value expressed by $$\frac{C_{BIT} \cdot V_{DD} + C_{OUT} \cdot V_{GND2}}{C_{BIT} + C_{OUT}}$$

where $C_{BIT}$ is the capacity of the bit line and $C_{OUT}$ is the capacity of the reading out line.

If the selected cell is present and the insulating film is in a conducting state, the reading out line is connected to the power source $V_{DD}$ through the transistor and the voltage on the reading out line thus converges to $V_{DD}$. These two voltage stages are utilized to determine whether the written cell (bit) is present or not. The voltage on the reading out line is detected by the amplifier 1047. In the reading out operation which is conducted in the manner described above, in the case of a written state, the time it takes for the voltage on the reading out line to converge to $V_{DD}$ determines the reading out speed. The larger the capacity of the memory, the larger the capacity of the bit line and bit line reading out line. Thus, how these large capacities are driven is the key to an increase in the reading out speed. The aforementioned fine transistor structure having a high driving ability is therefore very effective in this sense.

In this embodiment, two types of grounded voltages are used so that the reading out operation does not cause breakdown of the insulating film. That is, a difference in the voltages applied to the two ends of the insulating film in the reading out operation is lower than that in the writing operation.

Description of the Manufacturing Method

Figure 16:
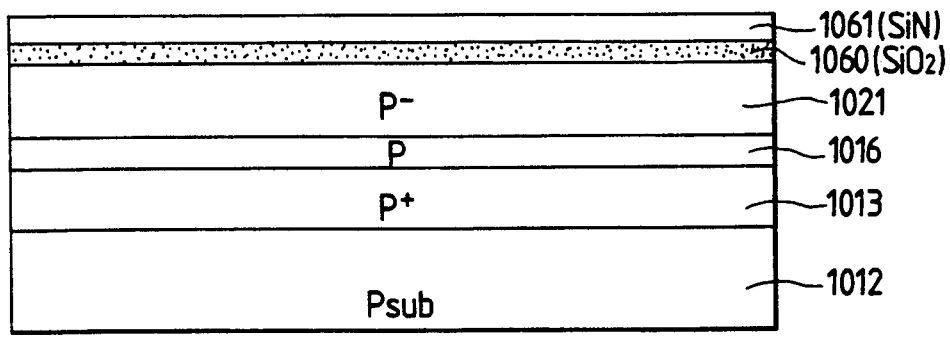
FIG. 16 is a schematic view illustrating the manufacturing method of the first embodiment.

The manufacturing method of the first embodiment will be described below with reference to FIGS. 16 through 20. FIGS. 16 through 19 are cross-sectional views which correspond to FIG. 12. FIG. 20 corresponds to FIG. 14. First, boron ions are injected into the surface of the p type silicon substrate 1012, and then activation of the impurities in the ion injected layer is conducted at about 900° C. After the p+ high concentration layer 1013 has been formed, the wafer is washed and placed in an epitaxial growth device. In the device, the natural oxidized film formed on the surface is removed due to reduction of silane, and then the 2 μm thick p layer 1016 and the 0.5 μm thick p⁻ layer 1021 are sequentially grown at a low temperature of 850° C. Low-temperature epitaxial growth restricts welling of impurities, and provides firm joint between p+−p and p−p⁻. The concentration of the p+ layer is $10^{19} cm^{-3}$. The concentration of the p layer is $10^{17} cm^{-3}$. The concentration of the p⁻ layer is $10^{16} cm^{-3}$. The resultant wafer is subjected to thermal oxidation to form the silicon oxide film 1060 of about 250 Å. Thereafter, the silicon nitride film 1061 of 250 Å is formed on the silicon oxide film 1060 by the vapor chemical deposition technique (CVD) (FIG. 16).

Figure 17:
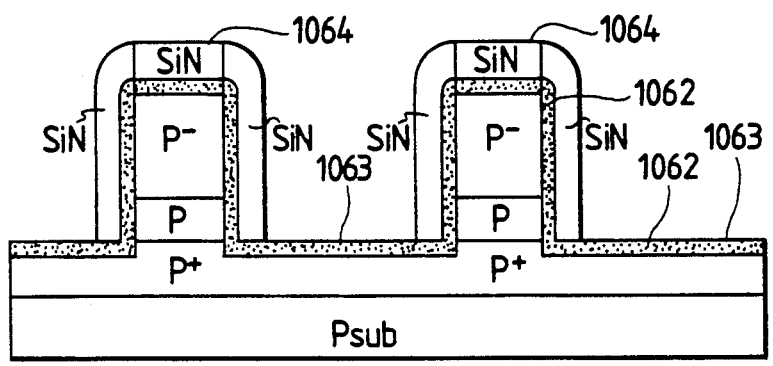
FIG. 17 is a schematic view illustrating the manufacturing method of the first embodiment.

Next, reactive anisotropic etching is conducted on the wafer except for the transistor forming area using a resist as a mask to vertically remove the silicon nitride film 1061, the silicon oxide film 1060, the p⁻ layer 1021 and the p layer 1016. The end of the groove formed by etching is as deep as either the p layer or p+ layer. It is not necessary to control the depth of the groove strictly, which is one of the advantages of this structure. Next, the resist used for patterning is removed. After washing of the wafer, a silicon oxide film 1062 of about 250 Å thickness is formed on the surface where Si is exposed. Thereafter, a silicon nitride film is deposed on the entire surface by CVD, and only the silicon nitride film formed on a bottom surface 1063 is removed by the anisotropic silicon nitride film etching, as shown in FIG. 17. At that time, a silicon nitride film 1064 formed on Si columns remains because they consist of two layers (FIG. 17).

Figure 18:
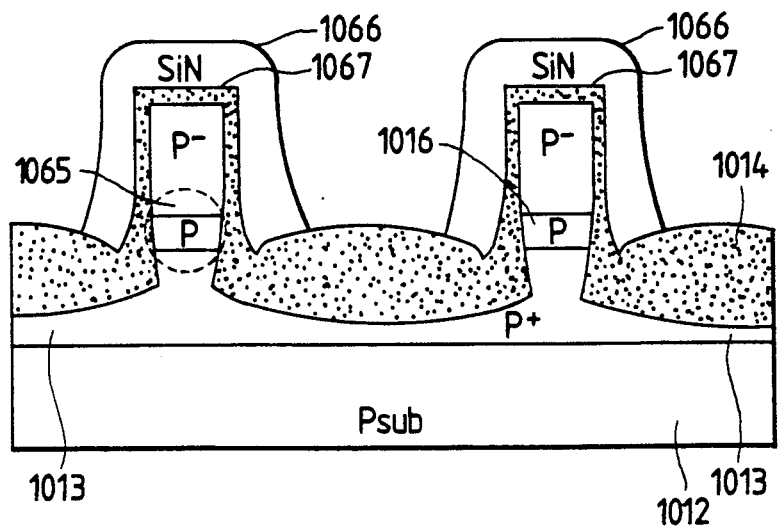
FIG. 18 is a schematic view illustrating the manufacturing method of the first embodiment.

Next, pyrogenic oxidation is conducted on the wafer at about 900° C. to selectively oxidize the surface on which no silicon nitride film is formed. This process forms a field oxidized film 1014, as shown in FIG. 18. This field oxidation process deforms the silicon columnar I portion, as indicated by 1065. However, the deformed area is either the p layer 1016 or the p+ layer 1013, and is not affected by deformation (FIG. 18).

Next, the silicon nitride film 1066 used for selective oxidation and the pad oxide film 1067 are removed. After the exposed Si surface has been washed, the gate oxide film 1022 is formed by thermal oxidation. Thereafter, poly-Si and W (tungsten) are continuously deposited, and then a gate electrode consisting of p+ type polysilicon, $W_{1-x}Si_x$ and W was formed by injecting boron ions from the W surface and then by annealing. The distance between the opposing gates o#the transistor of this type is 0.1 μm. Thus, the transistor is turned on and off by controlling the entire potential of the channel portion by the gate voltage. Hence, the threshold thereof, which is reduced than that of a conventional MOSFET, is increased by the presence of the p+ layer 1068. A W metal 1069 formed on the upper portion of the gate electrode reduces the resistance of the word lines.

After patterning of the gate electrode, a n+ layer is diffused using the gate as a mask to form the source layer 1030 and the drain layer 1017.

Figure 19:
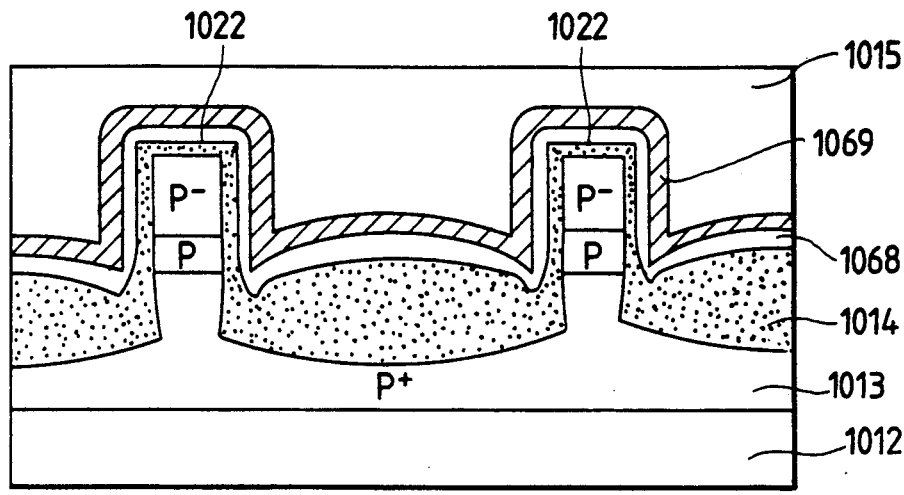
FIG. 19 is a schematic view illustrating the manufacturing method of the first embodiment.
Figure 20:
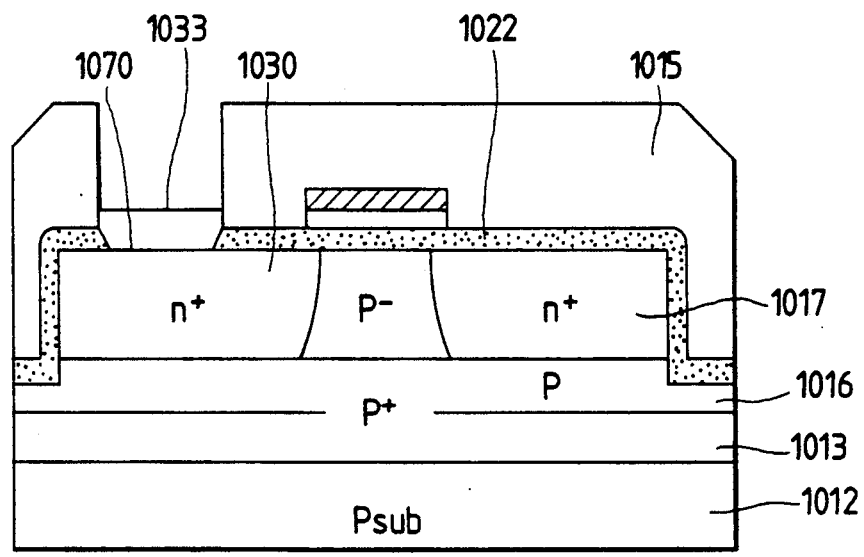
FIG. 20 is a schematic view illustrating the manufacturing method of the first embodiment.

Next, as shown in FIG. 19, the interlayer insulator 1015 is planarized and formed. Flattening of the insulating layer 1015 is achieved by a combination of deposition of tetraethyl orthosilicate (TEOS) and etching back. Thereafter, the concentration of the thin $SiO_2$ film is increased in an atmosphere of $N_2$ at 550° C. The thin $SiO_2$ film may also be formed by forming an oxide film in platinum after washing and then by increasing the concentration thereof in an atmosphere of $N_2$ at a temperature ranging from 500° to 600° C.

Next, a contact hole 1070 is formed only in the source region 1030. Only in the contact hole, the Si surface is exposed. A 50Å thick oxide silicon film 1033 is formed by CVD only in the contact hole. Thereafter, the concentration of the thin $SiO_2$ film is increased in an atmosphere of $N_2$ at 550° C.. The thin $SiO_2$ film may also be formed by a process within a hydrogen peroxide together with platinum as a catalyst following to a rinsing Si, and then increasing the concentration thereof in an atmosphere of $N_2$ at a temperature ranging from 500° to 600° C. Subsequently, the power source and bit line interconnections are formed, and then patterning and passivation films are formed, by which the cell structure is completed. In this embodiment, the n channel MOSFET has been described. However, a p channel MOSFET can be manufactured by the same process, if the conductivity type is inverted. Thus, the peripheral circuit can be manufactured as a CMOS structure consisting of a n channel MOSFET and a p channel MOSFET.

As will be understood from the foregoing description, the first embodiment of the present invention is of the type in which a conducted state and a non-conducted state are obtained by breakdown and non-breakdown of an insulating film, respectively, and is not of the type in which a small amount of stored electric charges is read out, as in the case of the conventional DRAM or EPROM. Therefore, even when the degree of fine processing is increased, reading out at a high S/N ratio can be provided. Furthermore, reading out is conducted using a transistor which has a new structure.

Since this transistor has a fine structure and a high driving capability, high integration and high-speed reading out can be achieved.

Second Embodiment

The second embodiment differs from the first embodiment in that a p layer 1080 having a higher impurity concentration than the p⁻ layer is formed on the p⁻ layer 1017 serving as the channel area.

This structure is obtained by conducting epitaxial growth while changing the impurity concentration when the p well layer 1016, the p⁻ layer 1017 and the p layer 1080 are formed. Thus, the manufacturing process of the second embodiment is the same as that of the first embodiment.

Figure 21:
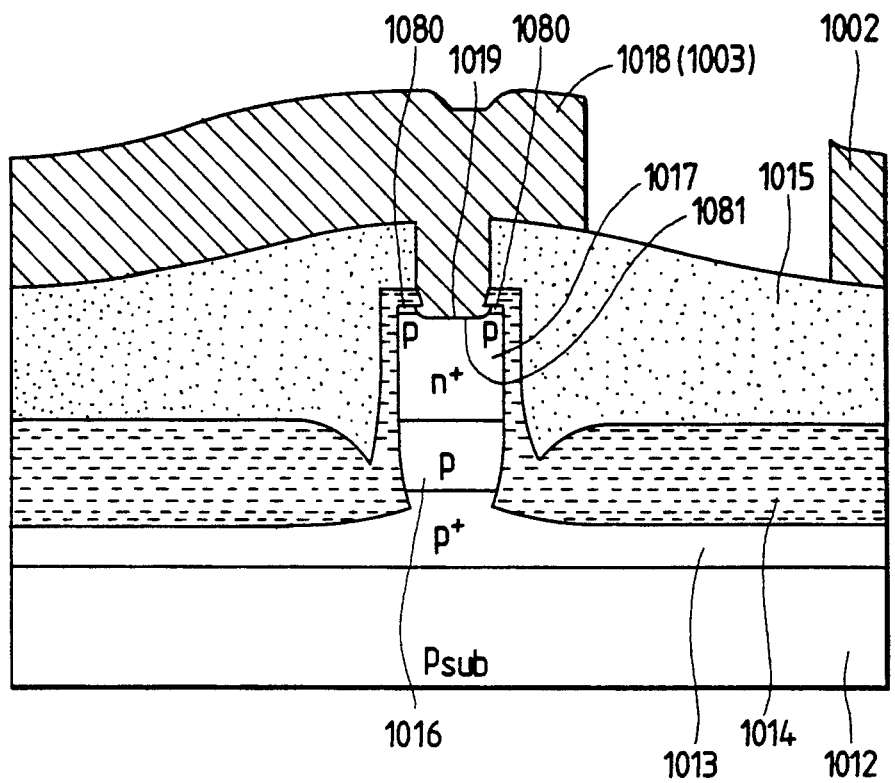
FIG. 21 is a schematic cross-sectional view of a second embodiment of the semiconductor device according to the present invention.

Furthermore, when contact between the drain layer 1017 and the power source is provided, the Si layer on the surface of the drain is slightly removed, as indicated by 1081 in FIG. 21, and then the drain layer 1017 is connected to the power source.

Next, the operation of the transistor employed in the second embodiment will be described below.

The p layer 1016 and the p layer 1080 have impurity concentrations which ensure that no inversion layer is formed on the interface between the upper gate insulating film 1022 and the p layer 1080 even when the gate voltage is at a maximum during the operation. Hence, a channel is formed only on the side wall portion between the p⁻ layer 1021 and the gate insulating film 1022. Therefore, the aforementioned structure is equivalent to the structure including two opposing gates, and thus assures stable operation.

Figure 22:
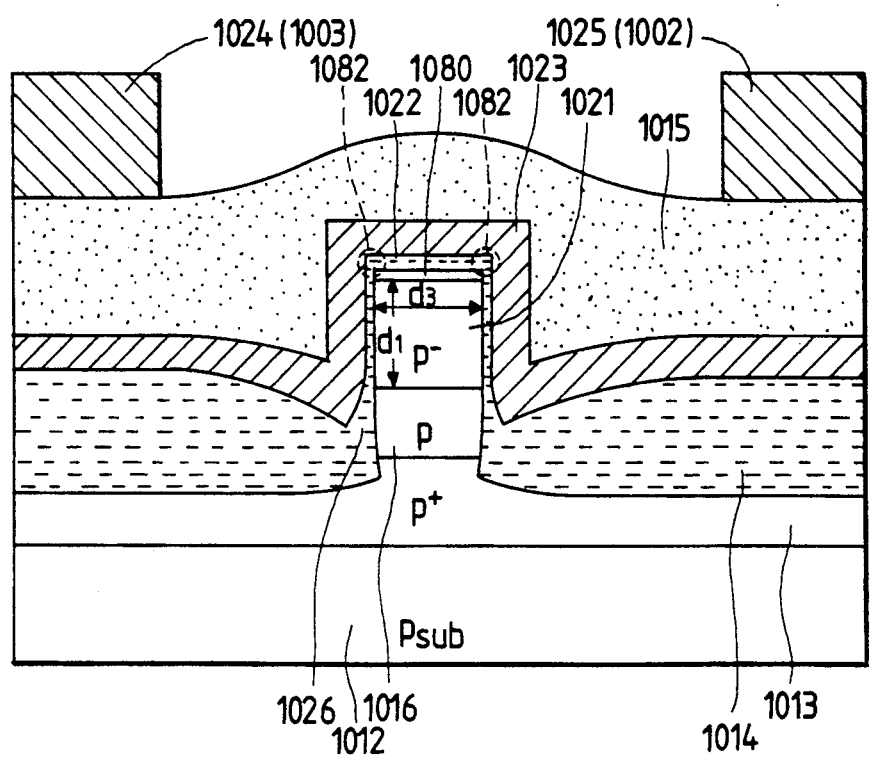
FIG. 22 is a schematic cross-sectional view of the second embodiment of the present invention.

Furthermore, although the thickness of the insulating film at the edge portion of Si is smaller than that of the flat portion and the withstanding voltage thereof is thus lower than that of the flat portion, as indicated by 1082 in FIG. 22, since the concentration of the inner p layer is high, sufficient voltage withstanding is obtained, and the thickness of the insulating layer can thus be made smaller than that of the insulating layer employed in the first embodiment. This assures high gm characteristics.

Such excellent transistor characteristics provide high-speed reading out for the memory.

Third Embodiment

Figure 25:
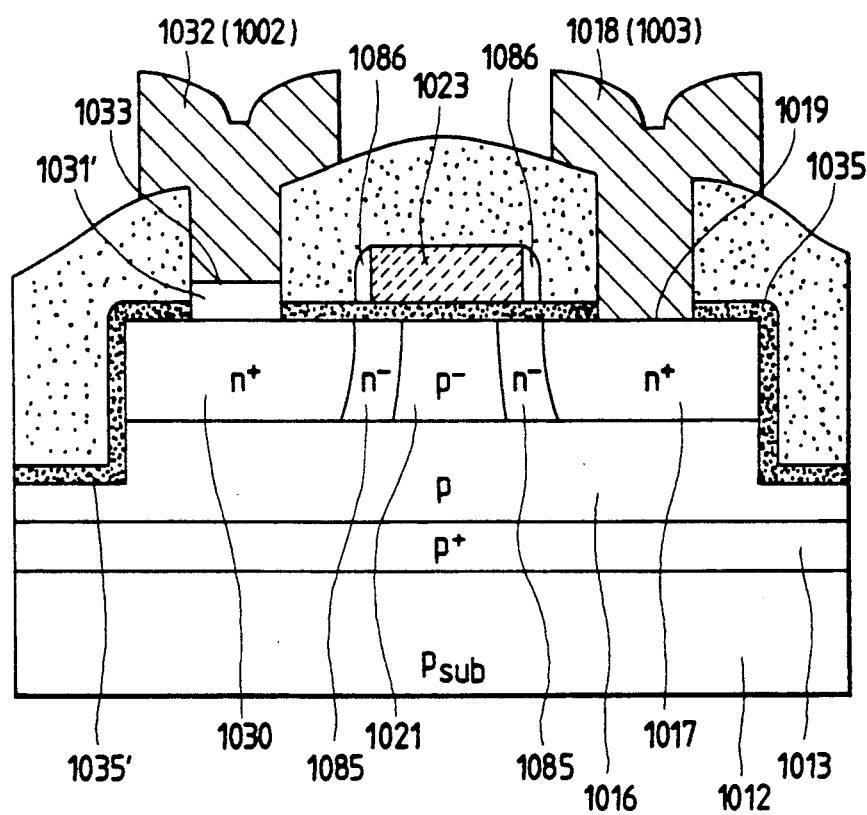
FIG. 25 is a schematic cross-sectional view of a third embodiment of the semiconductor device according to the present invention.

A third embodiment of the present invention will be described below with reference to FIG. 25. Like the second embodiment, the third embodiment is an improved one of the first embodiment. Thus, the cross-sectional views of the portions which correspond to those of the first embodiment, except for the cross-section shown in FIG. 25, are the same as FIGS. 11, 12 and 13. Parts which are the same as those of the first embodiment are designated by the same reference numerals, description thereof being omitted. The third embodiment is characterized in that a n⁻ layer 1085 is formed in each of the portions of the source and drain which are located near the gate electrode. This structure can be readily formed in a self-alignment fashion utilizing the insulating layer provided on the side wall of the gate electrode, as in the case of the manufacture of a structure, such as LDD or GOLD. In this structure, an electric field at the portion of the gate electrode near the source and drain is limited, and entry of unnecessary carriers into the channel area can be prevented. It is therefore possible to provide a highly reliable memory which exhibits high-speed reading out and which can prevent generation of hot carriers.

Furthermore, the n⁻ layers are symmetrically provided for both the source and drain. However, since a high voltage is applied to the drain end while it is desirable that a resistor component not be provided near the source due to an improvement in the driving capability, a n⁻ layer may be provided only at the drain side.

Fourth Embodiment

In this embodiment, the interconnections connected to the source and drain of the transistor are made to cross each other.

Figure 26:
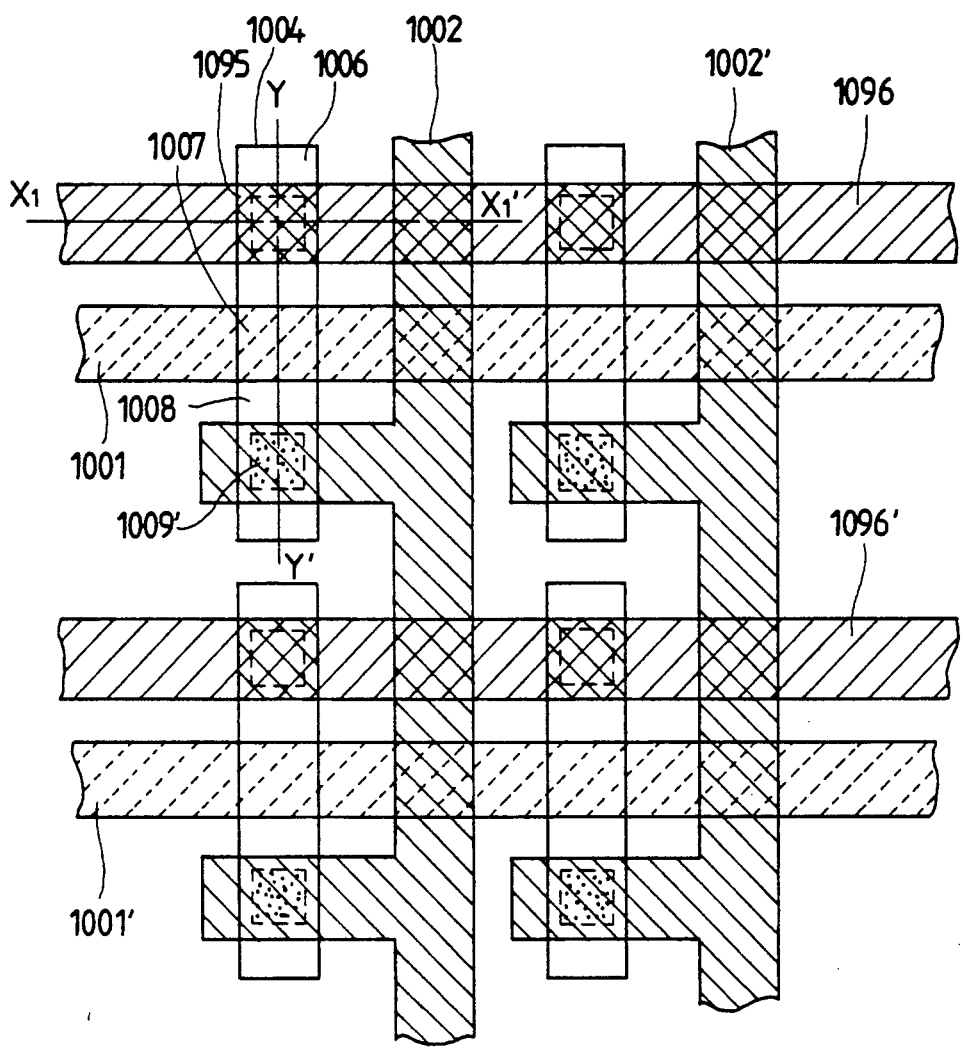
FIG. 26 is a schematic plan view of a fourth embodiment of the semiconductor device according to the present invention.
Figure 27:
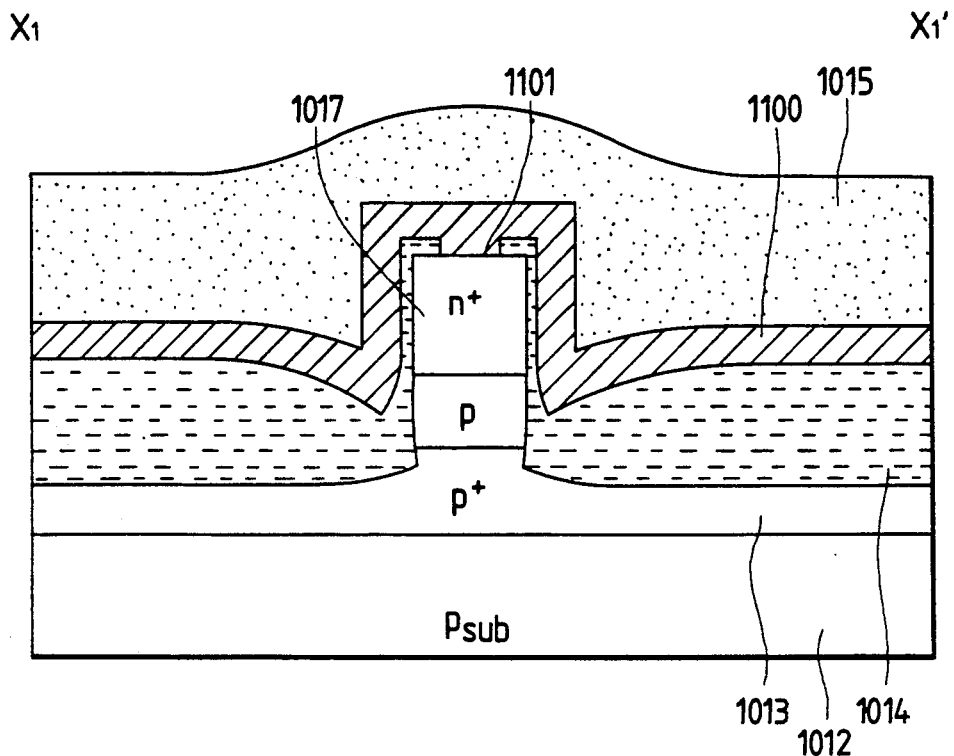
FIG. 27 is a schematic cross-sectional view taken along line $X_1X_1'$ of FIG. 26.
Figure 28:
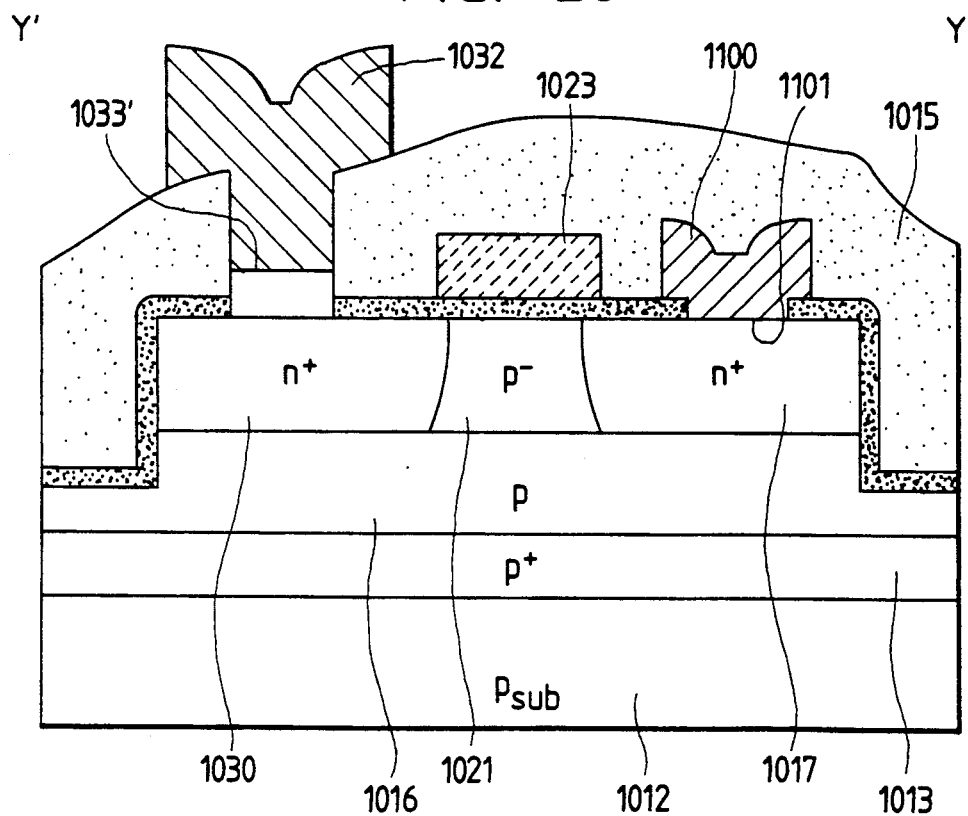
FIG. 28 is a schematic cross-sectional view taken along line YY' of FIG. 26.

The fourth embodiment of the present invention will be described below with reference to FIGS. 26, 27 and 28. FIG. 26 is a plan view of the fourth embodiment. FIG. 27 is a section taken along a line $X_1$—$X_1'$ of FIG. 26. FIG. 28 is a section taken along a line Y—Y' of FIG. 26. In the first embodiment, the word lines run in the horizontal direction, while the bit lines and power source lines are provided in the vertical direction. However, in the fourth embodiment, word lines 1001 and 1001' and power source lines 1096 and 1096' run in the horizontal direction, while only bit lines 1002 and 1002' run in the vertical direction. Since the transistor of this embodiment is longitudinally long, provision of the power source lines in the horizontal direction decreases the area by two cells from that of the first embodiment and thus achieves higher integration.

An example of the structure which assures the layout shown in FIG. 26 will be explained with reference to FIGS. 27 and 28. In FIG. 27, reference character 1100 denotes a n⁺ type polysilicon —$W_{1-x}Si_x$—W interconnection which serves as a power source line; and 1101, a direct contact portion where the n⁺ type polysilicon is in direct contact with the drain layer 1017. As can be seen from FIG. 28, two polysilicon—polycide W interconnections 1023 and 1100 are disposed in the horizontal direction. In addition to the structure shown in FIGS. 27 and 28, a metal double-layer interconnection, consisting of a first metal layer serving as a bit line and a second metal layer serving as a power source line, may also be employed.

Fifth Embodiment

Figure 29:
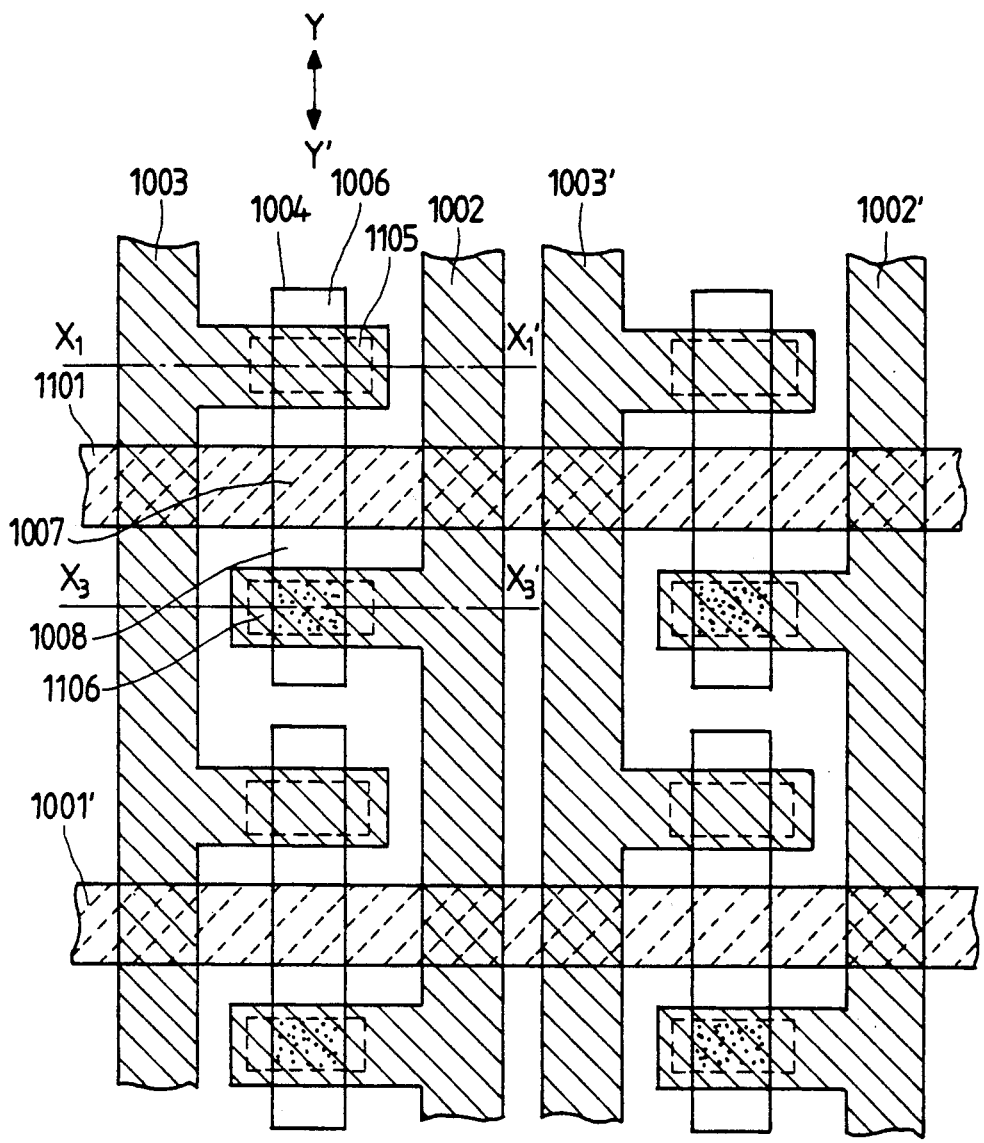
FIG. 29 is a schematic plan view of a fifth embodiment of the semiconductor device according to the present invention.
Figure 30:
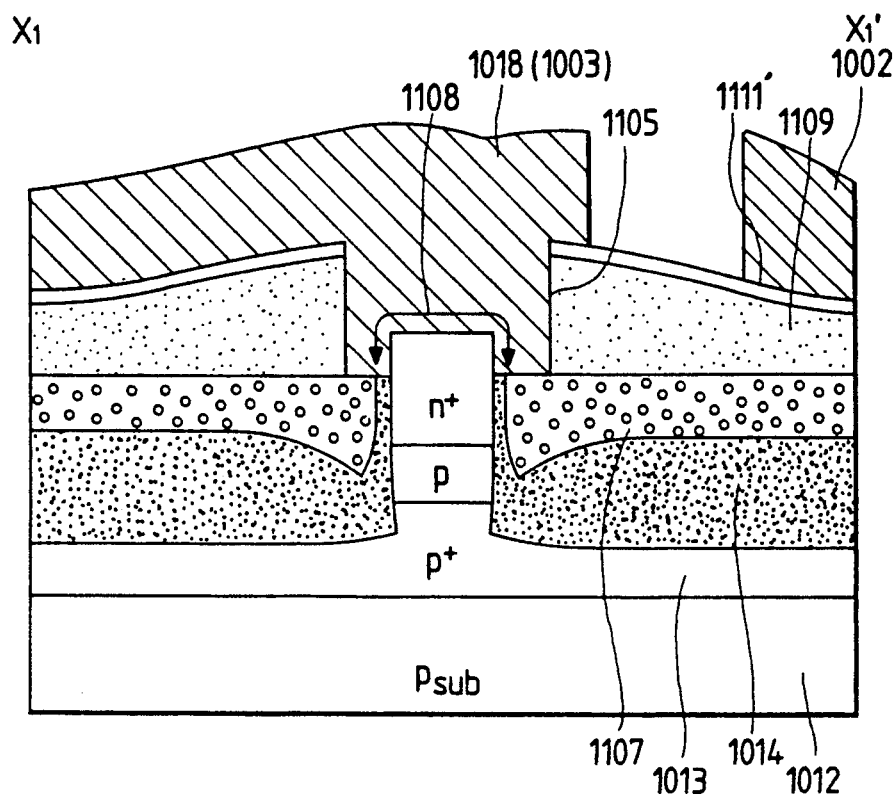
FIG. 30 is a schematic cross-sectional view taken along line $X_1X_1'$ of FIG. 29.
Figure 31:
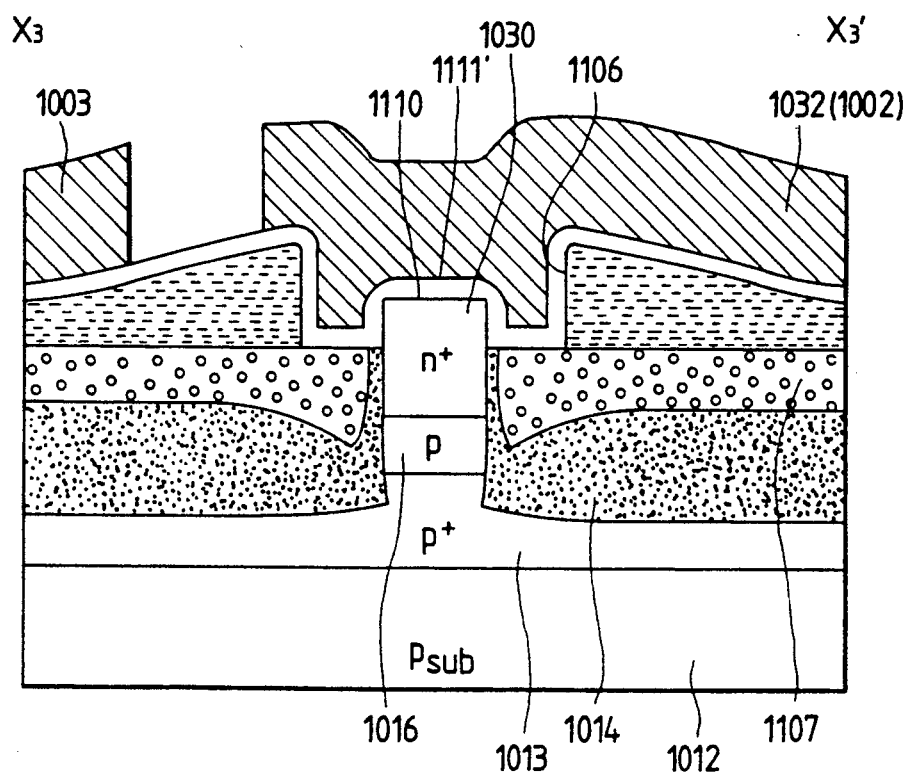
FIG. 31 is a schematic cross-sectional view taken along line $X_3X_3'$ of FIG. 29.

A fifth embodiment of the present invention will be described below with reference to FIGS. 29, through 31. FIG. 29 illustrates the layout of a memory cell. FIG. 30 is a section taken along line $X_1$—$X_1'$ of FIG. 29. FIG. 31 is a section taken along line $X_3$—$X_3'$ of FIG. 29. This embodiment differs from the first embodiment in that the contact size of the source and the drain of the transistor is wider. When the contact, which is long in a direction perpendicular to the direction (Y—Y' direction) in which a current flows in the transistor, is made wide, contact can be provided even at the side wall of the source and drain, and contact resistance can thus be reduced. When the degree of fine processing is high, the circuit characteristics are affected not only by the driving capability of the transistor but also by the parasitic resistance and capacity thereof. The aforementioned structure is excellent in terms of reduction in the parasitic resistance. The structure of the contact will now be described in detail with reference to FIGS. 30 and 31.

In FIG. 30, reference character 1105 denotes a contact hole for the drain layer; 1107, a first interlayer insulator for stopping the contact edge; 1109, a second interlayer insulator which is made of a material different from that of the first interlayer insulator and which ensures etching selectivity. If the first interlayer insulator is, for example, a silicon nitride film, a silicon oxide film is used as the second interlayer insulator. In this way, the drain can be brought into contact with the metal interconnection over a wide area, as indicated by 1108 in FIG. 30.

In the contact for the source portion, a thin insulating film 1111 for a memory is formed on the surface of an exposed n+ layer 1110, as shown in FIG. 31, which is in turn in contact with a metal interconnection 1032 through a p+ layer. As mentioned above, in the present embodiment, the resistance of the contact portion can be further reduced, and high-speed reading out can thus be provided.

Sixth Embodiment

A sixth embodiment of the present invention will be described below with reference to FIGS. 32 and 33. In the sixth embodiment, the same structure as that of the first embodiment is manufactured by the different manufacturing method. Parts which are the same as those of FIGS. 16 through 20 are designated by the same reference numerals, description thereof being omitted.

Figure 32:
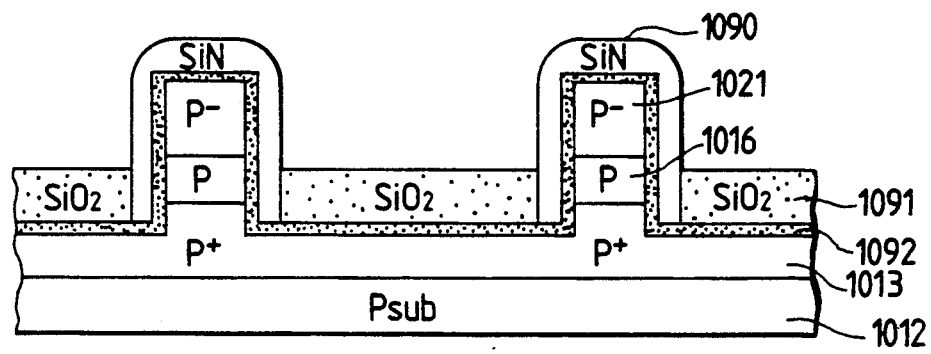
FIG. 32 is a schematic view illustrating a method of manufacturing a semiconductor device according to a sixth embodiment of the present invention.
Figure 33:
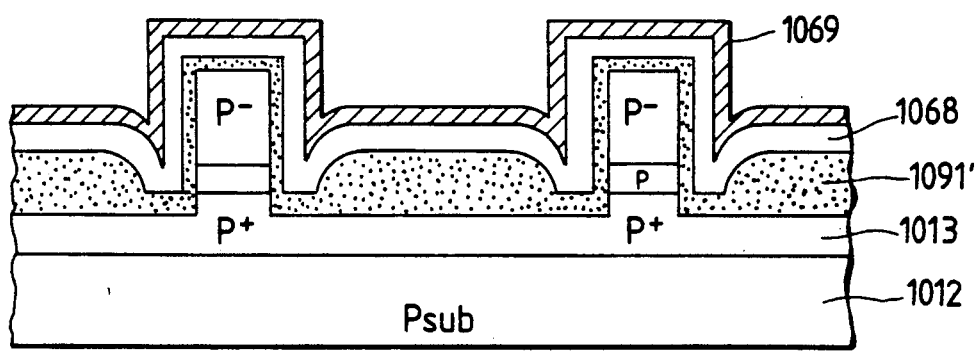
FIG. 33 is a schematic view illustrating a method of manufacturing a semiconductor device according to a sixth embodiment of the present invention.

As shown in FIG. 32, the sixth embodiment is characterized in that the field oxide film is formed not by selective oxidation but by a combination of film formation and etching. The manufacturing process up to the formation of pad oxide film and silicon nitride film is the same as that of the first embodiment. Thereafter, the silicon oxide film formed on the surface from which the silicon nitride film is anisotropically etched is removed, and a thermally oxide film 1082 is formed again. An interlayer insulator is formed utilizing TEOS, and a SiO$_2$ layer 1091 is formed by etchback. A sufficient etching selectivity between the silicon nitride film and the silicon oxide film is necessary for the etchback.

In this etchback process, the surface of the field oxide film is made higher than an interface 1013 between the p layer 1016 and the p+ buried layer 1013 and lower than an interface between the p layer 1016 and the p− layer 1021. After the silicon nitride film and then the pad oxide film are removed, the wafer is washed and gate oxidation is then conducted so as to shape the field oxidized film, as indicated by 1091' of FIG. 33. Thereafter, the gate electrode layers 1068 and 1069 are formed in the same manner as that of the first embodiment. The aforementioned manufacturing method does not contain the high temperature process. Consequently, unnecessary diffusion of impurities is reduced, and the stable size of the channel area can be obtained. Furthermore, distortion, which would be generated by the field oxidation, can be eliminated. Since variations in the individual memory cells in the semiconductor memory can be reduced, high yield can be achieved.

Writing and reading out operations were performed on the semiconductor memories manufactured on the basis of the individual embodiments. In each embodiment, excellent operations could be obtained.

Next, a memory having a PN junction breakdown type memory element will be described below.

Seventh Embodiment

Figure 34:
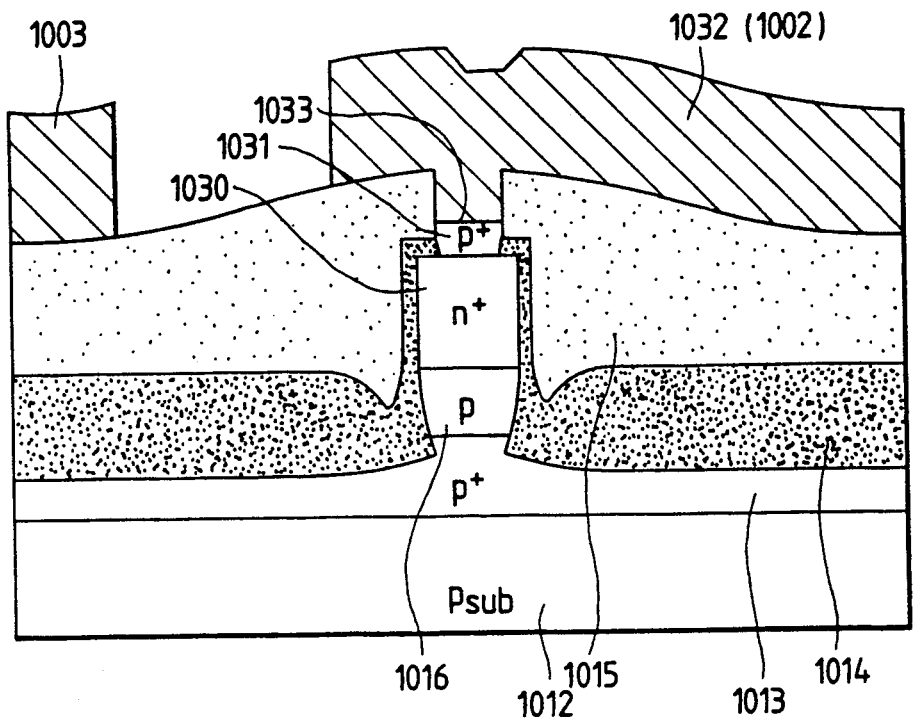
FIG. 34 is a schematic cross-sectional view of a seventh embodiment of the semiconductor device according to the present invention.
Figure 35:
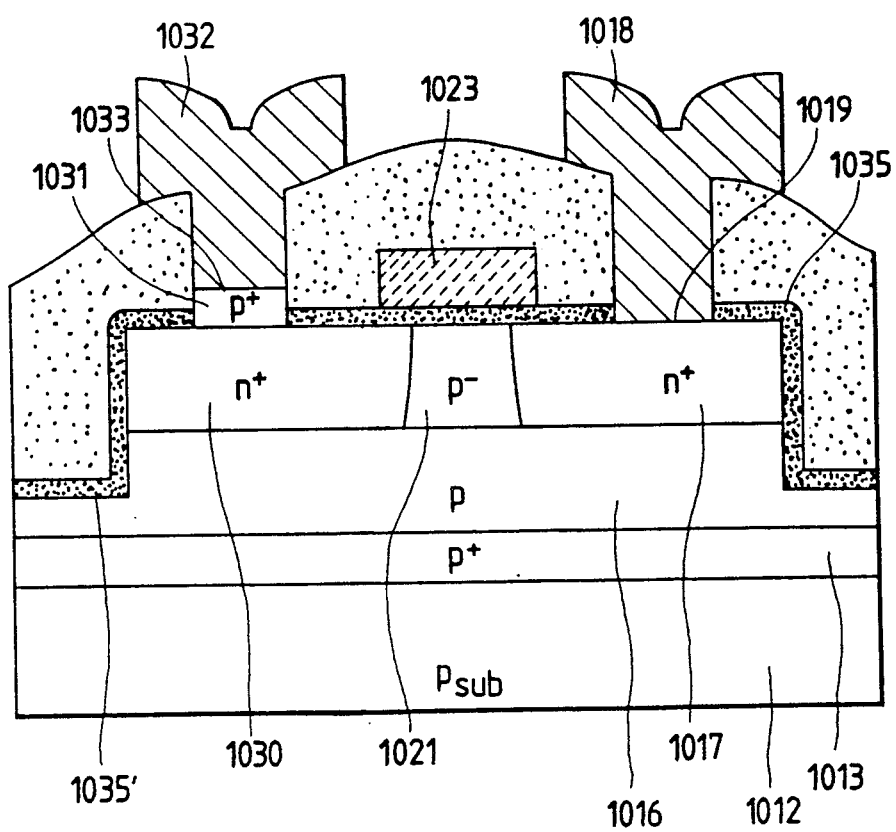
FIG. 35 is a schematic cross-sectional view of the seventh embodiment of the present invention.

FIGS. 34 and 35 are cross-sectional views of a memory cell according to the seventh embodiment of the present invention, and correspond to FIG. 13. Unlike the memory cell shown in FIG. 13, the memory cell shown in FIGS. 34 and 35 is of the PN junction breakdown type having a p+ semiconductor layer 1031 (FIG. 34) which replaces the insulating layer 1031' (FIG. 13) constituting the memory element in the memory cell shown in FIG. 13. Other structure of this semiconductor memory is the same as that of the first embodiment.

Reference character 1030 denotes a n+ −Si region which serves as the source layer; and 1031, a p+ region formed on the source layer 1030. Conduction or conconduction of the memory is determined by a pn junction, composed by the n+ −Si region 1030 and the p+ region 1031. A bit line interconnection 1032 is formed on the p− layer through a contact region 1033.

Figure 36:
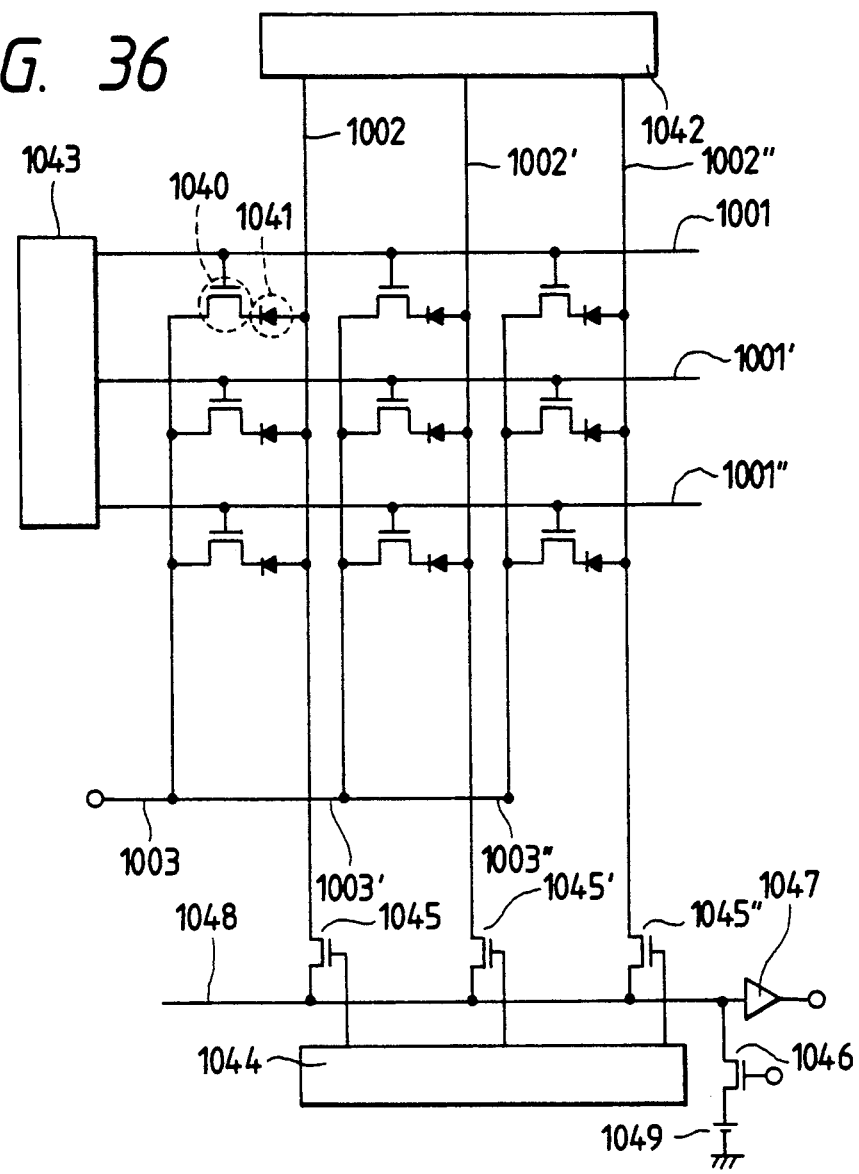
FIG. 36 is a circuit diagram of the seventh embodiment of the present invention.

The activating method and storing method of the seventh embodiment will now be described. FIG. 36 illustrates the layout of the memory cell of this embodiment. Reference 1001 through 1001''' denote word lines; 1002 through 1002'', bit lines; and 1003 through 1003'', power source lines Each of the memory cells has a transistor 1040 which is finely processed and which has a high-current driving ability, and the pn junction 1041 formed on the source layer of the transistor 1040. The peripheral circuits of the memory are a bit line voltage setting circuit 1042, a word line voltage setting circuit 1043, a bit line sequentially selecting signal generating circuit 1044, bit line selecting switches 1045 through 1045'', a switch 1046 for resetting a bit line reading out line 1048, and an amplifier 1047.

First, the writing operation will be explained.

(1) Writing operation part 1: (pre-charge of the bit lines).

The voltage $V_{DD}$ is set on the bit lines by the voltage setting circuit 1042. Consequently, no potential difference exists between the power source lines and the bit lines. Thus, no matter what voltage is applied to the word lines, no potential is generated or no current flows between the source and the drain, and breakdown of the pn junction 1041 thus does not occur. The pre-charge voltage applied to the bit lines may not be equal to the power source voltage $V_{DD}$. When the pre-charge voltage is not equal to the power source voltage, a voltage which does not generate breakdown of the pn junction and hence conduction is set. A voltage between 1 and 5 v is applied as $V_{DD}$.

(2) Writing operation part 2: (discharge of the word lines).

The voltage on all of the word lines is fixed to a first grounding voltage $V_{GND1}$. It is fixed to, for example, 0 v. This prevents mixture of a signal into the adjacent word lines of the word line on which writing is conducted due to generation of cross-talk.

(3) Writing operation part 3: (selection of a writing word line).

Assuming that the present writing bit represents the cell on the second line and second row with the upper and left cell as an origin, the writing bit is present on the word line 1001'. Hence, the potential on the word line 1001' is set to $V_G$ which is expressed by:

$$V_{GND1} < V_G < V_{GB} \qquad \text{Equation (2)}$$

where $V_{GB}$ is a gate insulating film breakdown voltage.

(4) Writing operation part 4: (selection of a bit line).

The voltage on the bit line corresponding to the writing cell present on the selected line is set to the grounded voltage. Since all the transistors present on the selected line have been turned on, application of the grounded voltage causes a high voltage to be applied to the pn junction, causing breakdown of the pn junction and hence conduction. When the writing operation is completed, a current flows between the bit line and the word line. Thus, it is desirable that selection of the bit lines be conducted line by line. However, it is also possible to conduct writing on a plurality of bit lines at the same time.

Next, the reading out operation will be explained. This operation consists of following four major operations.

(1) Reading out operation part 1: (pre-charge of the bit lines).

Pre-charge of the bit lines is conducted in the same manner as that of the writing operation so that the reading out operation does not perform writing on the bits on which writing has not been conducted. The voltage applied for pre-charging is equal to the power source voltage $V_{DD}$.

(2) Reading out operation part 2 (discharge of the word lines).

The voltage on all of the word lines is fixed to second grounded voltage $V_{GND2}$. The voltage $V_{GND2}$ and the first grounded voltage $V_{GND1}$ has the following relation.

$$V_{GND1} < V_{GND2} \qquad \text{Equation (3)}$$

(3) Reading out operation part 3 (selection of a reading line).

The voltage on the word line on which the reading out operation is to be conducted is fixed to $V_G$ defined by Equation (2) to turn on the transistors present on that line.

(4) Reading out operation part 4 (resetting of the bit line reading out line).

The bit line reading out line 1048 is reset by the switch 1046. The reset voltage, determined by the power source connected to the switch 1046, is $V_{GND2}$. Thereafter, the switch 1046 is turned off to make the bit line reading out line floating.

(5) Reading out operation part 5 (selection of a bit line).

The gate of the selected bit selection switch is raised by the bit line sequentially selecting signal generating circuit 1044 to turn on the switch and thereby connect it to the bit line reading out line. If the selected cell is not present, the voltage on the reading out line converges to the value expressed by $$\frac{C_{BIT} \cdot V_{DD} + C_{OUT} \cdot V_{GND2}}{C_{BIT} + C_{OUT}}$$

where $C_{BIT}$ is the capacity of the bit line and $C_{OUT}$ is the capacity of the reading out line.

If the selected cell is present and the pn junction is in a conducting state, the reading out line is connected to the power source $V_{DD}$ through the transistor and the voltage on the reading out line thus converges to $V_{DD}$. These two voltage states are utilized to determine whether the written cell (bit) is present or not. The voltage on the reading out line is detected by the amplifier 1047. In the reading out operation which is conducted in the manner described above, in the case of a written state, the time it takes for the voltage on the reading out line to converge to $V_{DD}$ determines the reading out speed. The larger the capacity of the memory, the larger the capacity of the bit line and bit line reading out line. Thus, how these large capacities are driven is the key to an increase in the reading out speed. The aforementioned fine transistor structure having a high driving ability is therefore very effective in this sense.

In this embodiment, two types of grounded voltages are used so that the reading out operation does not cause breakdown of the pn junction. That is, a difference in the voltages applied to the two ends of the pn junction in the reading out operation is lower than that in the writing operation.

Figure 37:
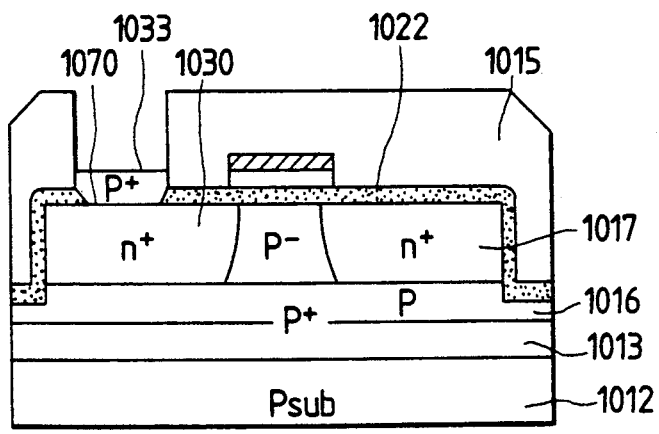
FIG. 37 is a schematic view illustrating a method of manufacturing a semiconductor device according to the seventh embodiment of the present invention.

The manufacturing method of the seventh embodiment will be described below. It is basically the same as the manufacturing process of the first embodiment, i.e., shown in FIGS. 16 through 20. The manufacturing method of this embodiment, however, differs from that of the first embodiment in that the p type semiconductor layer is formed in place of the insulating layer. The process shown in FIG. 20 corresponds to that shown in FIG. 37.

Figure 4:
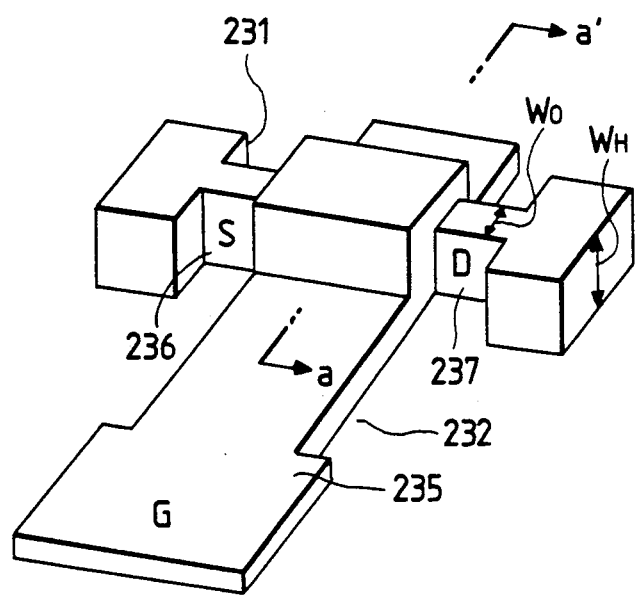
FIG. 4 is a schematic perspective view of a conventional transistor.
Figure 5:
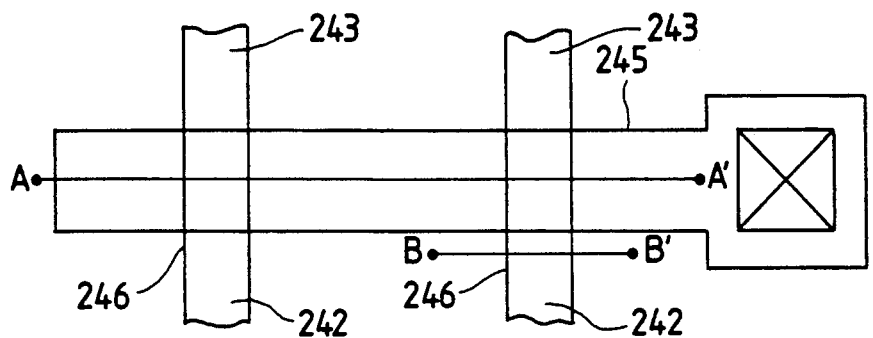
FIG. 5 is a schematic plan view of a conventional semiconductor device.

That is, after manufacture of the MOSFET has been completed by the process shown in FIG. 19, a contact hole 1070 is formed only in a source region 1030. Si is exposed only in this contact hole. A 400 Å to 800 Å thick p+ layer, indicated by 1033 of FIG. 4, is formed only in the contact hole by LPCVD. Thereafter, the power source line and bit line interconnections are formed, and patterning and formation of a passivation film are then conducted, by which manufacture of the cell structure is completed.

As will be understood from the foregoing description. The seventh embodiment of the present invention is of the type in which a conducted state and a non-conducted state are obtained by breakdown and non-breakdown of a pn junction, respectively, and is not of the type in which a small amount of stored electric charges is read out, as in the case of the conventional DRAM or E²PROM. Therefore, even when the degree of fine processing is increased, reading out at a high S/N ratio can be provided. Furthermore, reading out is conducted using a transistor which has a new structure. Since this transistor has a fine structure and a high driving capability, high integration and high-speed reading out can be achieved.

Eighth Embodiment

Figure 23:
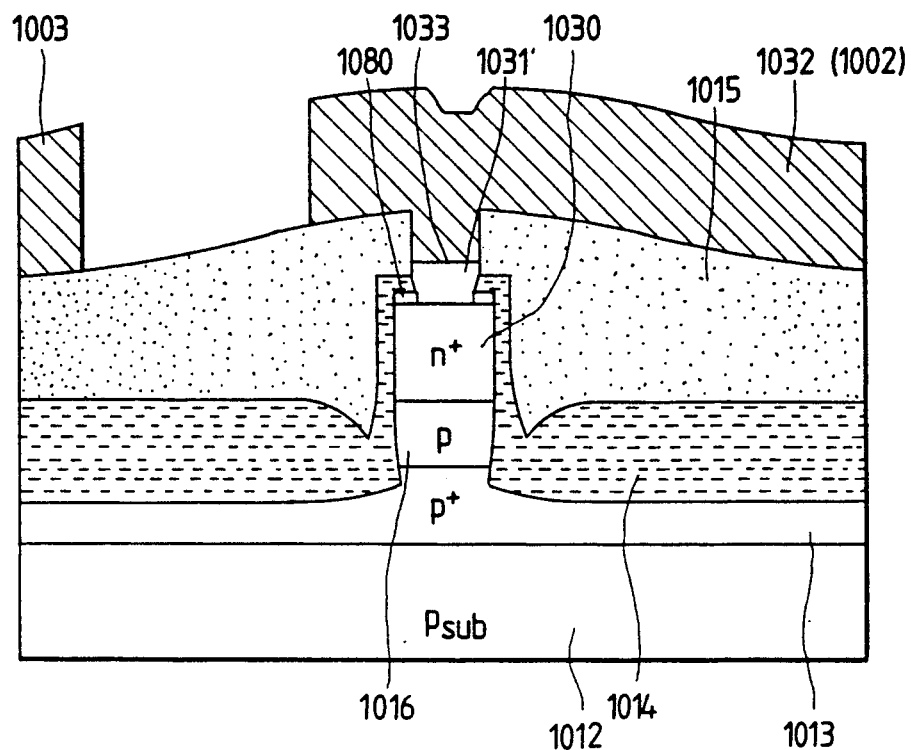
FIG. 23 is a schematic cross-sectional view of the second embodiment of the present invention.
Figure 24:
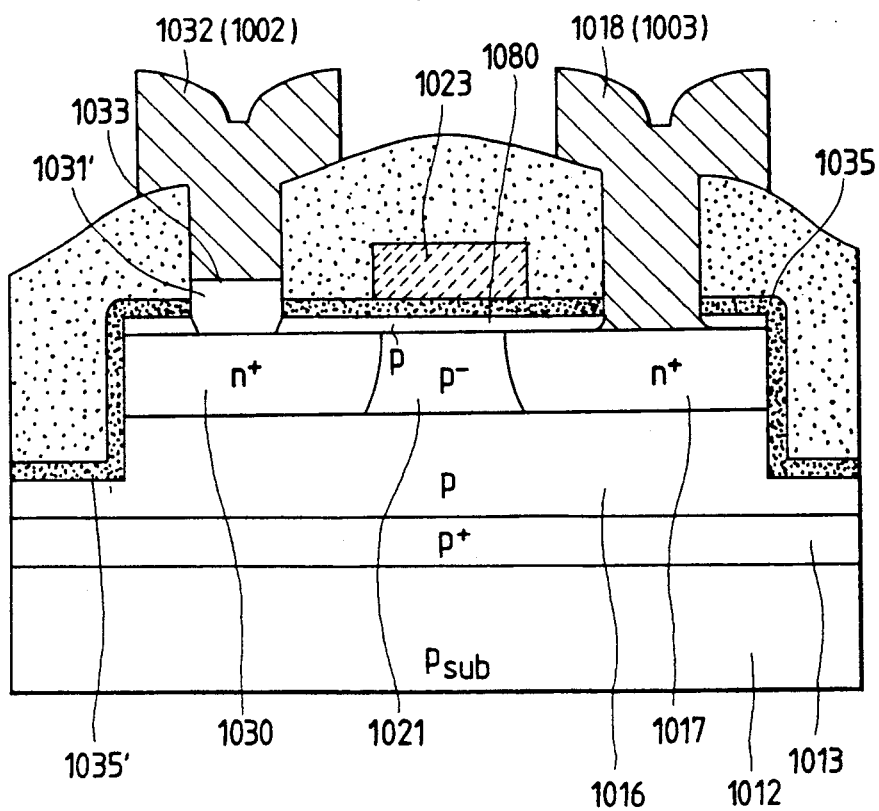
FIG. 24 is a schematic cross-sectional view of the second embodiment of the present invention.
Figure 38A:
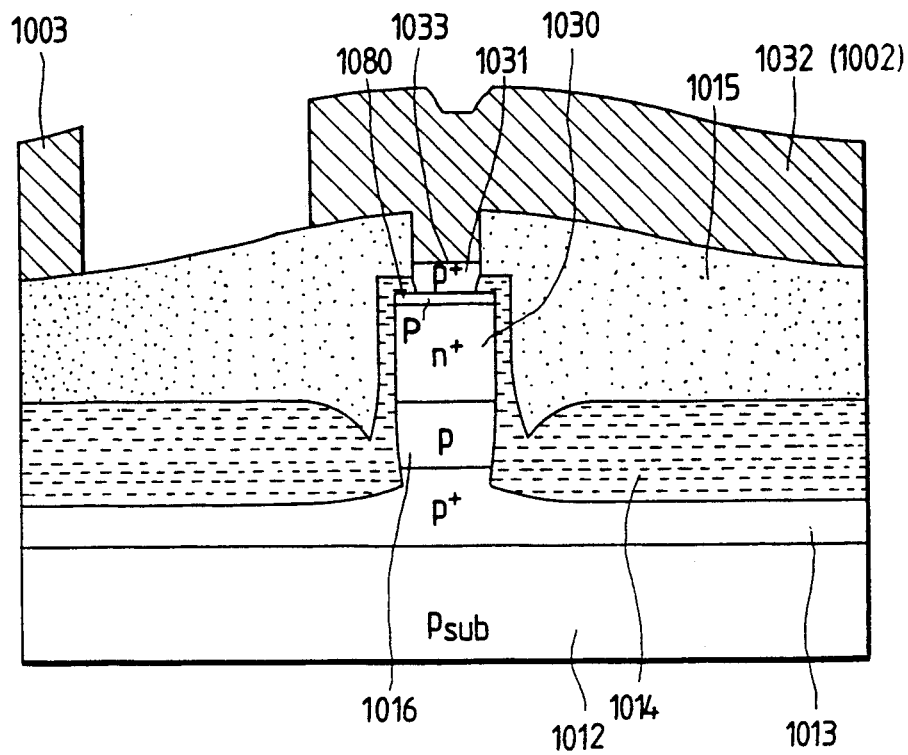
FIGS. 38A and 38B are schematic cross-sectional views of an eighth embodiment of the semiconductor device according to the present invention.
Figure 38B:
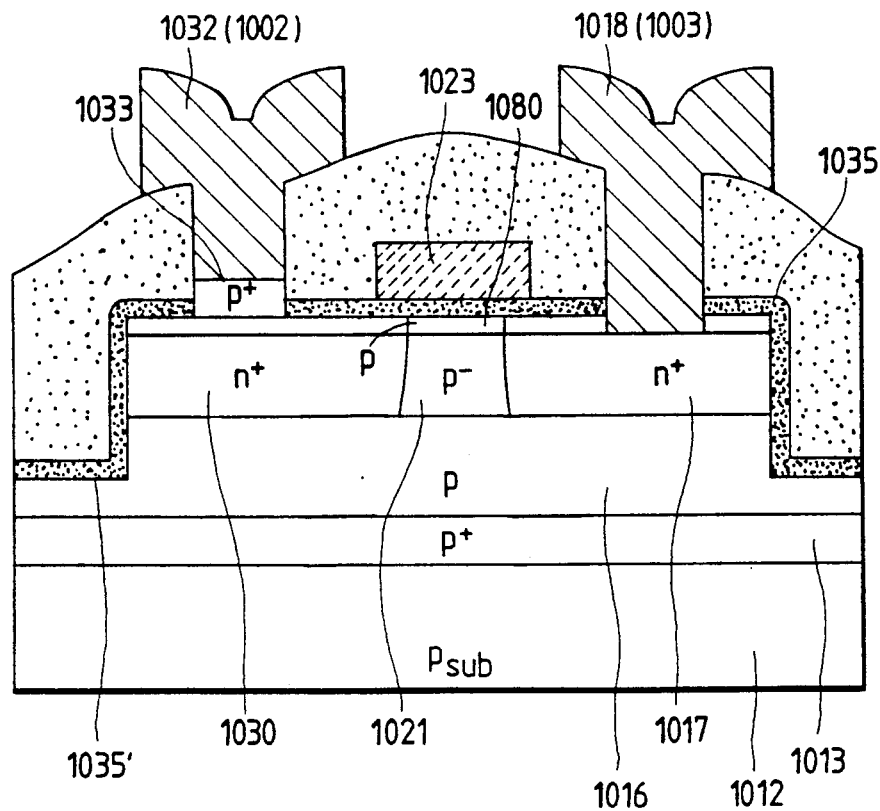

An eighth embodiment of the present invention will be described with reference to FIGS. 38A and 38B. Parts which are the same as those shown in FIGS. 23 and 24 are designated by the same reference numerals, and description thereof is omitted because it is the same as that of the second embodiment. In this embodiment, the memory element is made of a p+pn+ junction, and the junction capacity is thus reduced.

Ninth Embodiment

Figure 39:
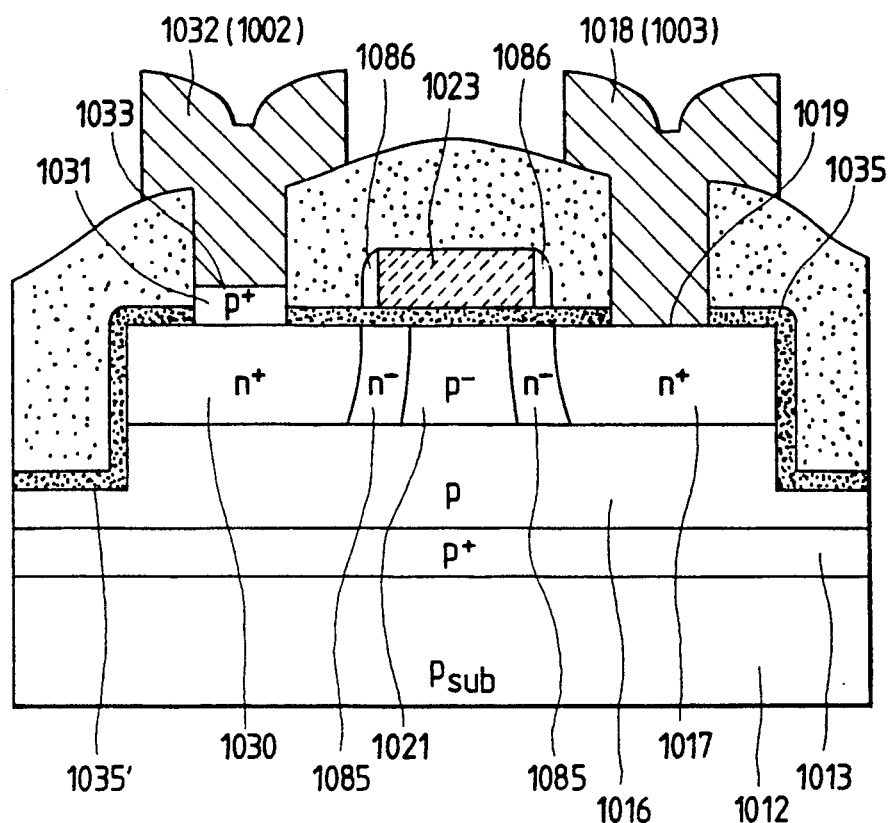
FIG. 39 is a schematic cross-sectional view of a ninth embodiment of the semiconductor device according to the present invention.

This embodiment shown in FIG. 39 is the same as the third embodiment shown in FIG. 25 except that a p+ type semiconductor layer 1031 is formed in place of the insulating layer to form a pn junction.

Tenth Embodiment

Figure 40:
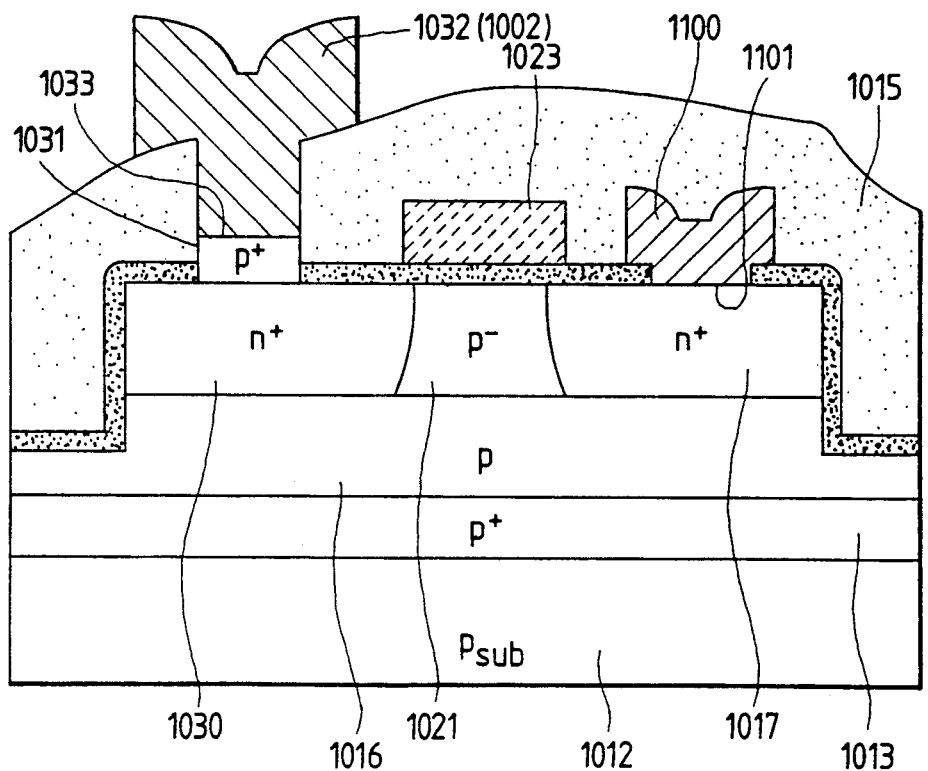
FIG. 40 is a schematic cross-sectional view of a tenth embodiment of the semiconductor device according to the present invention.

This embodiment shown in FIG. 40 is the same as the fourth embodiment shown in FIG. 28 except that a p+ type semiconductor layer 1031 is formed in place of the insulating layer to form a pn junction.

Eleventh Embodiment

Figure 41:
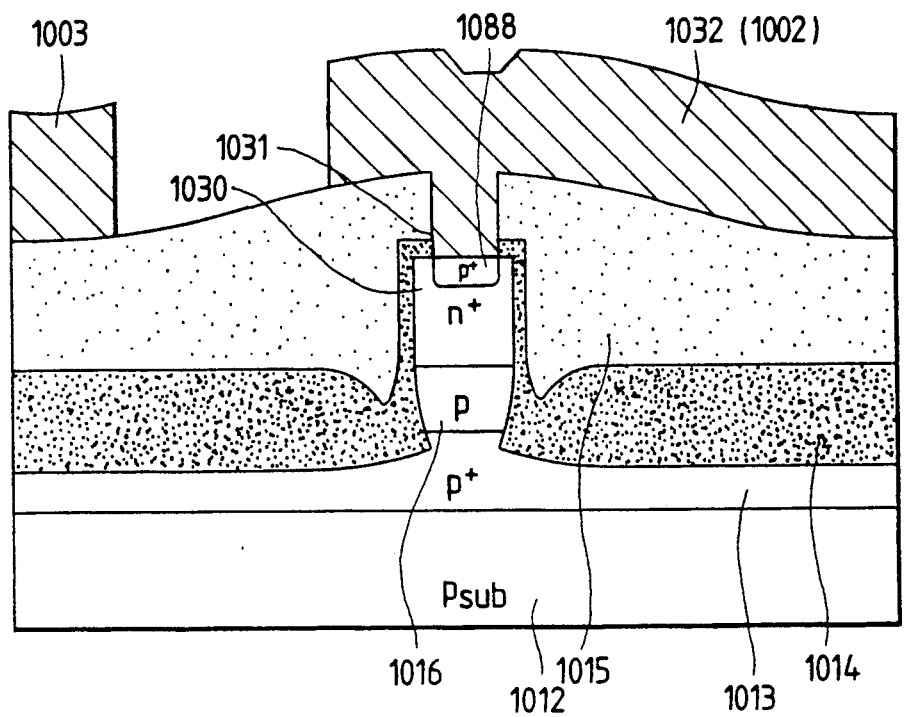
FIG. 41 is a schematic cross-sectional view of an eleventh embodiment of the semiconductor device according to the present invention.
Figure 42:
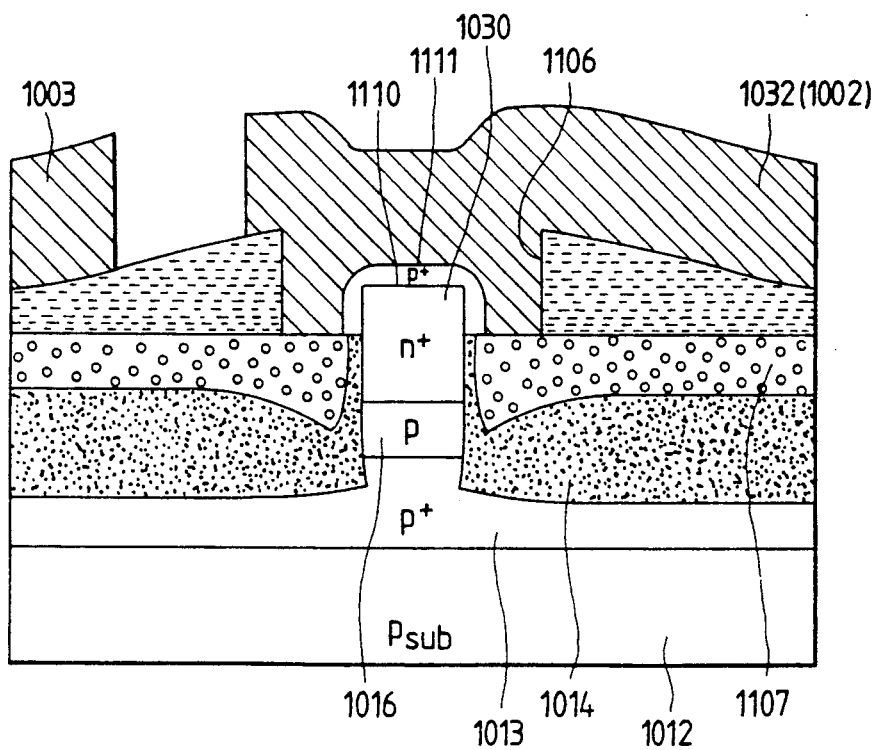
FIG. 42 is a schematic cross-sectional view of a twelfth embodiment of the semiconductor device according to the present invention.

An eleventh embodiment of the present invention will be described below with reference to FIG. 41. FIG. 41 is a cross-sectional view similar to FIG. 34. Parts which are the same as those shown in FIG. 41 are designated by the same reference numerals, and description thereof is omitted. The eleventh embodiment differs from the first embodiment in that a p+ layer 1088 is formed in the n+ layer by injecting p type ions, for example, boron ions using the contact hole formed on the n+ source layer 1030 and then conducting annealing, unlike the p+ layer selectively formed on the Si layer in the first embodiment. When the structure of this embodiment is used, the amount of leaking current in the pn junction reduces. Consequently, conduction and non-conduction modes are clarified, and higher S/N ratio can be obtained. Furthermore, a high resistance layer can be provided by forming an amorphous p+ layer in the n+ layer after ion injection so as to achieve non-conduction.

Twelfth Embodiment

The twelfth embodiment is the same as the fifth embodiment shown in FIG. 31 with the exception that a memory element of the source potion covers a projecting surface 1110 of the n+ layer 1030. A p+ semiconductor layer formed by selective deposition of LPCVD forms the memory element. In this embodiment, the source contact resistance can be further reduced, and high-speed reading out is achieved.

In the aforementioned embodiments, a conducted state and a non-conducted state are determined by breakdown and non-breakdown of the pn junction which is a semiconductor junction, and written signals can thus be read out at a high S/N ratio. Consequently, a highly reliable memory having a low error rate can be obtained. Furthermore, the use of a new transistor exhibiting a high driving capability in a memory cell provides a high-speed and high integration memory.

In other words, since the semiconductor layer is used as a memory element and data is recorded by either breakdown or non-breakdown of a pn junction, variations in the breakdown in the individual cells can be reduced compared with the case of an insulating film, and reliability can be improved.

In the present invention, any electrically dischargeable junction can be used as a memory element, such as a pn junction, an insulator/semiconductor junction, a metal/insulator/semiconductor junction, a PIN junction, a semiconductor/insulator/semiconductor junction, a PI junction, an IN junction, a Schottky junction or a heterojunction.

Having described the invention as related to the embodiments shown in the accompanying drawings, it is to be understood that the invention is not limited to these embodiments thereof and various changes and modifications may be made in terms of combinations or exchange of the individual element technologies.

In the aforementioned embodiments, a conducted state and a non-conducted state are determined by breakdown and non-breakdown of the memory element, and written signals can be read out at a high S/N ratio. Consequently, a highly reliable memory having a low error rate can be obtained. Furthermore, the use of a new transistor exhibiting a high driving capability in a memory cell provides a high-speed and high integration memory.

Description of Another Preferred Embodiments

In a preferred embodiment of the present invention, the semiconductor device includes a source region, a drain region, a channel region provided between the source region and the drain region, and a gate electrode provided on the channel region with a gate insulating film therebetween. The semiconductor device further includes a plurality of semiconductor structures each of which includes a semiconductor region provided in contact with the channel region and having the same conductivity type as that of the channel region and a higher impurity concentration than the channel region. The gate electrode has at least two opposing portions having a surface which crosses a joining surface between the channel region and the semiconductor region. The semiconductor device further includes first interconnections which are common to the gate electrodes of the plurality of semiconductor structures, a pn junction formed on the source regions of the plurality of semiconductor structures through a material of a different conductivity type from that of the source regions serving as memory elements, and second interconnections for connecting the plurality of semiconductor structures. A power source line is provided between the adjacent second interconnections.

Alternatively, the semiconductor device includes a source region, a drain region, a channel region provided between the source region and the drain region, and a gate electrode provided on the channel region with a gate insulating film therebetween. The semiconductor device further includes a plurality of semiconductor structures each of which includes a semiconductor region provided in contact with the channel region and having the same conductivity type as that of the channel region and a higher impurity concentration than the channel region. The gate electrode has at least two opposing portions having a surface which crosses a joining surface between the channel region and the semiconductor region. The semiconductor device further includes first interconnections which are common to the gate electrodes of the plurality of semiconductor structures, and second interconnections for connecting the plurality of semiconductor structures, said second interconnections being formed on the source regions of the plurality of semiconductor structures with an insulating film formed as memory elements therebetween. A power source line is provided between the adjacent second interconnections.

Figure 43A:
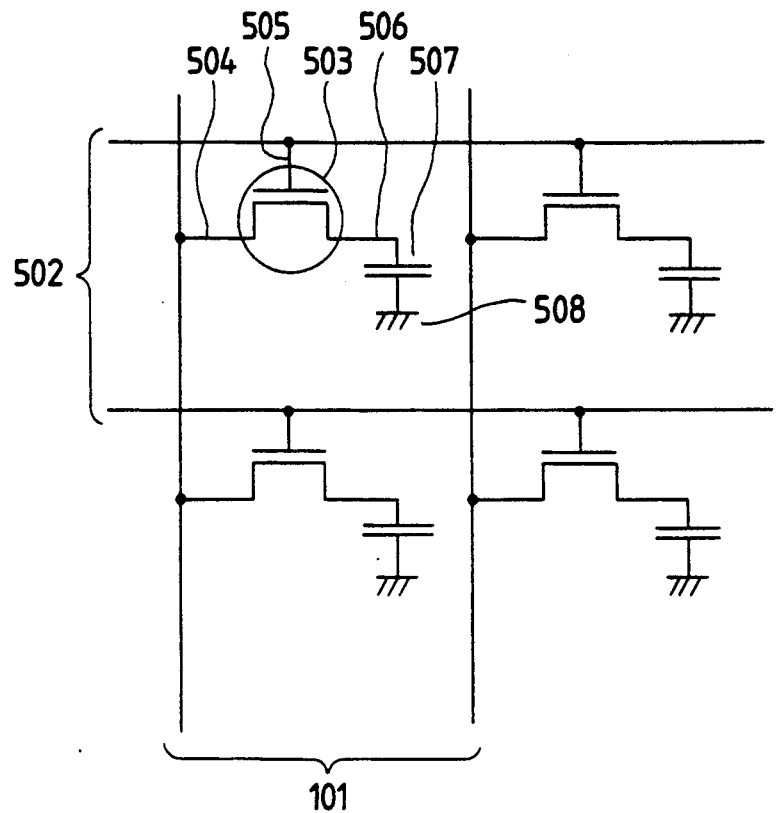
FIGS. 43A and 43B are circuit diagrams of a semiconductor memory device.
Figure 43B:
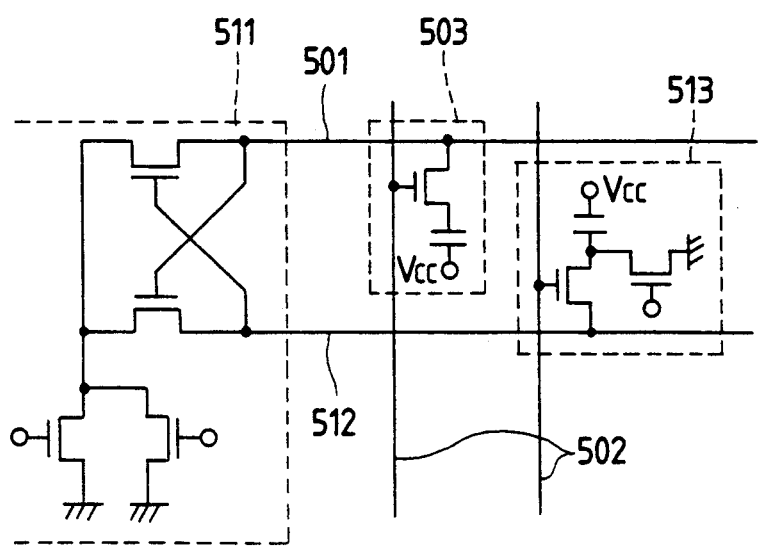

Dynamic RAM (DRAM) is known as the memory which is programmable by the user and is random accessible. FIGS. 43A and 43B illustrate this type of memory cell. In FIGS. 43A and 43B, reference numeral 501 denotes a bit line; 502, a word line; 503, a MOS transistor disposed in a memory cell having a source 504 connected to the bit line 501, a gate connected to the word line 502, and a drain connected to a capacitor 507; and a 508, a field plate of the capacity connected to an earth.

A memory cell is selected by selection and drive of a word line, and cell data is discharged on a bit line. This fine signal is amplified by an amplifier. The output of the amplifier is sent to an output buffer amplifier.

However, since the fine signal charge is read out on the bit line having a large capacity so that the sense amplifier amplifies a slight change in the electric charge, noise margin is narrow and malfunction readily occurs by a small level of noise. To overcome this problem, it has been proposed to provide a dummy bit line, such as that shown in FIG. 43. The memory cell 503 is connected to the bit line 501, while a dummy memory cell 513 is connected to a dummy bit line 512.

When the data of the memory cell 503 and the signal level on the dummy cell 513 are differential amplified by a sense amplifier 511 by the selection of a word line 502, noises generated in the intersection between the word line 502 and the bit line cancel each other.

Furthermore, high intergration and high-speed operation of a memory requires a transistor which is fine and which has a high current driving capability.

Although the noise level is reduced by the provision of the dummy cells, the memory cell is basically of the type in which a fine voltage read out from a small capacity to a large capacity is detected. Hence, as the number of bits increases and the cell size reduces, the capacity of the bit line further increases and the capacity of the memory cell further reduces. Increase in the capacity of the memory cell is achieved by reduction in the thickness of an insulator of a capacity. However, the insulator is currently as thin as 100 Å or below, and further reduction in the thickness of the insulator affects the tunnel current and dielectric voltage, and deteriorates reliability. Reduction in the noise level may also be achieved by provision of a shield line for preventing cross talk. However, this increases the capacity of the bit line, reduces the signal level, and thus does not contribute to improvement of the S/N ratio.

In the aforementioned conventional dynamic RAM memory, there is the possibility that sufficient noise margin cannot be obtained when the fine processing and increase in the number of bits are achieved.

In each of the aforementioned conventional memories, the transistor suffers from the drawbacks in that the amount of leaking current is large, that variations in the transistors is large, and that the off characteristics of the transistor are degraded and the operation thereof is unstable.

Thus, in each of the embodiments which will be described below, a semiconductor device includes a source region, a drain region, a channel region provided between the source region and the drain region, and a gate electrode provided on the channel region with a gate insulating film therebetween. The memory cell of the semiconductor device employs a transistor which includes a semiconductor region provided in contact with the channel region and having the same conductivity type as that of the channel region and a higher impurity concentration than the channel region. The gate electrode has at least two opposing portions having a surface which crosses a joining surface between the channel region and the semiconductor region. The memory cell includes a word line which is the gate electrode of the transistor, and a memory cell formed between the source layer of the transistor and the bit line. A power source line is provided between the adjacent bit lines.

According to the embodiments which will be described below, it is possible to provide a semiconductor memory device in which noise level can be greatly reduced by the provision of the power source interconnection between the adjacent bit lines and which has a large noise margin.

Basically, it is possible to remove the dummy bit described in connection with FIGS. 43A and 43B. In that case, the driving method is simplified.

Thirteenth Embodiment

A thirteenth embodiment will be described below. In this embodiment, since the structure of the memory cell is the same as that shown in FIGS. 11 through 14, detailed description thereof is omitted. The difference between this embodiment and the embodiment shown in FIGS. 11 through 14 is illustrated in FIG. 44.

The thirteenth embodiment to which the present invention is applied is a memory cell in which bit is written by breakdown and non-breakdown of an insulator.

Figure 44:
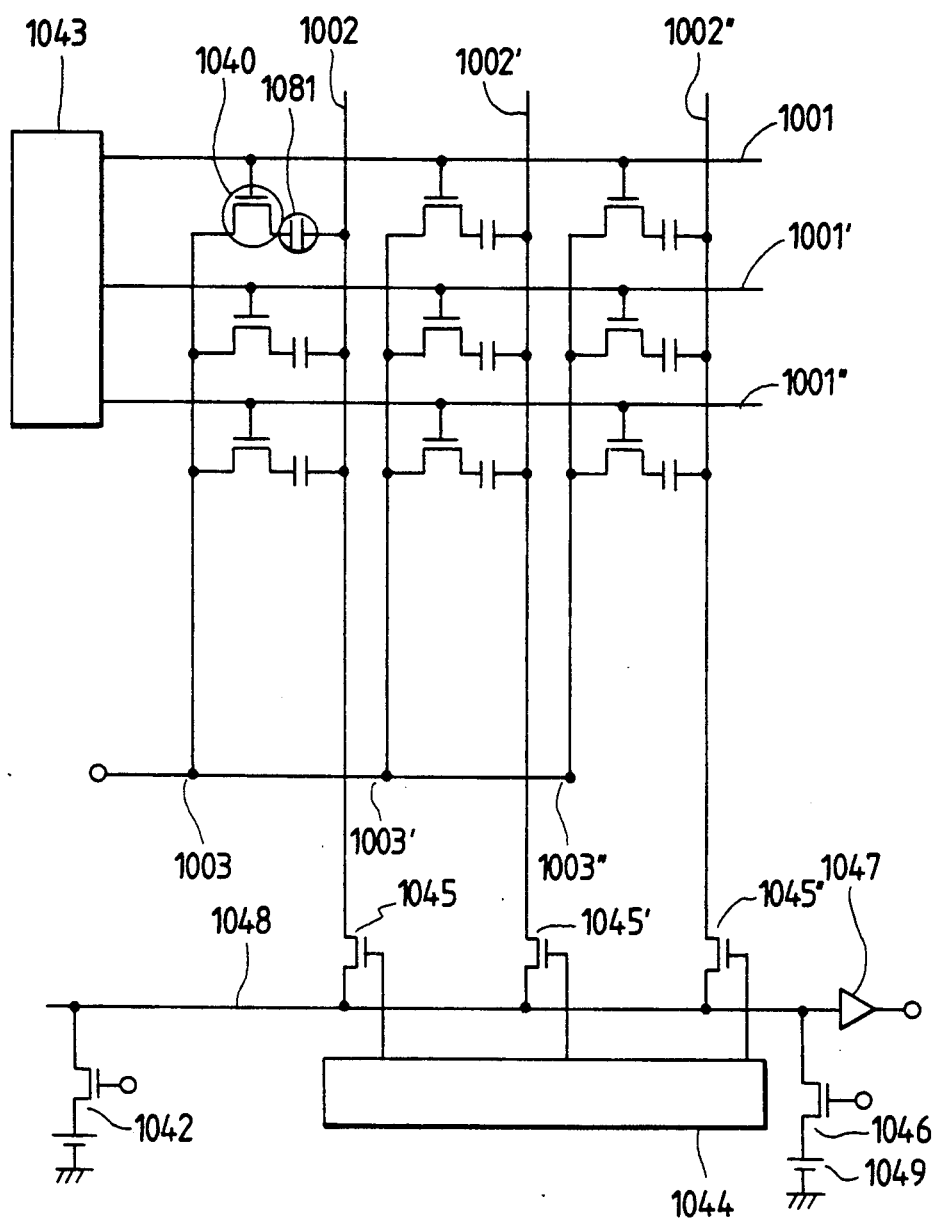
FIG. 44 is a circuit diagram of a semiconductor memory device according to a third embodiment of the present invention.

FIG. 44 is a circuit diagram illustrating the layout of the memory cell in the thirteenth embodiment. Parts which are the same as those shown in FIG. 15 are designated by the same reference numerals, description thereof being omitted. An insulator film 1081 is a memory element provided in each of the memory cells.

The activation method and storing method of the memory device according to the present invention will be described below. Reference 1001 through 1001''' denote word lines; 1002 through 1002'', bit lines; and 1003 through 1003'', power source lines. Each of the memory cells has a transistor 1040 which is fine and which has a high current driving ability, and a capacitor 1081 with an insulating layer which is formed on the source layer of the transistor 1040 as an memory element. The peripheral circuits of the memory are a switch 1042 for pre-charging the bit lines, a word line voltage setting circuit 1043, a bit line sequentially selecting signal generating circuit 1044, bit line selecting switches 1045 through 1045'', a switch 1046 for resetting a bit line reading out line 1048, and an amplifier 1047.

First, the writing operation will be explained.

(1) Writing operation part 1: (pre-charge of the bit lines).

The voltage $V_{DD}$ is set on the bit lines by turning on the switch 1042. Consequently, no potential difference exists between the power source lines and the bit lines. Thus, no matter what voltage is applied to the word lines, no potential is generated or no current flows between the source and the drain, and breakdown of the memory element 1041 thus does not occur. The pre-charge voltage applied to the bit lines may not be equal to the power source voltage $V_{DD}$. When the pre-charge voltage is not equal to the power source voltage, a voltage which does not generate breakdown of the pn junction region and hence conduction is set. A voltage between 1 and 5 v is applied as $V_{DD}$.

(2) Writing operation part 2: (discharge of the word lines).

The voltage on all of the word lines is fixed to a first grounding voltage $V_{GND1}$. It is fixed to, for example, 0 v. This prevents mixture of a signal into the adjacent word lines of the word line on which writing is conducted due to generation of cross-talk.

(3) Writing operation part 3: (selection of a writing word line).

Assuming that the present writing bit represents the cell on the second line and second row with the upper and left cell as an origin, the writing bit is present on the word line 1001'. Hence, the potential on the word line 1001' is set to $V_G$ which is expressed by:

$$V_{GND1} < V_G < V_{GB} \qquad \text{Equation (2)}$$

where $V_{GB}$ is a gate insulating film breakdown voltage.

(4) Writing operation part 4: (selection of a bit line).

The voltage on the bit line corresponding to the writing cell present on the selected line is set to the grounded voltage. Since all the transistors present on the selected line have been turned on, application of the grounded voltage causes a high voltage to be applied to the pn junction, causing breakdown of the pn junction and hence conduction. At that time, since the power source interconnection is disposed between the adjacent bit lines, breakdown of the cells on the adjacent bit lines due to cross talk can be eliminated, thus eliminating the provision of the peripheral circuits which would be required to fix the voltage of the adjacent bit lines. When the writing operation is completed, a current flows between the bit line and the word line. Thus, it is desirable that selection of the bit lines be conducted line by line. However, it is also possible to conduct writing on a plurality of bit lines at the same time.

Next, the reading out operation will be explained. This operation consists of following four major operations.

(1) Reading out operation part 1: (pre-charge of the bit lines).

Pre-charge of the bit lines is conducted in the same manner as that of the writing operation so that the reading out operation does not perform writing on the bits on which writing has not been conducted. The voltage applied for pre-charging is equal to the power source voltage $V_{DD}$.

(2) Reading out operation part 2 (discharge of the word lines).

The voltage on all of the word lines is fixed to second grounded voltage $V_{GND2}$. The voltage $V_{GND2}$ and the first grounded voltage $V_{GND1}$ has the following relation.

$$V_{GND1} < V_{GND2} \qquad \text{Equation (3)}$$

(3) Reading out operation part 3 (selection of a reading line).

The voltage on the word line on which the reading out operation is to be conducted is fixed to $V_G$ defined by Equation (2) to turn on the transistors present on that line.

(4) Reading out operation part 4 (resetting of the bit line reading out line).

The bit line reading out line 1048 is reset by the switch 1046. The reset voltage, determined by the power source connected to the switch 1046, is $V_{GND2}$. Thereafter, the switch 1046 is turned off to make the bit line reading out line floating.

(5) Reading out operation part 5 (selection of a bit line).

The gate of the selected bit selection switch is raised to the logical high level by the bit line sequentially selecting signal generating circuit 1044 to turn on the switch and thereby connect it to the bit line reading out line. If the selected cell is not present, the voltage on the reading out line converges to the value expressed by $$\frac{C_{BIT} \cdot V_{DD} + C_{OUT} \cdot V_{GND2}}{C_{BIT} + C_{OUT}}$$

where $C_{BIT}$ is the capacity of the bit line and $C_{OUT}$ is the capacity of the reading out line.

If the selected cell is present and the memory element is in a conducting state, the reading out line is connected to the power source $V_{DD}$ through the transistor and the voltage on the reading out line thus converges to $V_{DD}$. These two voltage states are utilized to determine whether the written cell (bit) is present or not. The voltage on the reading out line is detected by the amplifier 1047. In the reading out operation which is conducted in the manner described above, in the case of a written state, the time it takes for the voltage on the reading out line to converge to $V_{DD}$ determines the reading out speed. The larger the capacity of the memory, the larger the capacity of the bit line and bit line reading out line. Thus, how these large capacities are driven is the key to an increase in the reading out speed. The aforementioned fine transistor structure having a high driving ability is therefore very effective in this sense.

In this embodiment, two types of grounded voltages are used so that the reading out operation does not cause breakdown of the memory element. That is, a difference in the voltages applied to the two ends of the memory element in the reading out operation is lower than that in the writing operation.

The manufacturing method of this embodiment is the same as that shown in FIGS. 14 through 18, and description thereof is omitted.

The capacitor having the electrically breakable insulator which is provided in each of the memory cells as the memory element may be replaced by an pn junction which employs, in place of the insulator, a semiconductor film having the opposite conductivity type as that of the major electrode region.

Figure 45:
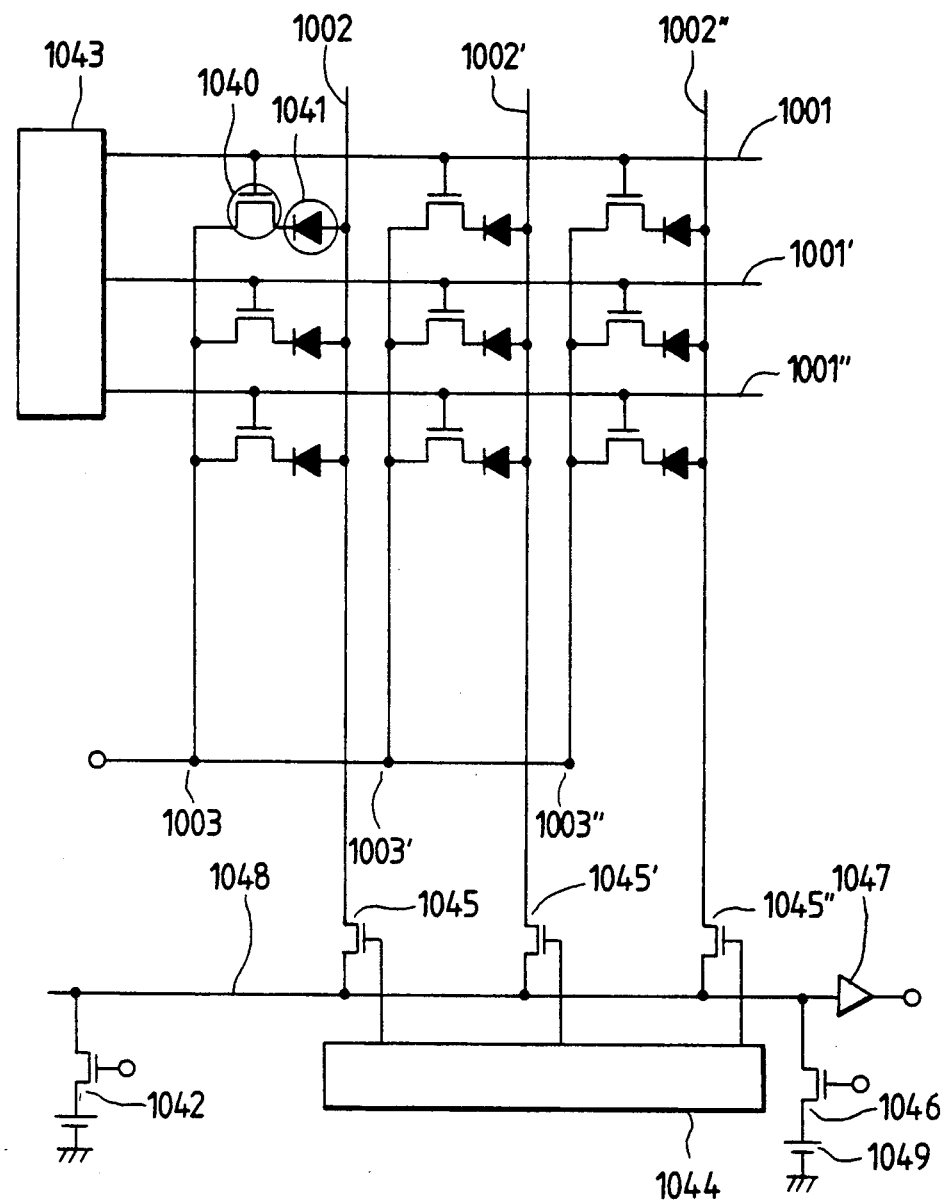
FIG. 45 is a circuit diagram of another embodiment of the semiconductor memory device according to the present invention.

In that case, the basic structure of the memory cell is the same with the exception that the semiconductor film is used in place of the insulating film. The circuit diagram of the semiconductor memory which employs a pn junction as a memory element is shown in FIG. 45. The activation method is the same.

Fourteenth Embodiment

Figure 46:
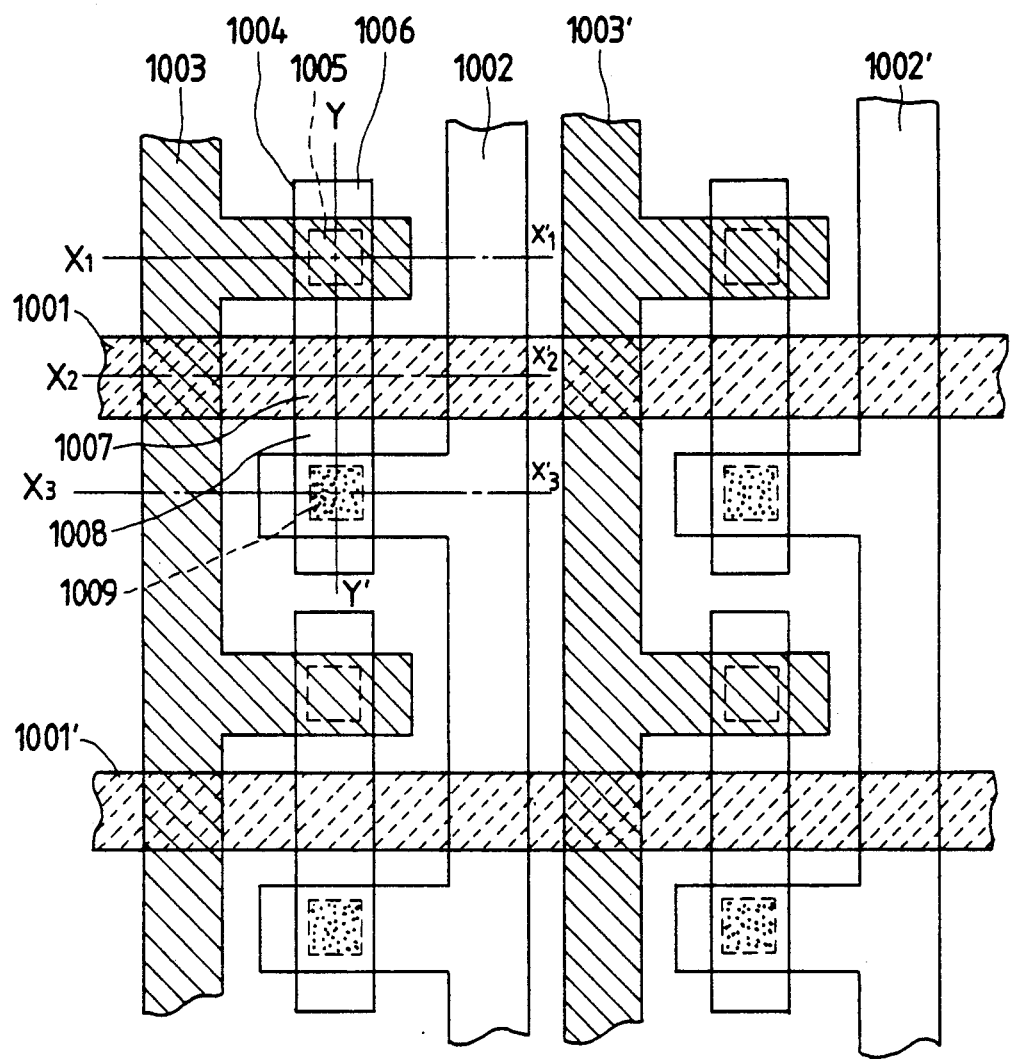
FIG. 46 is a schematic plan view of a fourteenth embodiment of the semiconductor memory device according to the present invention.
Figure 47:
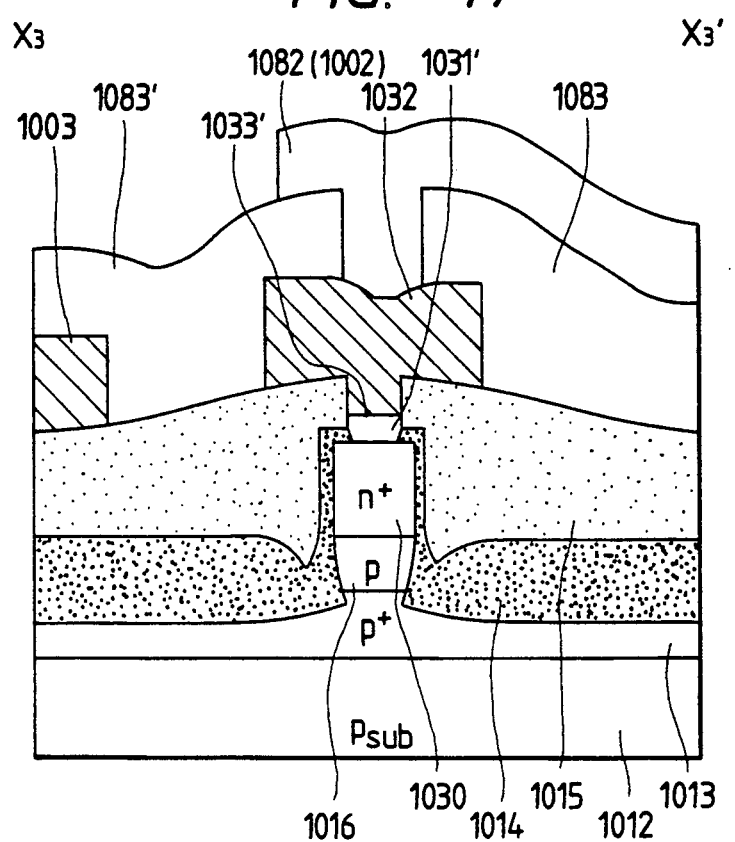
FIG. 47 is a schematic cross-sectional view of the fourteenth embodiment of the present invention.
Figure 48:
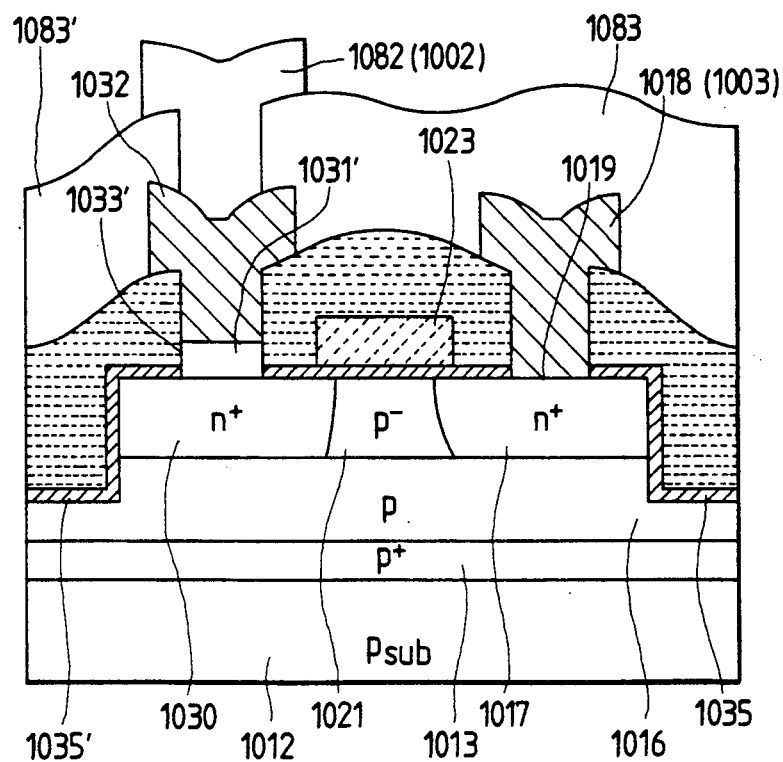
FIG. 48 is a schematic cross-sectional view of the fourteenth embodiment of the present invention.

A fourteenth embodiment of the present invention will be described below with reference to FIG. 46 through 48. FIG. 46 is a plan view of the fourteenth embodiment. FIG. 47 is a section taken along line $X_3$—$X_3'$ of FIG. 46. FIG. 48 is a cross-sectional view of the fourteenth embodiment.

In this embodiment, the power source lines 1003 and 1003' are formed of a first interconnection layer 1018, and the bit lines 1002 and 1002' are formed of a second interconnection layer 1082. Reference numerals 1083 and 1083' denote passivation films. In this embodiment, the area per cell can be reduced than the aforementioned embodiment and high intergration can thus be achieved to cause the interconnection layer for the power source lines and that for the bit lines are provided separately.

In this embodiment, the bit lines and the power source lines may be formed of the first and second interconnection layers, respectively. Furthermore, a p type semiconductor film may be employed in place of the insulator film to form the memory element.

Fifteenth Embodiment

Figure 50:
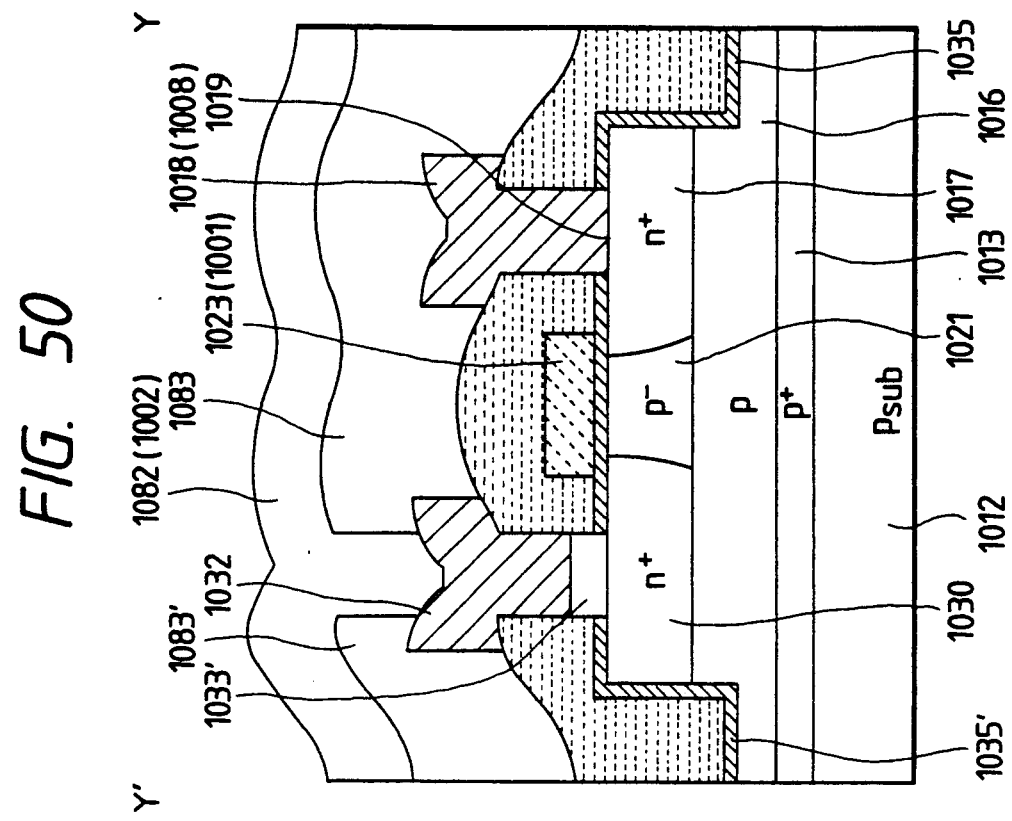
FIG. 50 is a schematic cross-sectional view of the fifteenth embodiment of the present invention.
Figure 49:
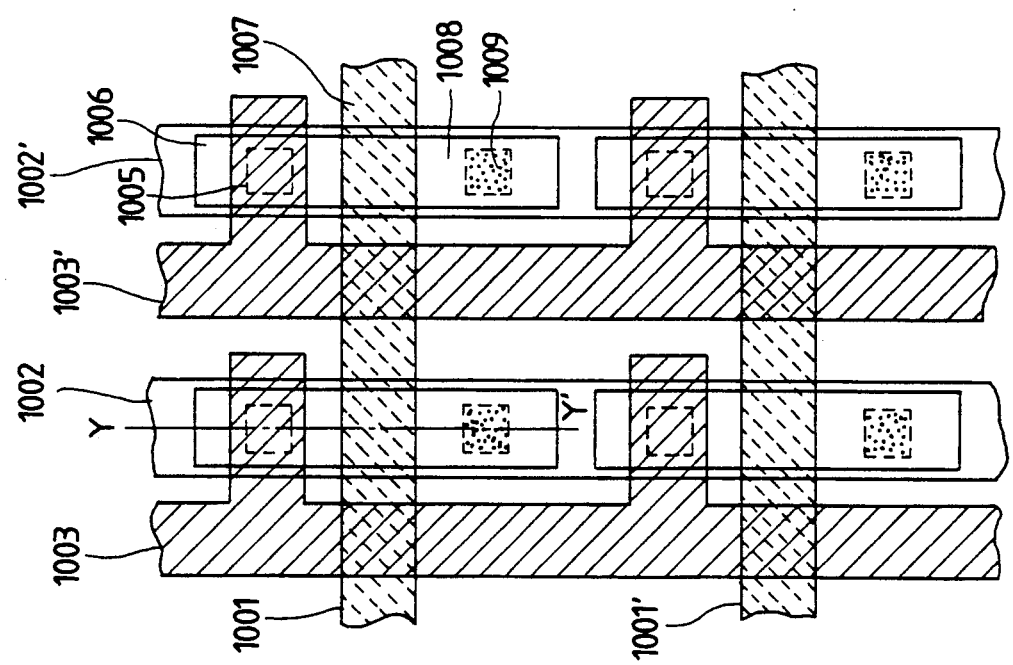
FIG. 49 is a schematic plan view of a fifteenth embodiment of the semiconductor memory device according to the present invention.

A fifteenth embodiment of the present invention will be described below with reference to FIGS. 49 and 50. FIG. 49 is a plan view of the fifteenth embodiment, and FIG. 50 is a section taken along line Y—Y' of FIG. 49.

In this embodiment, the power source line 1003 and 1003' are formed of a first interconnection line 1018, and the bit lines 1002 and 1002' are formed of a second interconnection layer 1082 immediately above the memory cell. In this way, higher integration can be achieved.

In this embodiment, the bitlines and the power source lines may be formed of the first and second interconnection layers, respectively. Furthermore, a p type semiconductor film may be employed in place of the insulator film to form the memory element.

Sixteenth Embodiment

Figure 52:
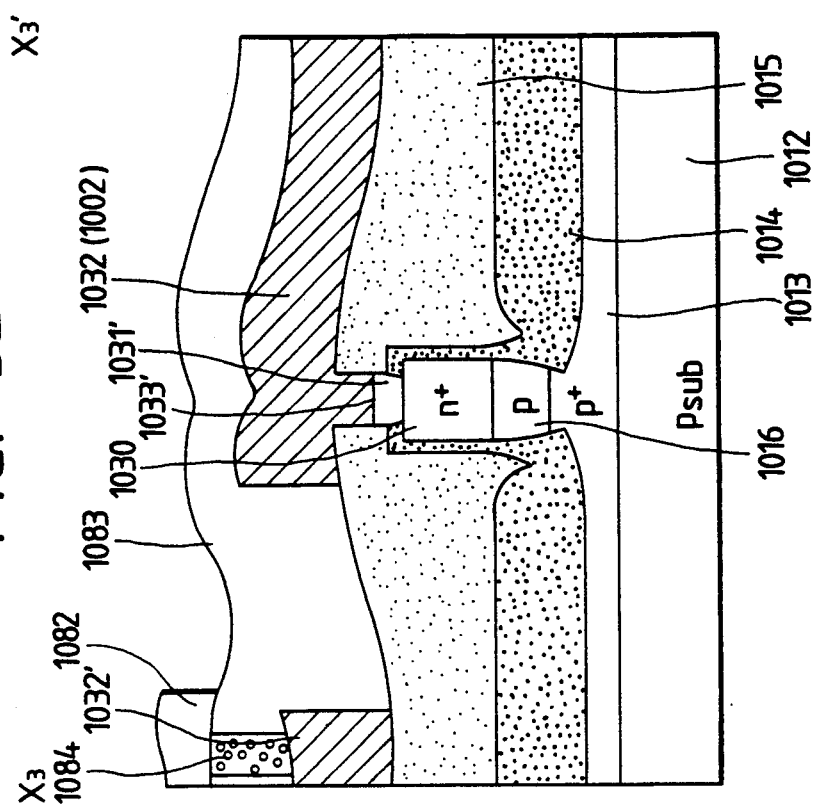
FIG. 52 is a schematic cross-sectional view taken along line $X_3X_3'$ of FIG. 51.
Figure 51:
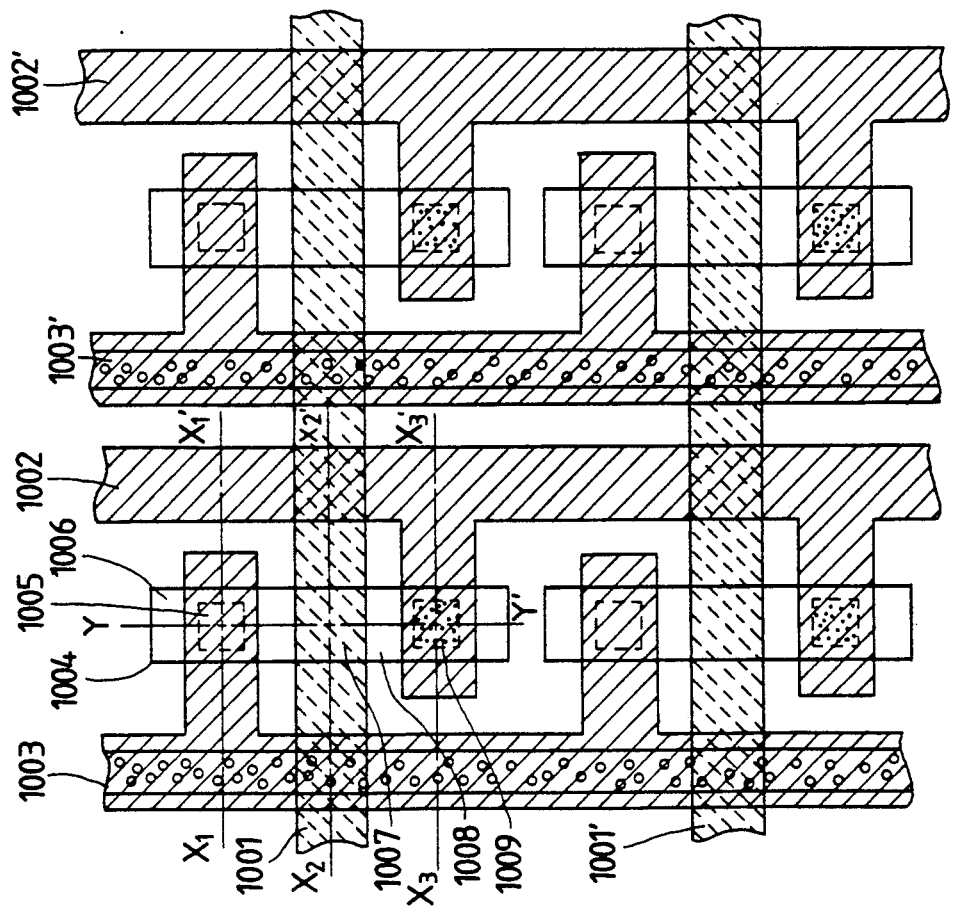
FIG. 51 is a schematic plan view of a sixteenth embodiment of the semiconductor device according to the present invention.

A sixteenth embodiment of the present invention will be described below with reference to FIGS. 51 and 52. FIG. 51 is a plan view of the sixteen embodiment, and FIG. 52 is a section taken along line $X_3$—$X_3'$ of FIG. 51.

In this embodiment, the power source lines 1003 and 1003' are formed of a first interconnection layer 1032' and a second interconnection layer 1082 which are connected to each other through a contact hole formed parallel to the interconnections. Formation of the power source line by the double interconnection layers allows cross talk between the adjacent bit lines to be more reliably prevented.

In this embodiment, a p type semiconductor film may be employed in place of the insulator to form a memory cell.

Seventeenth Embodiment

Figure 53:
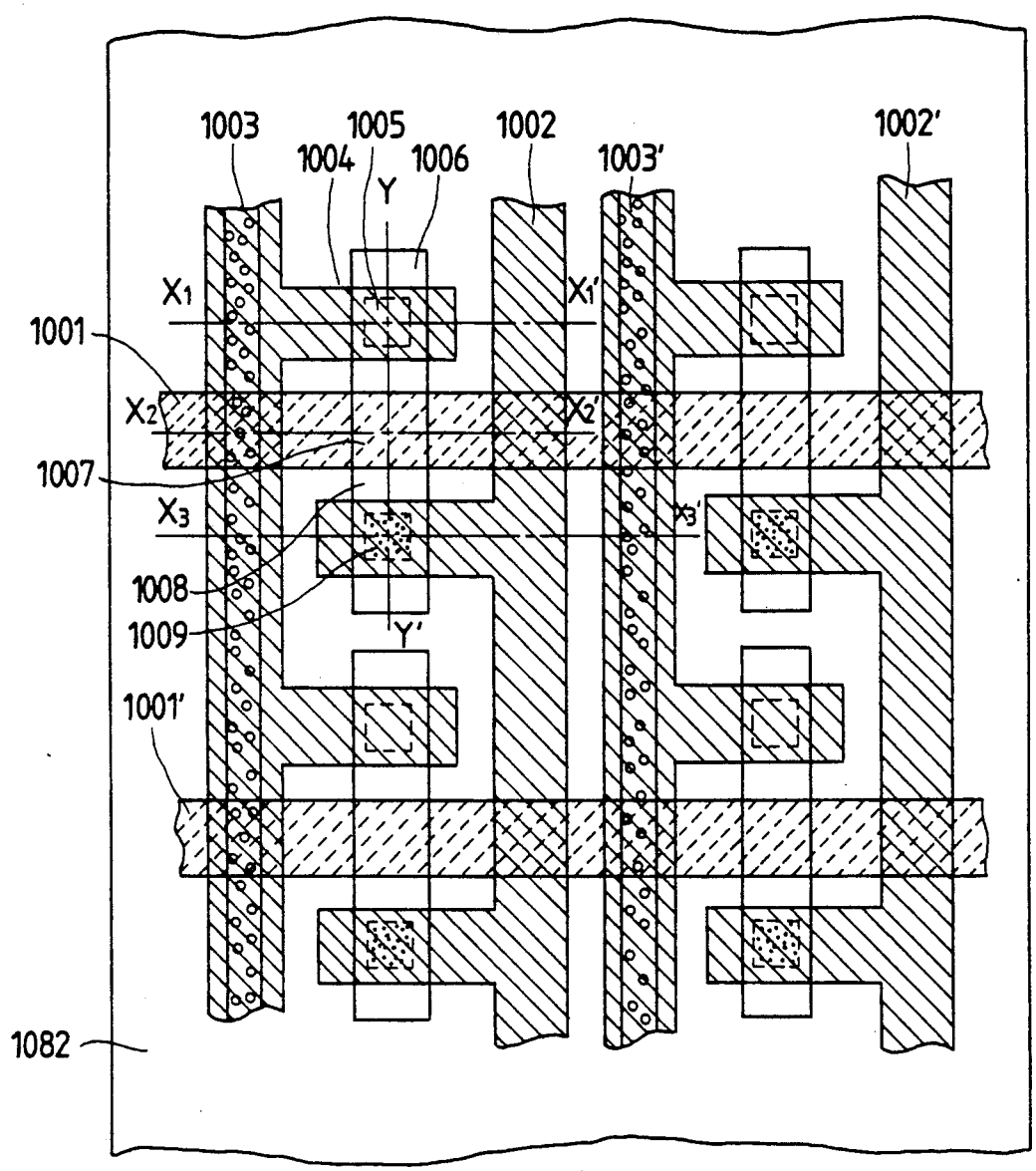
FIG. 53 is a schematic plan view of a seventeenth embodiment of the semiconductor device according to the present invention.
Figure 54:
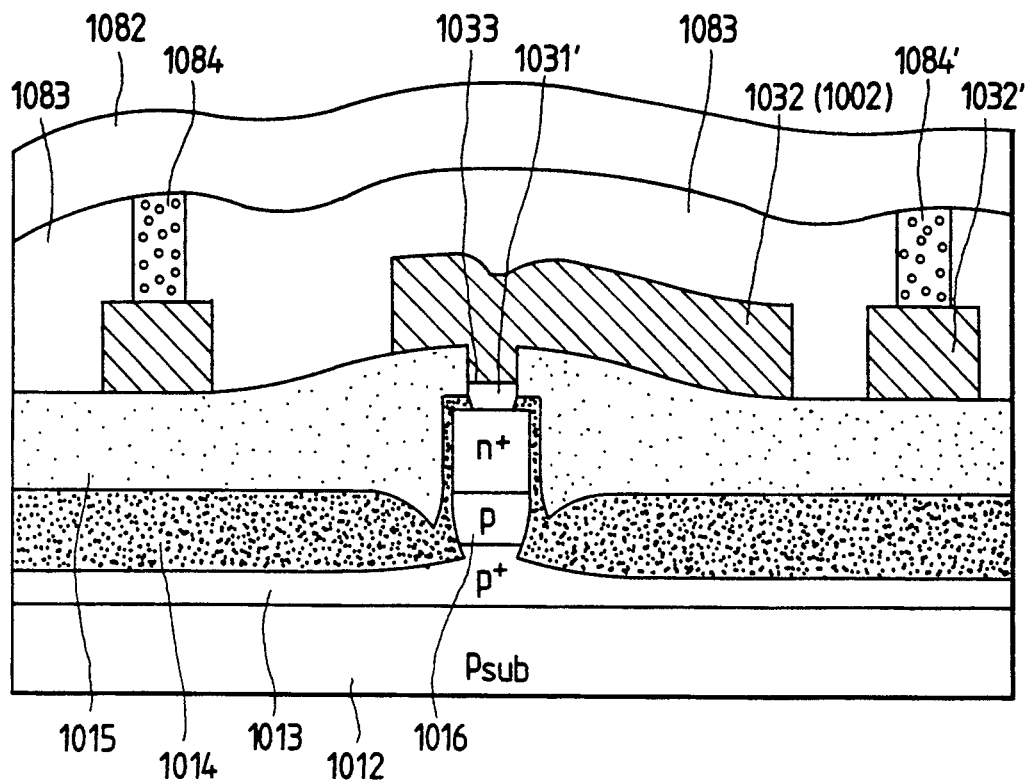
FIG. 54 is a schematic cross-sectional view taken along line $X_3X_3'$ of FIG. 53.

A seventeenth embodiment of the present invention will be described below with reference to FIGS. 53 and 54. FIG. 53 is a plan view of the seventh embodiment, and FIG. 54 is a section taken along line $X_3$—$X_3'$ of FIG. 53.

In this embodiment, the adjacent power source lines 1003 and 1003' are connected to each other by a second interconnection layer 1082., and the line lines 1002 and 1002' are covered by the power source lines. In this way, it is possible to prevent cross talk between the adjacent the bit lines more reliably.

In this embodiment, a p type semiconductor may be employed in place of the insulator to form a memory cell.

As will be understood from the foregoing description, in the semiconductor memory device of the aforementioned embodiments in which a conducted state and a non-conducted state are respectively achieved by breakdown and non-breakdown by the memory element, since cross talk between the adjacent bit lines is more reliably prevented, a highly reliable memory of a low error rate can be provided.

Eighteenth Embodiment

The embodiment which will be described below is constructed such that a barrier layer is provided between the insulator constituting the memory element and a major electrode region provided below the insulator.

Any material can be used to form the barrier layer, so long as it can prevent reaction between the electrode provided above the insulator and the major electrode region. Practically, a material selected from TiN, Ti and W is preferably employed.

In this embodiment, it is possible to prevent generation of short-circuiting or current leakage between the major electrode region and the channel region due to reaction between the electrode and major electrode region which would occur after breakdown of the insulator (the writing operation).

Figure 55:
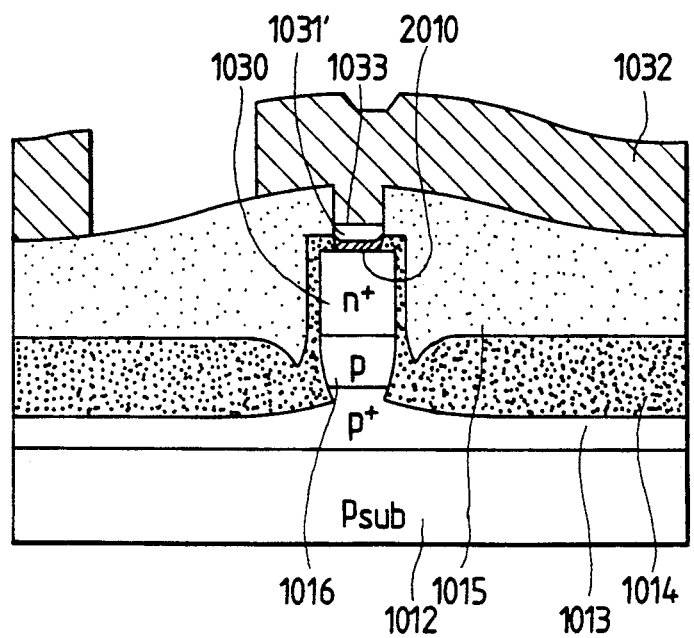
FIG. 55 is a schematic cross-sectional view of an eighteenth embodiment of the semiconductor memory device according to the present invention.
Figure 56:
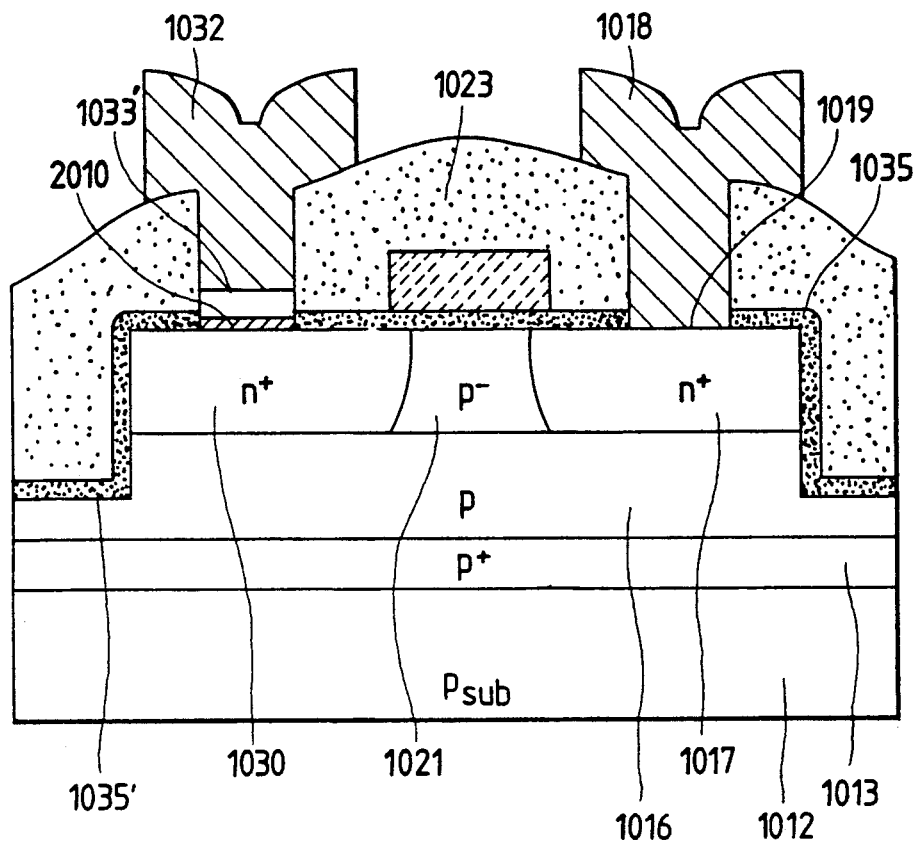
FIG. 56 is a schematic cross-sectional view of the eighteenth embodiment of the present invention.
Figure 57:
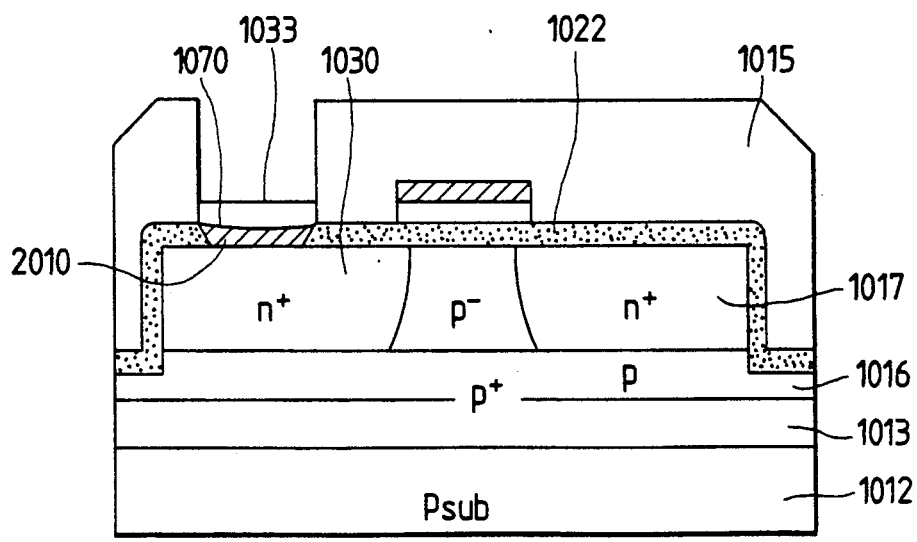
FIG. 57 is a schematic cross-sectional view of the eighteenth embodiment of the present invention.
Figure 58:
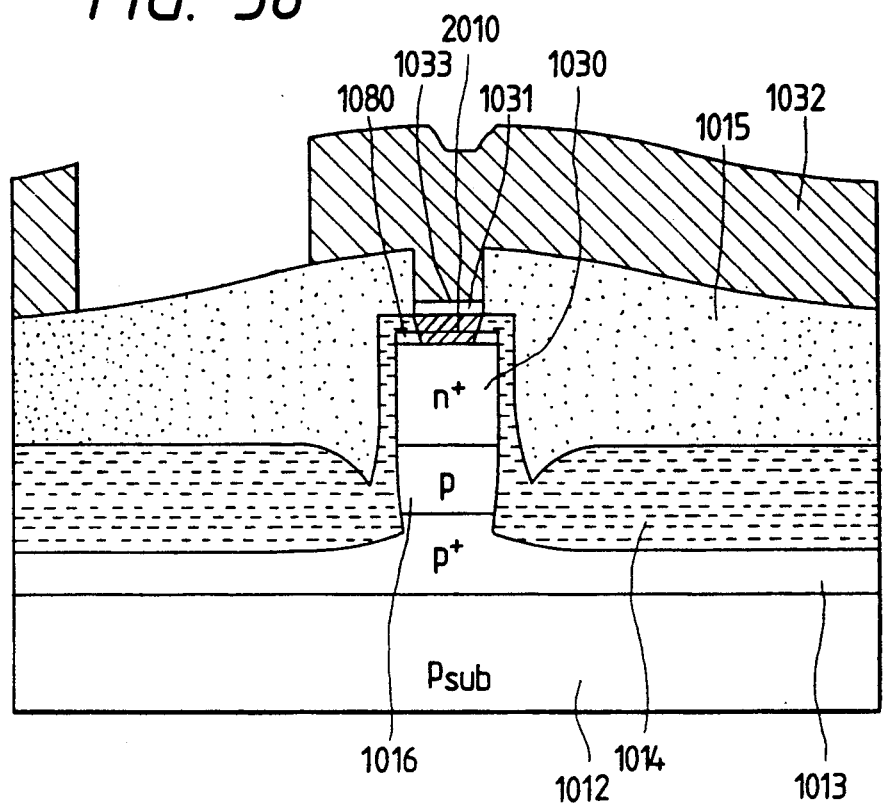
FIG. 58 is a schematic cross-sectional view of the eighteenth embodiment of the present invention.
Figure 59:
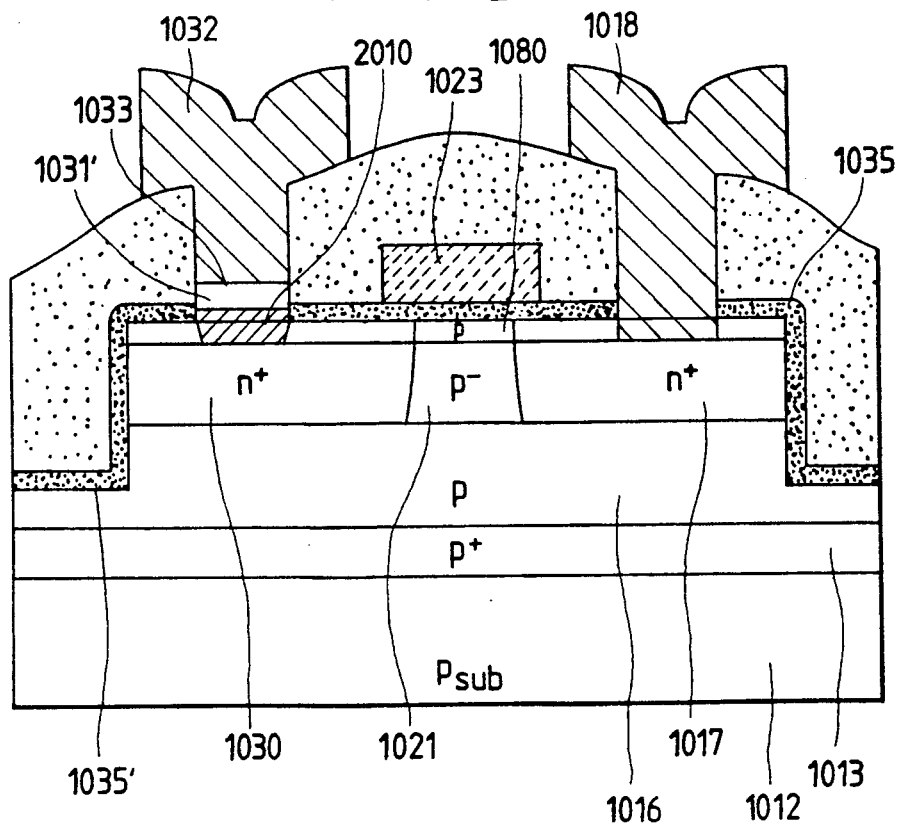
FIG. 59 is a schematic cross-sectional view of the eighteenth embodiment of the present invention.
Figure 60:
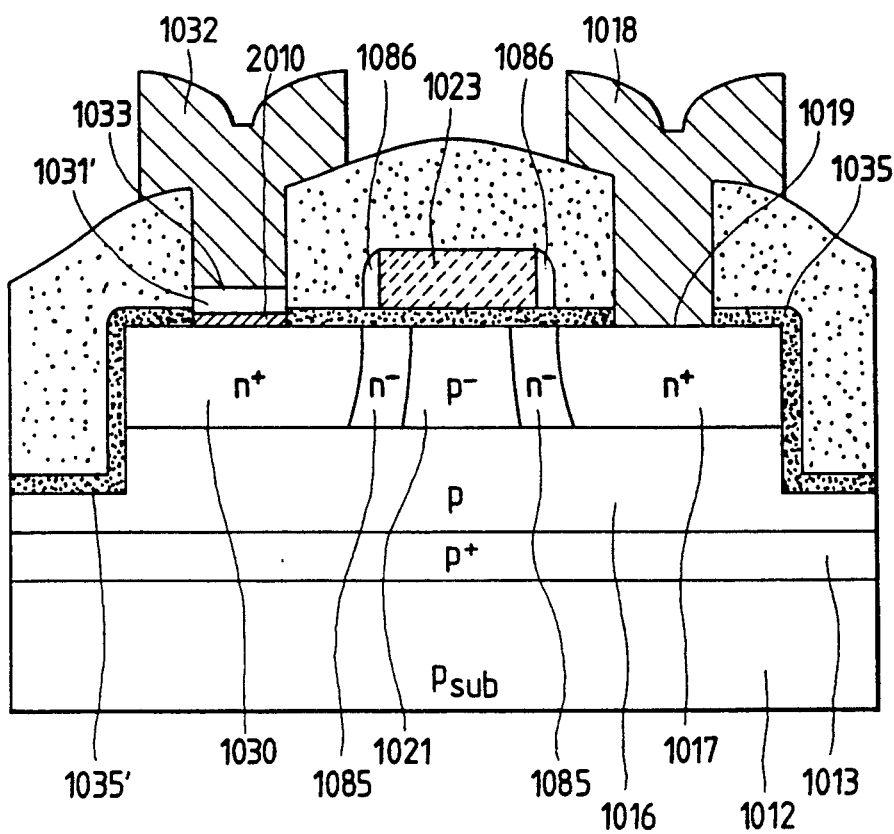
FIG. 60 is a schematic cross-sectional view of the eighteenth embodiment of the present invention.
Figure 61:
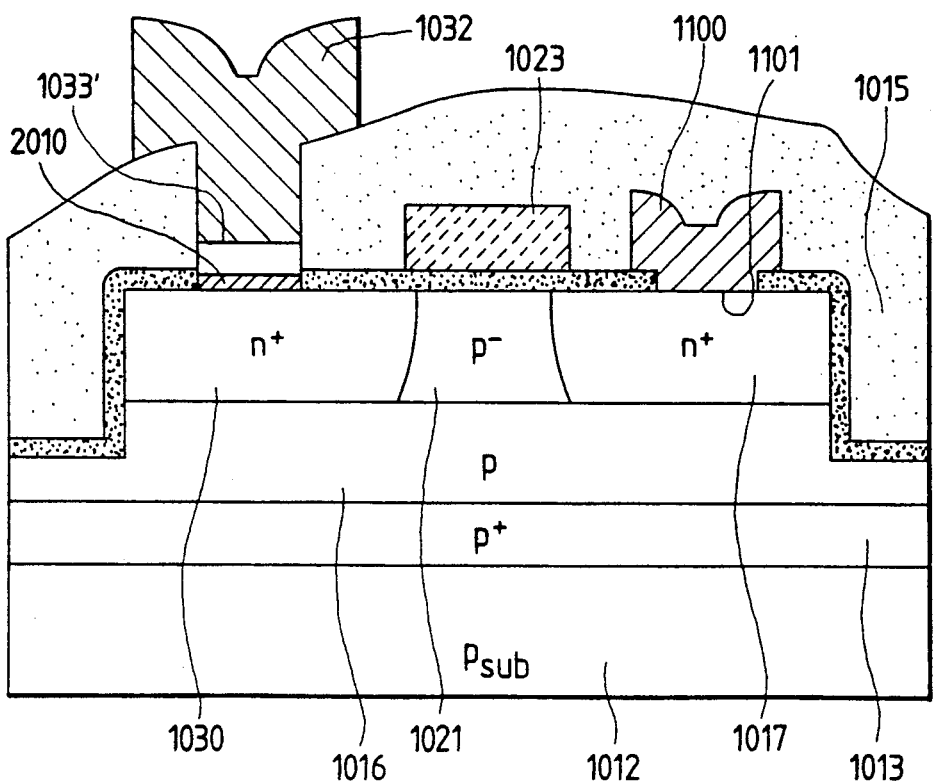
FIG. 61 is a schematic cross-sectional view of the eighteenth embodiment of the present invention.
Figure 62:
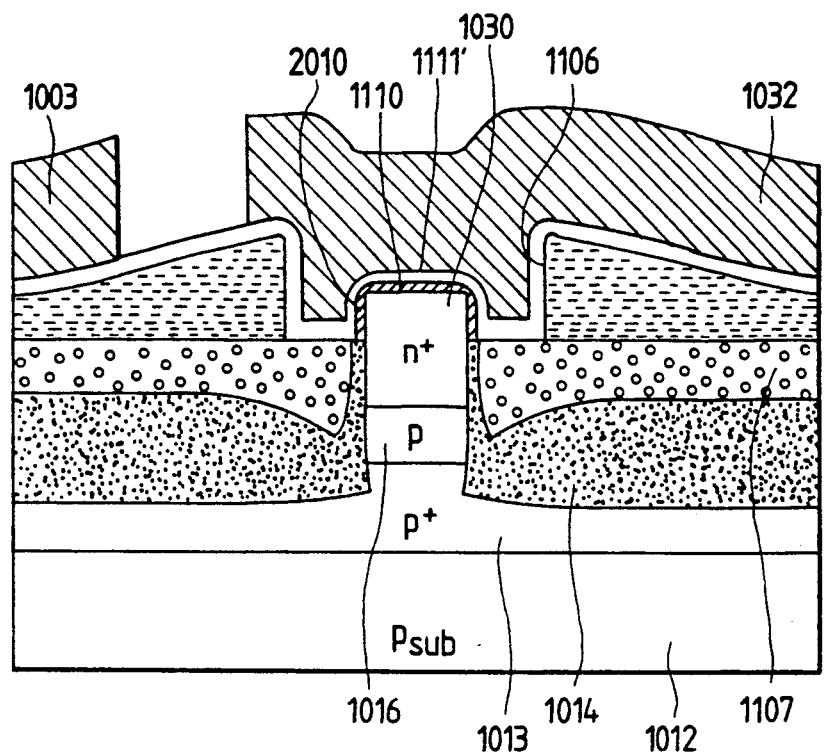
FIG. 62 is a schematic cross-sectional view of the eighteenth embodiment of the present invention.

Practically, the eighteenth embodiment includes the structure shown FIGS. 55 and 56 which is an improvement over the structure shown in FIG. 13 and 14, the structure shown in FIG. 57 which is an improvement over the structure shown in FIG. 20, the structure shown in FIG. 58 and 59 which is an improvement over the structure shown in FIGS. 23 and 24, the structure shown in FIG. 60 which is an improvement over the structure shown in FIG. 25, the structure shown in FIG. 61 which is an improvement over the structure shown in FIG. 28, and the structure shown in FIG. 62 which is an improvement over the structure shown in FIG. 31. In FIGS. 55 through 62, reference character 2010 denotes a barrier layer.

Nineteenth Embodiment

Figure 63:
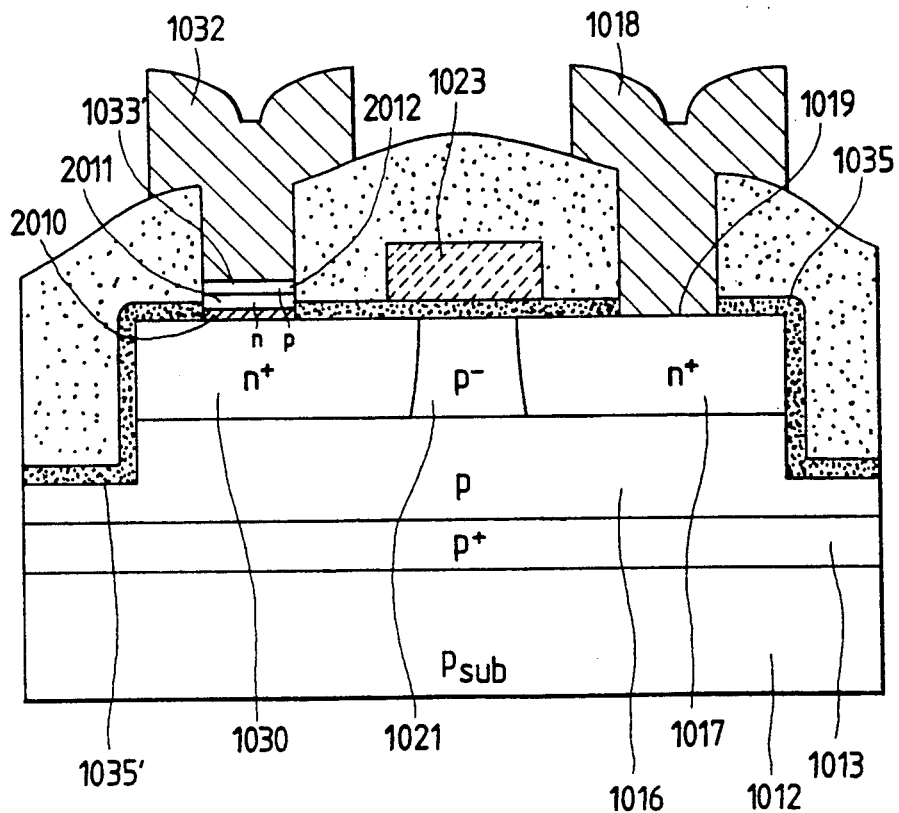
FIG. 63 is a schematic cross-sectional view of a nineteenth embodiment of the semiconductor memory device according to the present invention.

FIG. 63 illustrates a PN junction breakdown type memory device to which the technique of the formation of a barrier layer is applied.

In FIG. 63, reference numeral denotes a barrier layer; 2011, a semiconductor thin film made of a semiconductor having the same conductivity type as that of the major electrode region 1030; and 2012, a semiconductor thin film having a different conductivity type as that of the semiconductor film 2011.

The thin films 2011 and 2012 are made of a phosphorus doped polycrystalline Si and a boron doped polycrystalline Si, respectively.

In this embodiment, since the memory element is formed separately from the transistor, the transistor is not affected by breakdown of the junction.

As will be understood from the foregoing description, it is possible according to the present invention to provide a fine memory cell and hence a semiconductor memory device which has a low power consumption and which enables a high-speed activation. Furthermore, the memory cell has a simple layout and hence has a smaller area. Furthermore, it it is possible to provide a memory cell which has a high driving capability and excellent switching characteristics.

What is claimed is:

1. A semiconductor memory device comprising:
   an insulated gate transistor including a plurality of main electrode regions provided along a major surface of a substrate and a channel region provided between said plurality of main electrode regions, and a gate electrode provided on said channel region with a gate insulator therebetween, said gate electrode having at least two opposing portions that sandwich said channel region therebetween; and
   an electrically breakable memory element provided on one of said main electrode regions,
   wherein a doped semiconductor region is provided between said opposing portions beneath said channel region, said doped semiconductor region having a same conductivity type as said channel region and an impurity concentration higher than that of said channel region.

2. A semiconductor memory device according to claim 1, wherein said memory element has a semiconductor layer, and wherein writing is performed by breaking a junction between said semiconductor layer and another layer adjoining thereto.

3. A semiconductor memory device according to claim 1, wherein said gate electrode and said doped semiconductor region surround at least four surfaces of said channel region which run parallel to a direction in which carriers are mobilized.

4. A semiconductor memory device according to claim 3, further comprising a second semiconductor region provided on the surface of said channel which is remote from said high impurity concentration semiconductor region and having the same conductivity type as that of said channel region and a higher impurity concentration than said channel region.

5. A semiconductor memory device according to claim 1, further comprising a third semiconductor region provided between said main electrode regions and said channel region, said third semiconductor region having the same conductivity type as that of said main electrode regions and a lower impurity concentration than said main electrode regions.

6. A semiconductor memory device according to claim 1, further comprising an interconnection for a power source which runs parallel to a direction of the source and drain of said transistor.

7. A semiconductor memory device according to claim 1, wherein an interconnection for a power source is disposed in a direction intersecting a direction of the source and drain of said transistor.

8. A semiconductor memory device comprising:
a plurality of memory cells each of which includes: an insulated gate transistor having a plurality of main electrode regions provided along a major surface of a substrate and a channel region provided between said plurality of main electrode regions, and a gate electrode provided on said channel region with a gate insulator therebetween, said gate electrode having at least two opposing portions that sandwich said channel region therebetween; and an electrically breakable memory element provided on one of said main electrode regions, wherein a doped semiconductor region is provided between said opposing portions beneath said channel region, said doped semiconductor region having a same conductivity type as said channel region and an impurity concentration higher than that of said channel region, and
wherein said plurality of memory cells are matrix connected by a first interconnection which is common to the gate electrodes of said memory cells and a second interconnection which is common to the memory elements of said memory cells, a power source line being disposed between said second interconnections.

9. A semiconductor memory device comprising:
an insulated gate type transistor including a plurality of main electrode regions and a channel region provided between said plurality of main electrode regions, a gate electrode provided on said channel region with a gate insulator provided therebetween, and a semiconductor region provided in contact with said channel region, said semiconductor region having the same conductivity type as that of said channel region and a higher impurity concentration than said channel region, said gate electrode having at least two opposing portions that sandwich said channel region therebetween, said semiconductor region being provided between said opposing portions and beneath said channel region; and
an electrically breakable memory element provided on one of said main electrode regions.

10. A semiconductor memory device according to claim 9, wherein a plurality of memory cells, including said transistor and said memory element, are provided, said plurality of memory cells being matrix connected to each other by a plurality of first interconnections which are common to the gate electrodes of said plurality of memory cells, and a plurality of second interconnections which are common to the memory elements of said plurality of memory cells, a power source line being disposed between the adjacent second interconnections.

11. A semiconductor memory device according to claim 1, wherein said gate electrode has an upper region provided on said channel region.

* * * * *

UNITED STATES PATENT AND TRADEMARK OFFICE
CERTIFICATE OF CORRECTION

PATENT NO. : 5,331,197
DATED : July 19, 1994
INVENTOR(S) : MAMORU MIYAWAKI, ET AL.

Page 1 of 5

It is certified that error appears in the above-identified patent and that said Letters Patent is hereby corrected as shown below:

ON TITLE PAGE, column 2, line 3:

In [56] References Cited, under FOREIGN PATENT DOCUMENTS:
"2263473  10/1990  Japan ." should read
--2-263473  10/1990  Japan .--.

COLUMN 1

Line 30, "a n type substrate;" should read
--an n-type substrate;--.

COLUMN 2

Line 44, "completely" should read --complete--.
Line 63, "a $n^+$ buried" should read --an $n^+$ buried--.
Line 64, "a $n^-$ epitaxial" should read --an $n^-$ epitaxial--.
Line 65, "a $n^+$ emitter" should read --an $n^+$ emitter--.

COLUMN 3

Line 34, ".fine" should read --fine--.
Line 56, "a-gate" should read --a gate--.

COLUMN 4

Line 12, "inverse" should read --invert--.
Line 62, "$X_2S_2'$" should read --$X_2X_2'$--.

COLUMN 7

Line 10, "completed" should read --completely--.
Line 43, "is" should read --be--.
Line 44, "is" should read --be--.

UNITED STATES PATENT AND TRADEMARK OFFICE
CERTIFICATE OF CORRECTION

PATENT NO. : 5,331,197
DATED : July 19, 1994
INVENTOR(S) : MAMORU MIYAWAKI, ET AL.

It is certified that error appears in the above-identified patent and that said Letters Patent is hereby corrected as shown below:

COLUMN 8

Line 27, "substrate.-" should read --substrate.--.
Line 53, "a" should read --an--.

COLUMN 9

Line 2, "a" should read --an--.
Line 39, "insulting" should read --insulating--.

COLUMN 10

Line 1, "long" should read --along--.
Line 26, "SION." should read --SiON.--.
Line 50, "a n+-Si" should read --an $n^+$-Si region--.

COLUMN 11

Line 5, "$d_3$shown" should read --$d_3$ shown--.

COLUMN 12

Line 46, "EFTs" should read --FETs--.
Line 47, "line.(4)" should read --line. ¶ (4)--.

COLUMN 14

Line 17, "o#the" should read --of the--.
Line 21, "reduced than" should read --reduced more than--.
Line 26, "a" should read --an--.
Line 57, "a" (first occurrence) should read --an--.

UNITED STATES PATENT AND TRADEMARK OFFICE
CERTIFICATE OF CORRECTION

PATENT NO. : 5,331,197
DATED : July 19, 1994
INVENTOR(S) : MAMORU MIYAWAKI, ET AL.

It is certified that error appears in the above-identified patent and that said Letters Patent is hereby corrected as shown below:

COLUMN 16

Line 6, "a" should read --an--.
   Line 31, "a" should read --an--.

COLUMN 17

Line 6, "-a" should read --a--.
   Line 34, ".between" should read --between--.

COLUMN 18

Line 4, "a" should read --an--.
   Line 16, "lines Each" should read --lines.  Each--.

COLUMN 19

Line 36, ".the " should read --the--.

COLUMN 20

Line 29, "tion. The" should read --tion, the--.
   Line 45, "be." should read --be--.

COLUMN 21

Line 21, "potion" should read --portion--.
   Line 64, "Another" should read --Other--.
   Line 66, "the-present" should read --the present--.

UNITED STATES PATENT AND TRADEMARK OFFICE
CERTIFICATE OF CORRECTION

PATENT NO. : 5,331,197
DATED : July 19, 1994
INVENTOR(S) : MAMORU MIYAWAKI, ET AL.

It is certified that error appears in the above-identified patent and that said Letters Patent is hereby corrected as shown below:

COLUMN 23

Line 31, "is" should read --are--.

COLUMN 24

Line 21, "an" should read --a--.

COLUMN 25

Line 14, "of following" should read --of the following--.
   Line 28, "has" should read --have--.

COLUMN 26

Line 34, "FIG. 46" should read --FIGS. 46--.
   Line 44, "reduced than" should read --reduced more than--.
   Line 45, "intergration" should read --integration--.
   Line 67, "bitlines" should read --bit lines--.

COLUMN 27

Line 8, "sixteen" should read --sixteenth--.
   Line 25, "seventh" should read --seventeenth--.
   Line 30, "line lines 1002" should read --bit lines 1002--.
   Line 33, "the" should be deleted.
   Line 65, "FIG. 13 and 14," should read --FIGS. 13 and 14,--.
   Line 68, "FIG. 58 and 59" should read --FIGS. 58 and 59--.

COLUMN 28

Line 14, "numeral" should read --numeral 2010--.
   Line 18, "as" should read --than--.

UNITED STATES PATENT AND TRADEMARK OFFICE
CERTIFICATE OF CORRECTION

PATENT NO. : 5,331,197
DATED : July 19, 1994
INVENTOR(S) : MAMORU MIYAWAKI, ET AL.

It is certified that error appears in the above-identified patent and that said Letters Patent is hereby corrected as shown below:

COLUMN 28

Line 32, "it" (first occurrence) should be deleted.
    Line 66, "said channel" should read --said channel region--.
    Lines 67-68, "said high impurity concentration semiconductor region" should read --said doped semiconductor region--.

COLUMN 30

Line 4, "second interconnections." should read --second interconnection.--.

Signed and Sealed this

Seventh Day of March, 1995

Attest:

BRUCE LEHMAN

Attesting Officer      Commissioner of Patents and Trademarks